(12) United States Patent
Kasem et al.

(10) Patent No.: US 6,392,290 B1
(45) Date of Patent: May 21, 2002

(54) VERTICAL STRUCTURE FOR SEMICONDUCTOR WAFER-LEVEL CHIP SCALE PACKAGES

(75) Inventors: Y. Mohammed Kasem, Santa Clara; Yueh-Se Ho, Sunnyvale; Lee Shawn Luo, San Jose; Chang-Sheng Chen, Santa Clara; Eddy Tjhia, Sunnyvale; Bosco Lan, Fremont; Jacek Korec, San Jose; Anup Bhalla, Santa Clara, all of CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 09/545,287

(22) Filed: Apr. 7, 2000

(51) Int. Cl.[7] ............................................... H01L 23/02
(52) U.S. Cl. ....................................... 257/678; 257/774
(58) Field of Search ............................... 257/774, 684, 257/678, 690, 700, 758

(56) References Cited

U.S. PATENT DOCUMENTS

| | | | |
|---|---|---|---|
| 5,103,290 A | * | 4/1992 | Temple et al. ............... 257/678 |
| 6,020,637 A | * | 2/2000 | Karnezos ..................... 257/738 |
| 6,075,290 A | | 6/2000 | Schaefer |
| 6,146,882 A | | 11/2000 | Lauterbach |

FOREIGN PATENT DOCUMENTS

| | | | |
|---|---|---|---|
| DE | 195 43 540 | 11/1996 | ......... H01L/25/065 |
| DE | 199 07 525 | 9/1999 | ........... H01L/23/50 |
| EP | 0 926 723 | 6/1999 | ........... H01L/21/74 |
| WO | WO 99/57761 | 11/1999 | ....... H01L/21/8234 |

OTHER PUBLICATIONS

Chang, E. Y. et al.: "A Hybrid Wafer–Dicing Process for GaAs MMIC Production" IEEE Transactions on Semiconductor Manufacturing, IEEE Inc, New York, US, vol. 4, No. 1, Feb. 1, 1991, pp. 66–68, XP000177719, ISSN: 0894–6507.

Gupta, A. et al.: "Yield Considerations for Ion–Implanted GaAs MMIC's" IEEE Transactions on Electron Devices, IEEE Inc. New York, US, vol. ED–30, No. 1, 1983, pp. 16–20, XP000199138, ISSN: 0018–9383.

Sumitani, K. et al.: "A High Aspect Ratio Via Hole Dry Etching Technology for High Power GaAs MESFET" Proceedings of the Gallium Arsenide Integrated Circuit Symposium (GaAs IC) San Diego, Oct. 22–25, 1989, New York, IEEE, US, vol. Symp. 11, Oct. 22, 1989, pp. 207–210, XP000090403.

* cited by examiner

*Primary Examiner*—Roy Potter
(74) *Attorney, Agent, or Firm*—Skjerven Morrill MacPherson LLP

(57) ABSTRACT

In a semiconductor package for a chip having terminals on both sides, for example, a power MOSFET in which the gate and source terminals are on the front side and the drain terminal is on the back side, electrical contact is made with the back side terminal by extending vias, which can take the form of trenches, holes or other cavities, either entirely or patrially through the chip. The vias are filled with a metal or other electrically conductive material. The process is performed on the chips in a wafer simultaneously. The resulting package is compact and economical to manufacture and can readily be mounted, flip-chip style, on a printed circuit board.

23 Claims, 56 Drawing Sheets

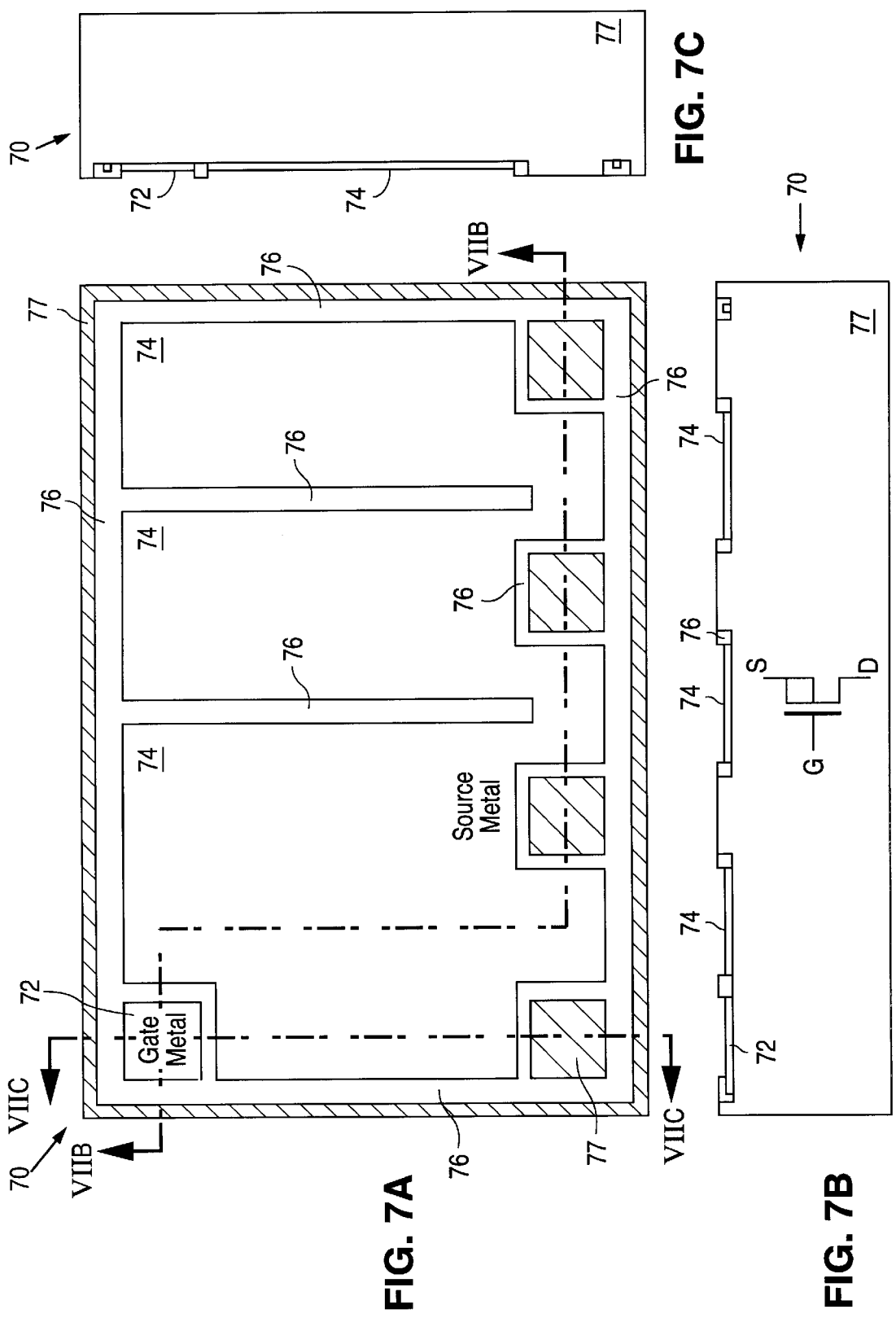

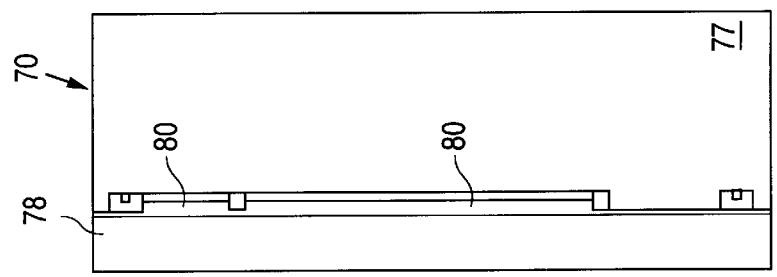
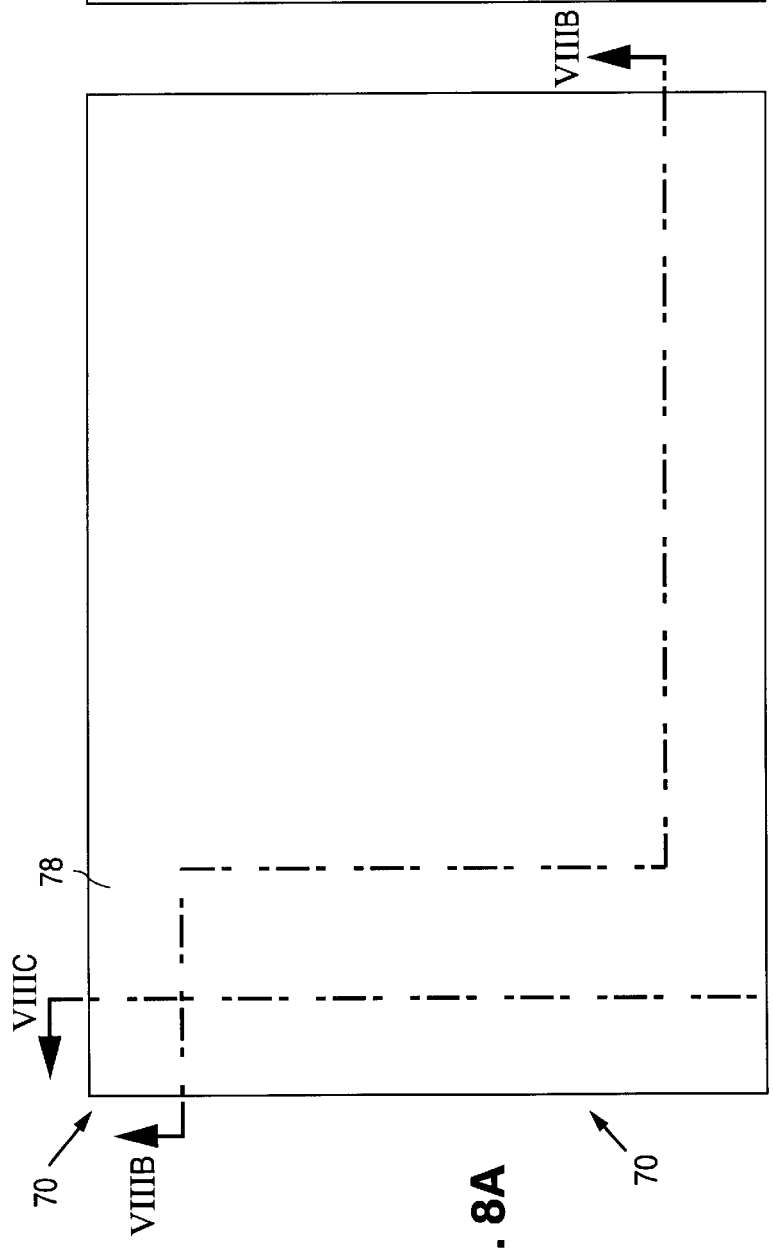
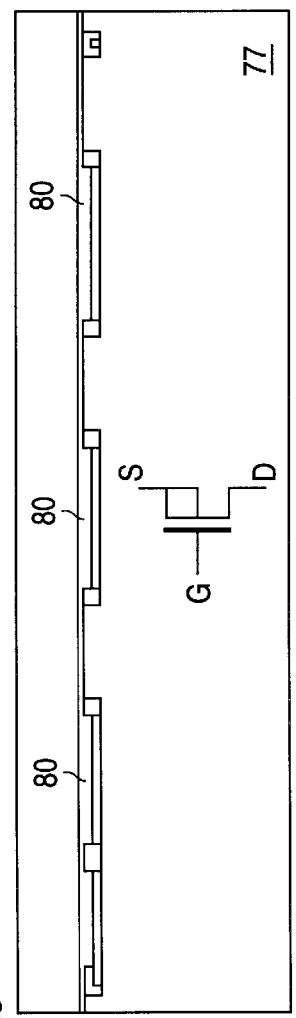
FIG. 8A
FIG. 8B
FIG. 8C

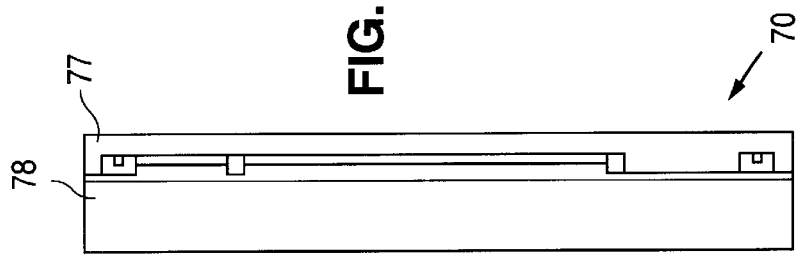
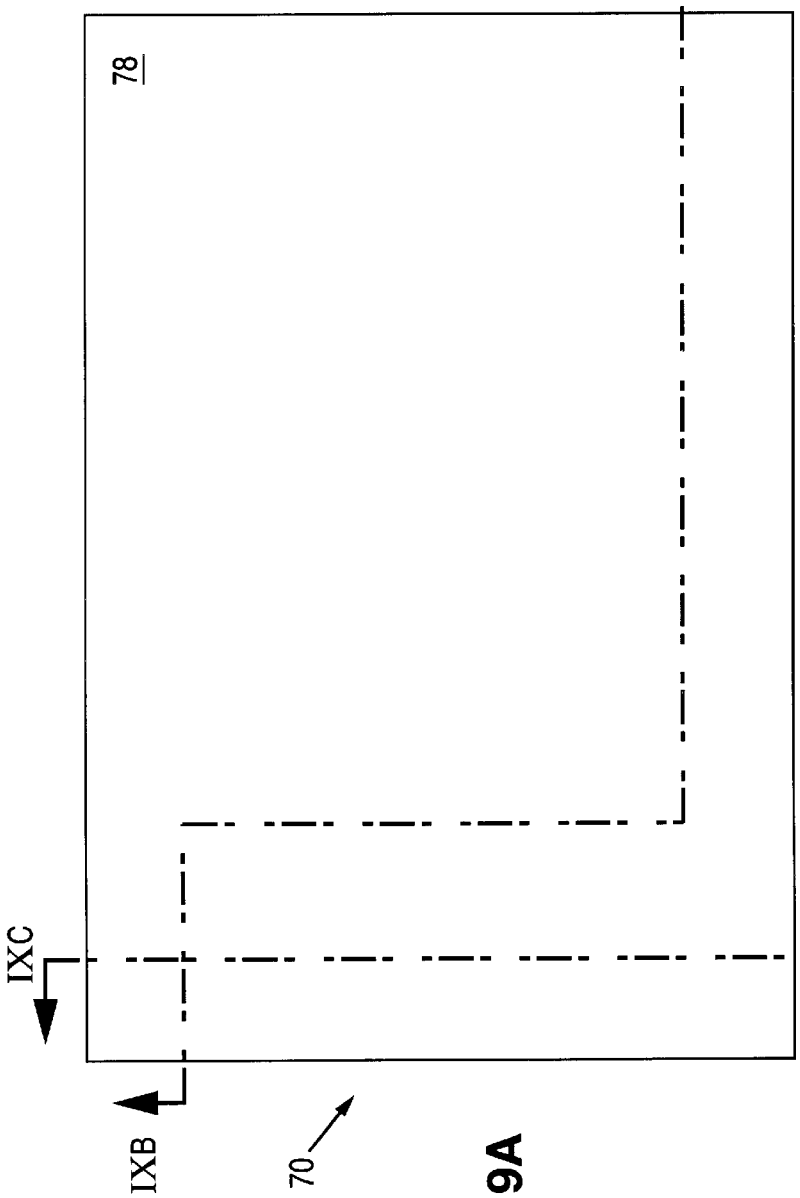
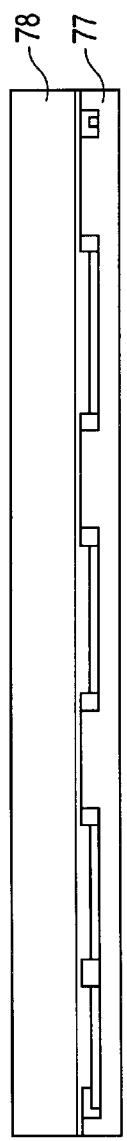
FIG. 9A
FIG. 9B
FIG. 9C

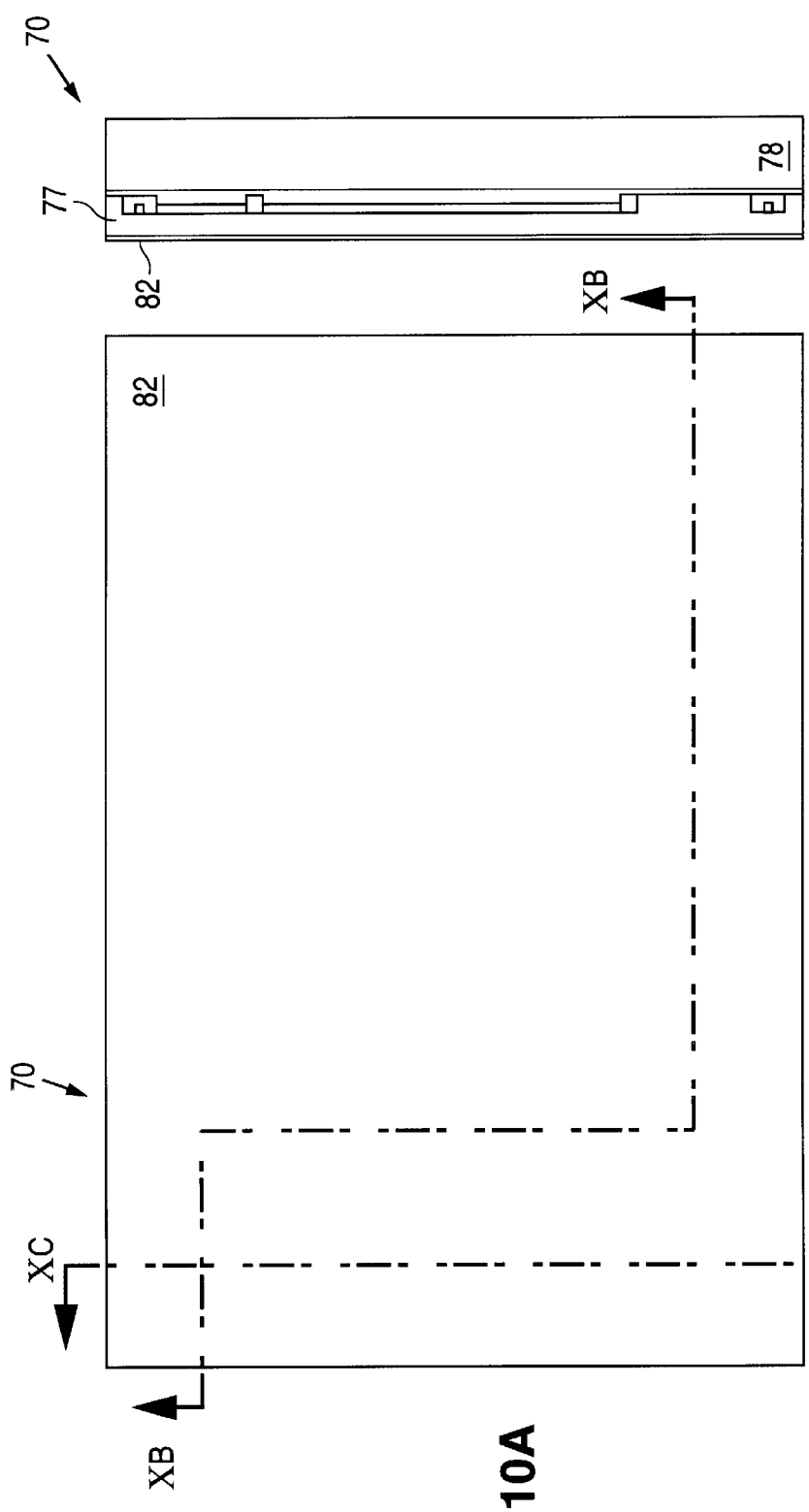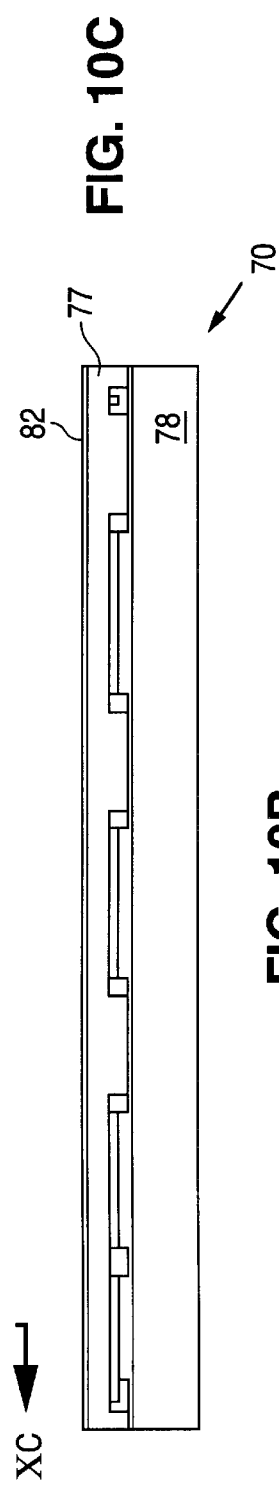

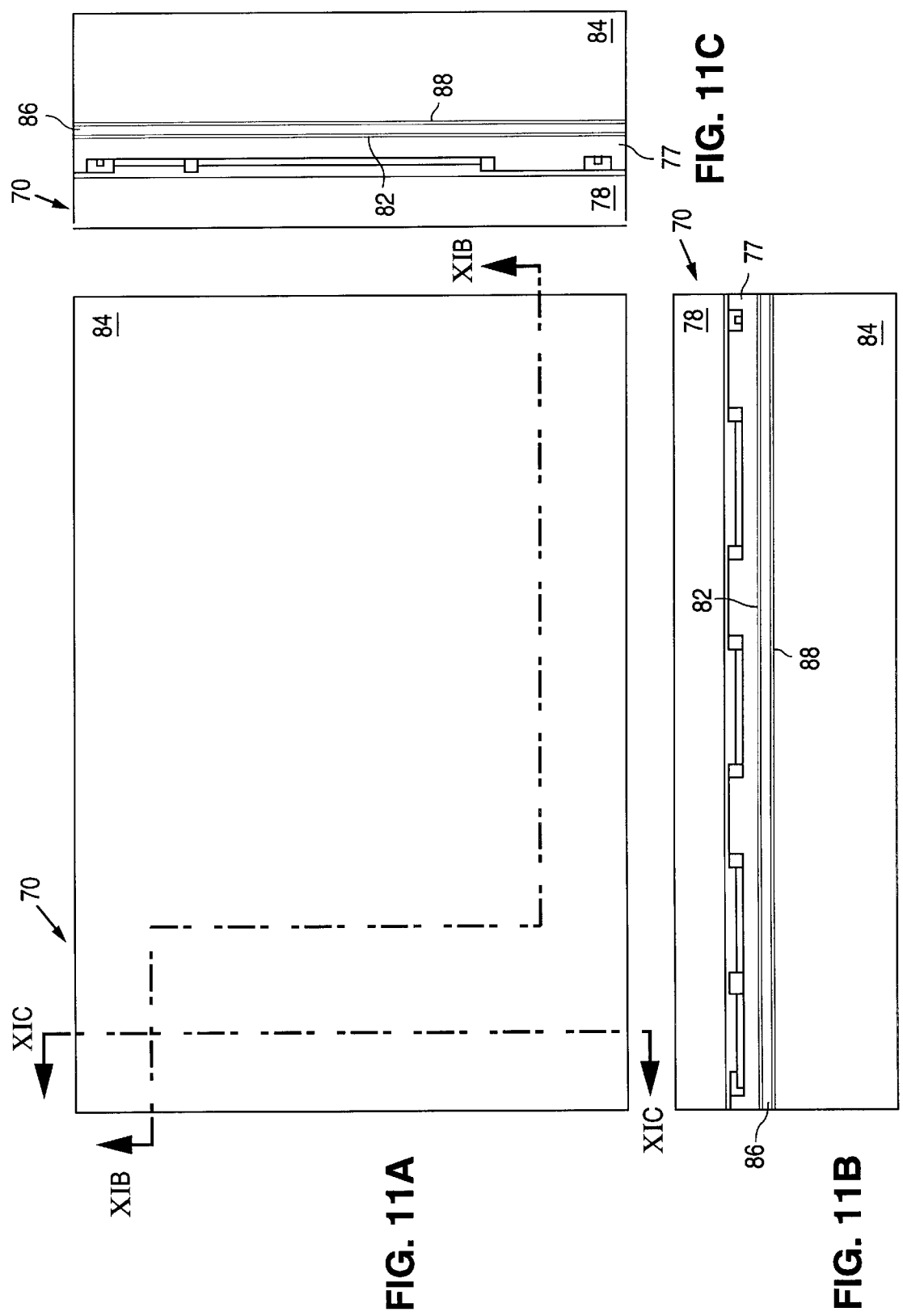

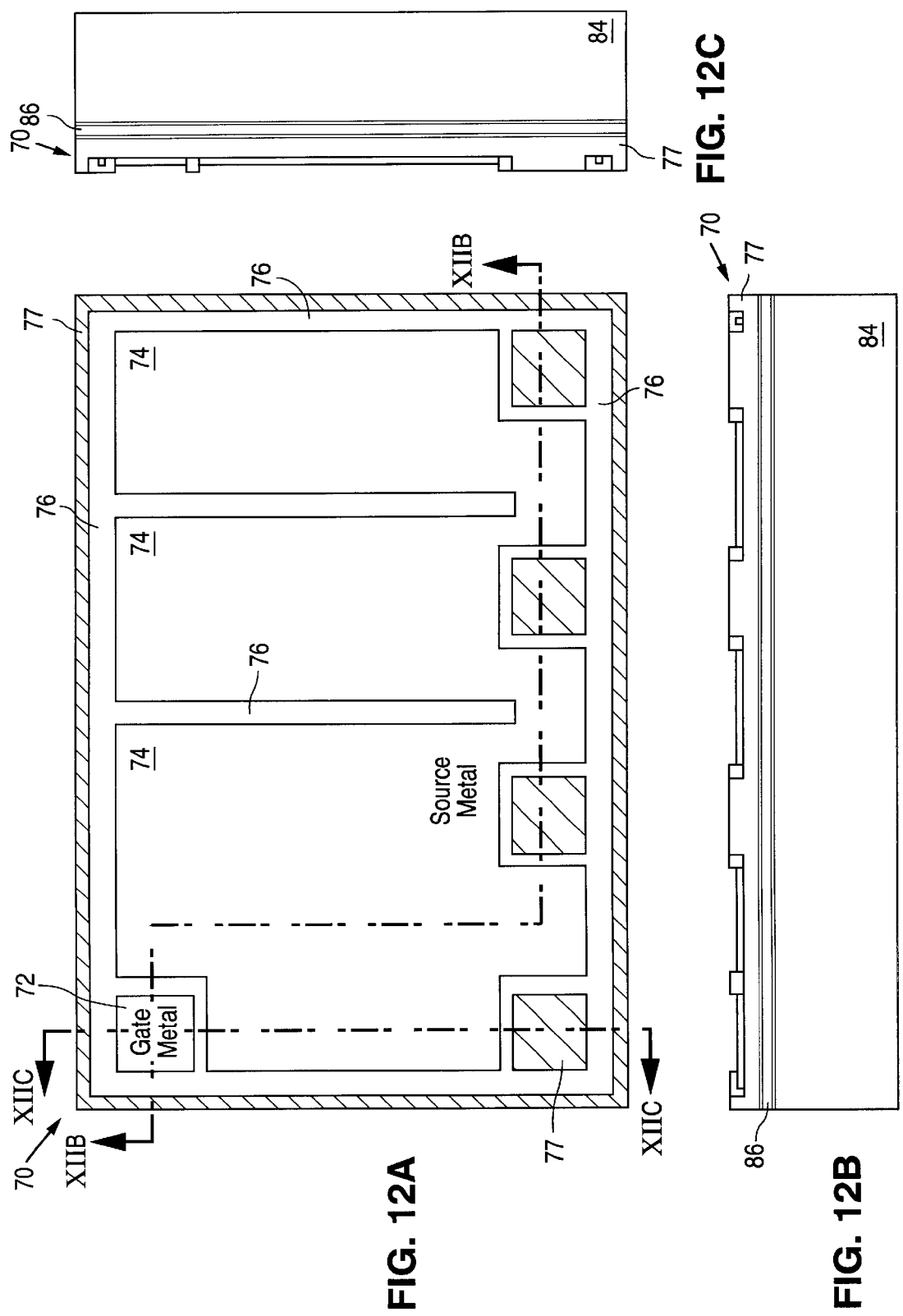

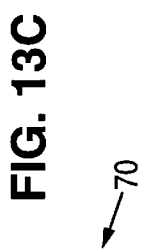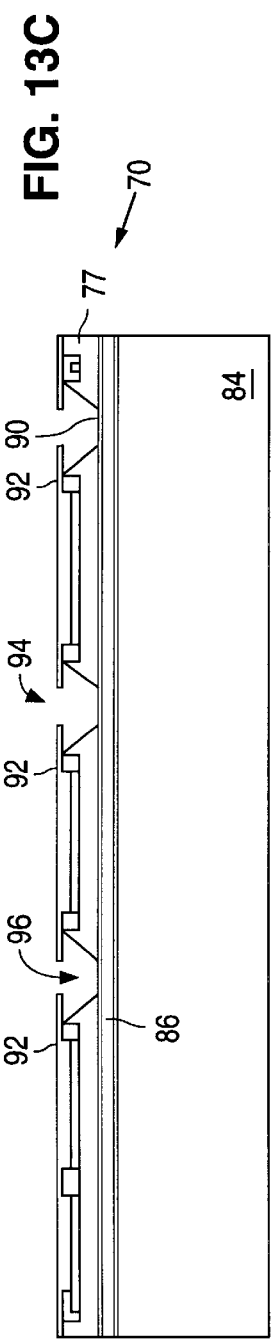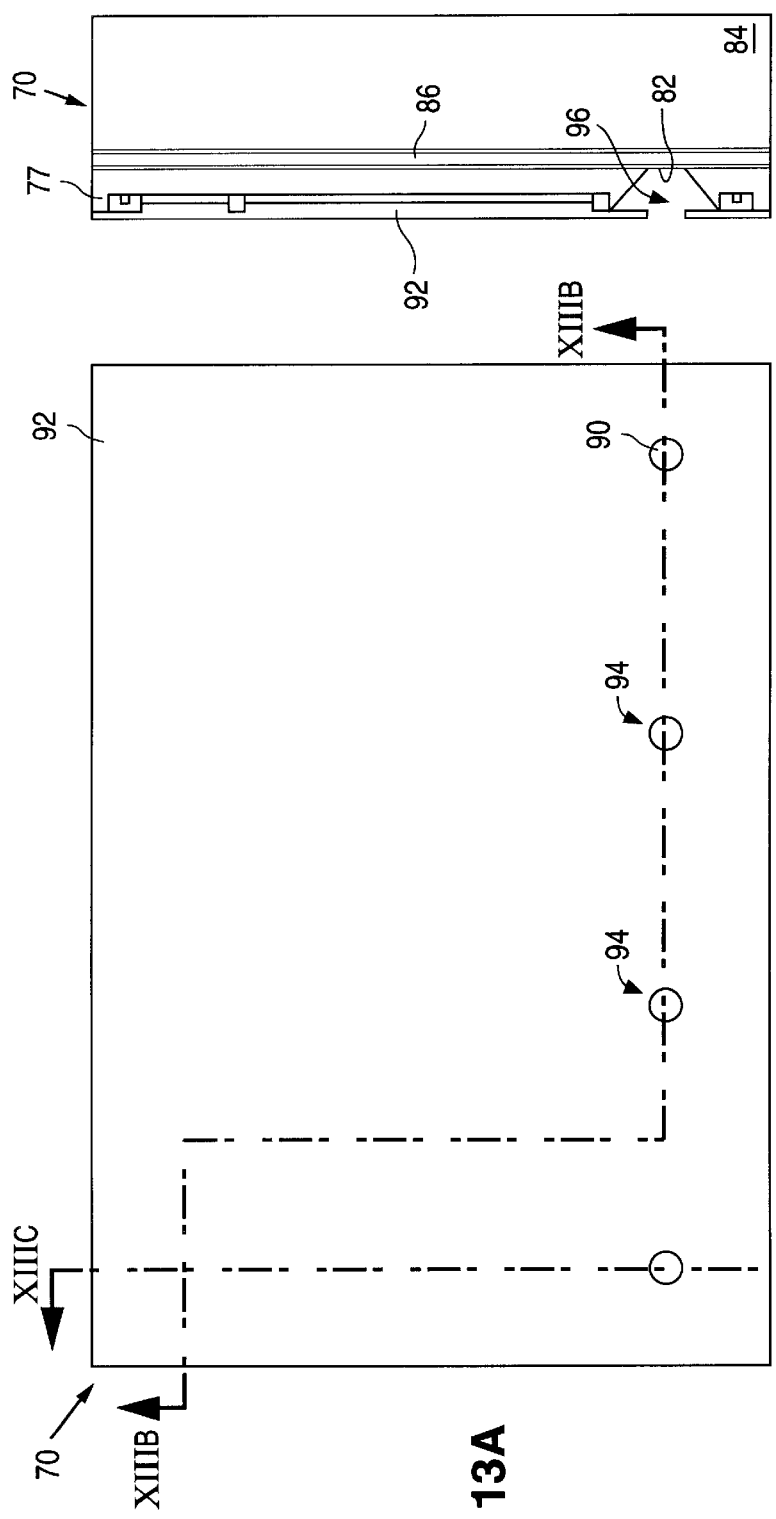
FIG. 13A
FIG. 13B
FIG. 13C

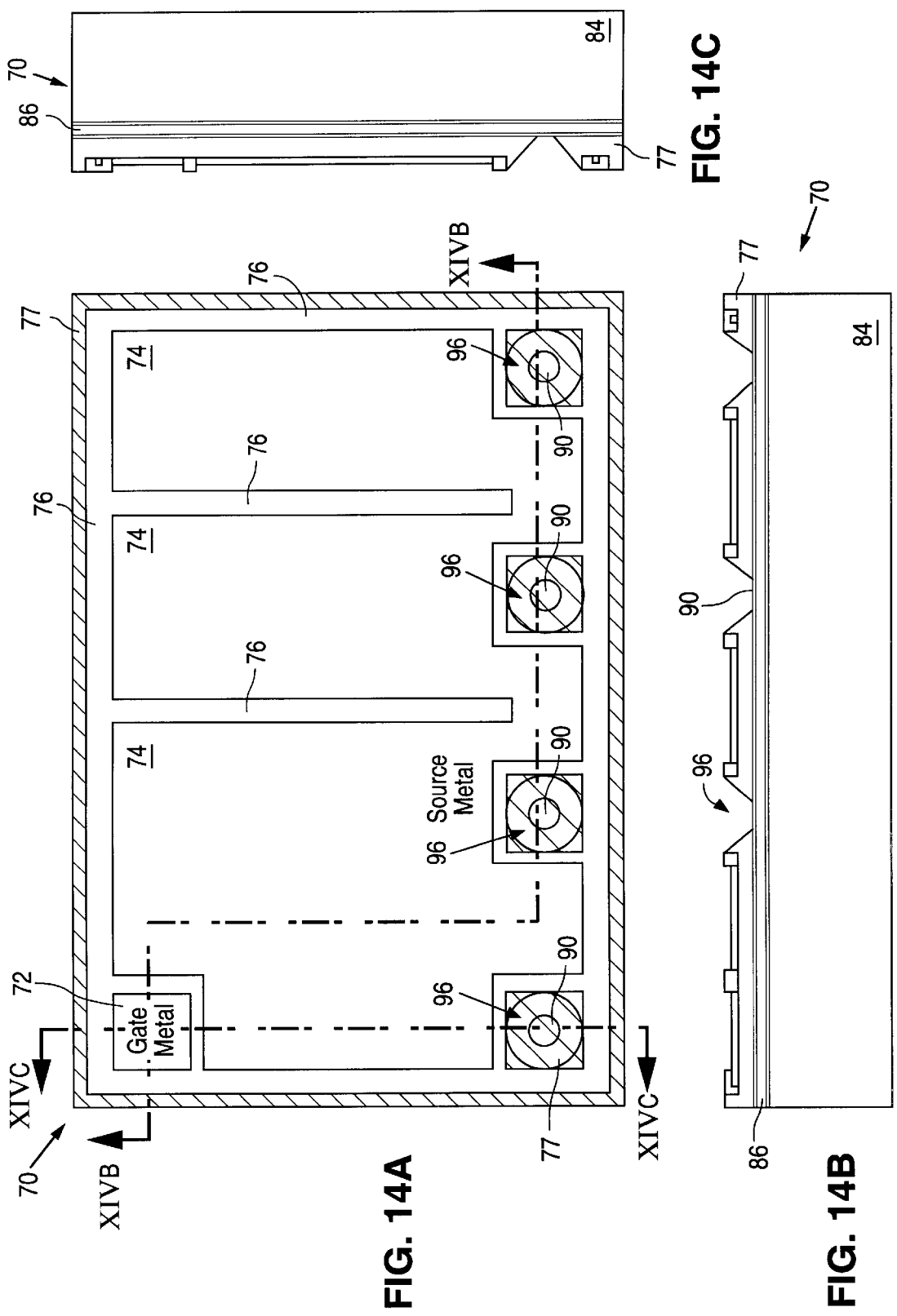

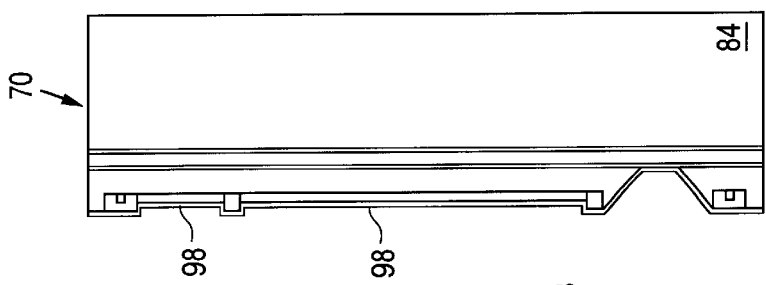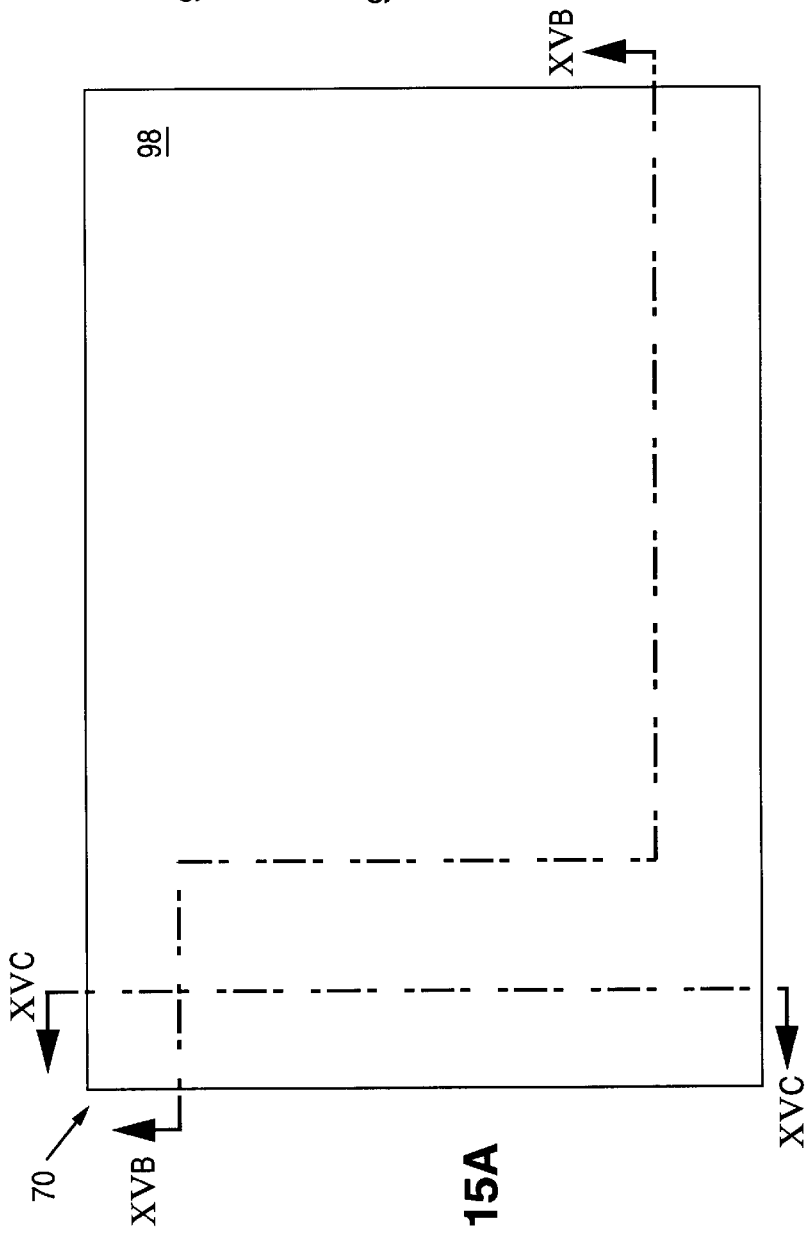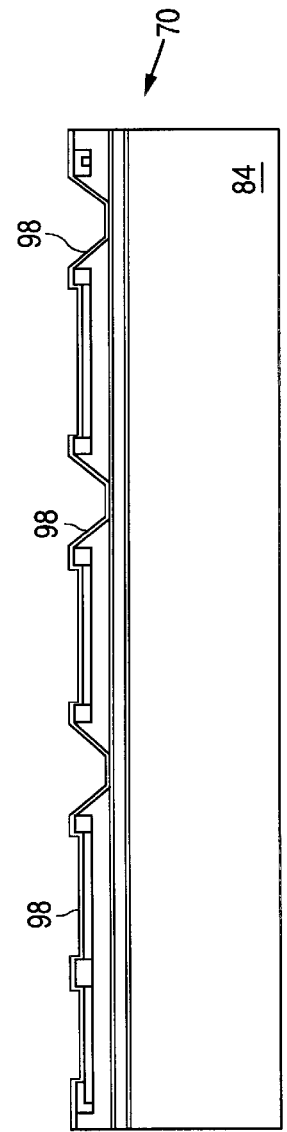

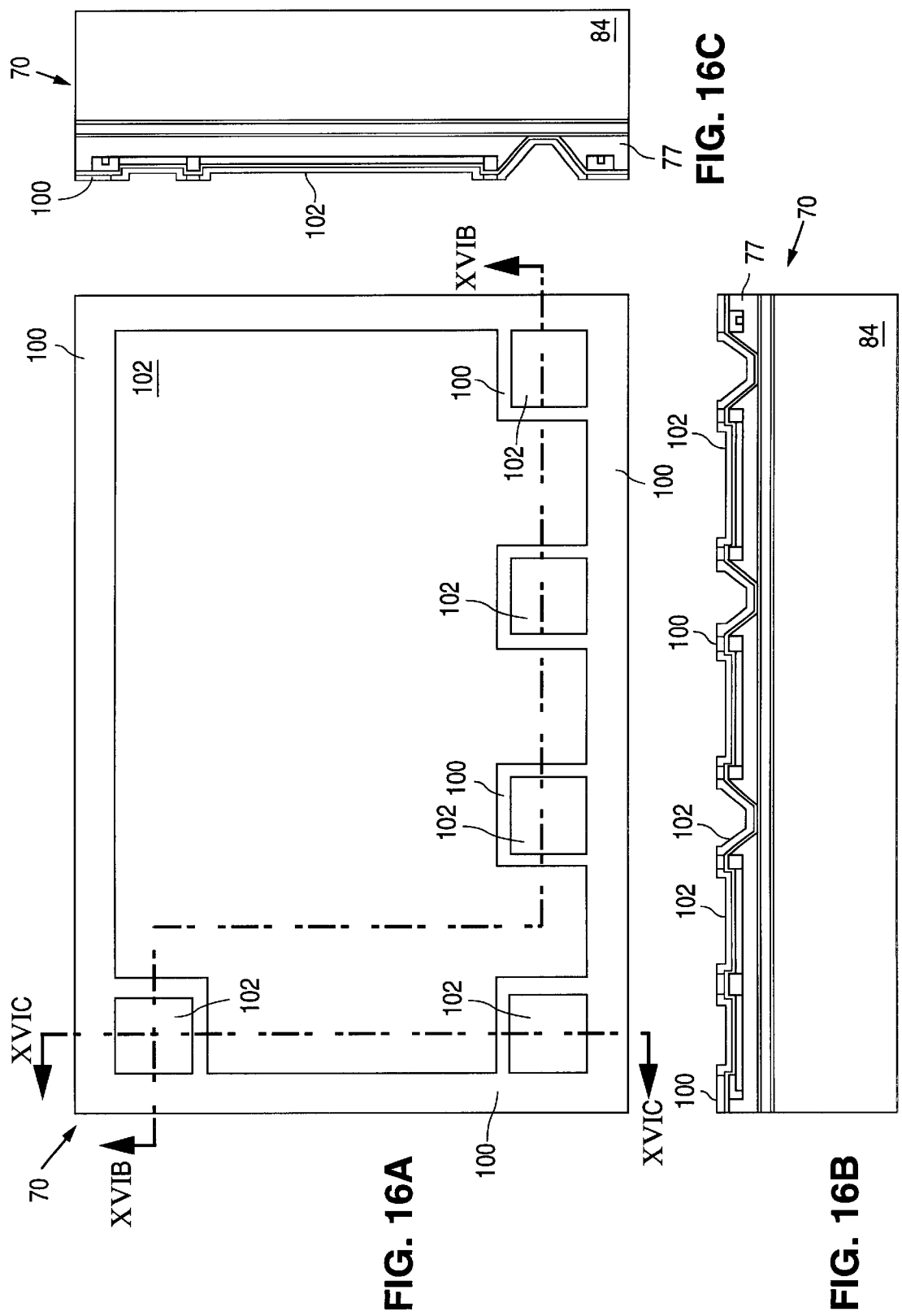

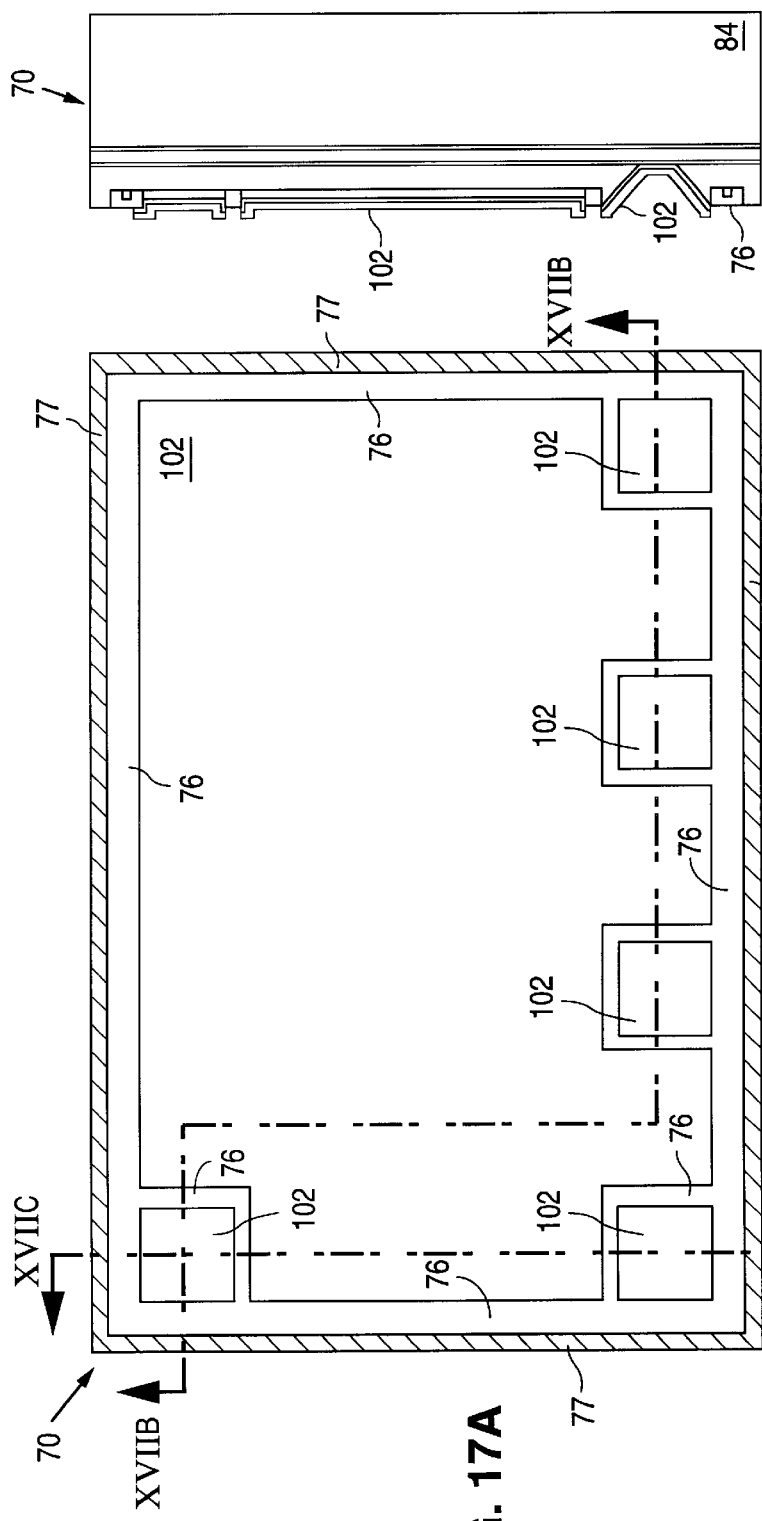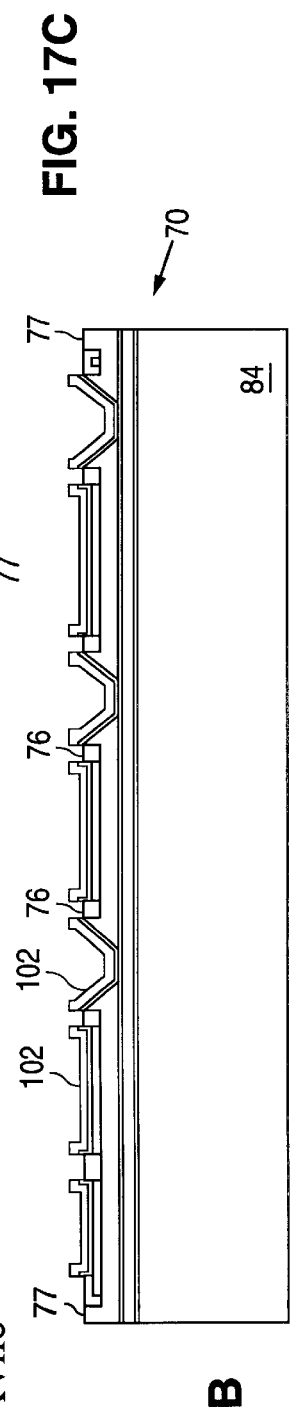
FIG. 17C
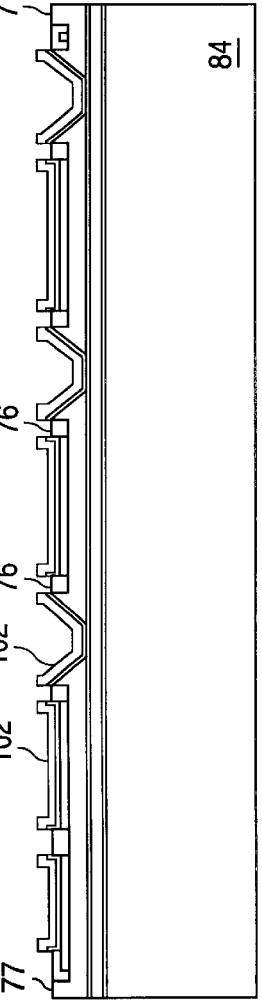
FIG. 17A
FIG. 17B

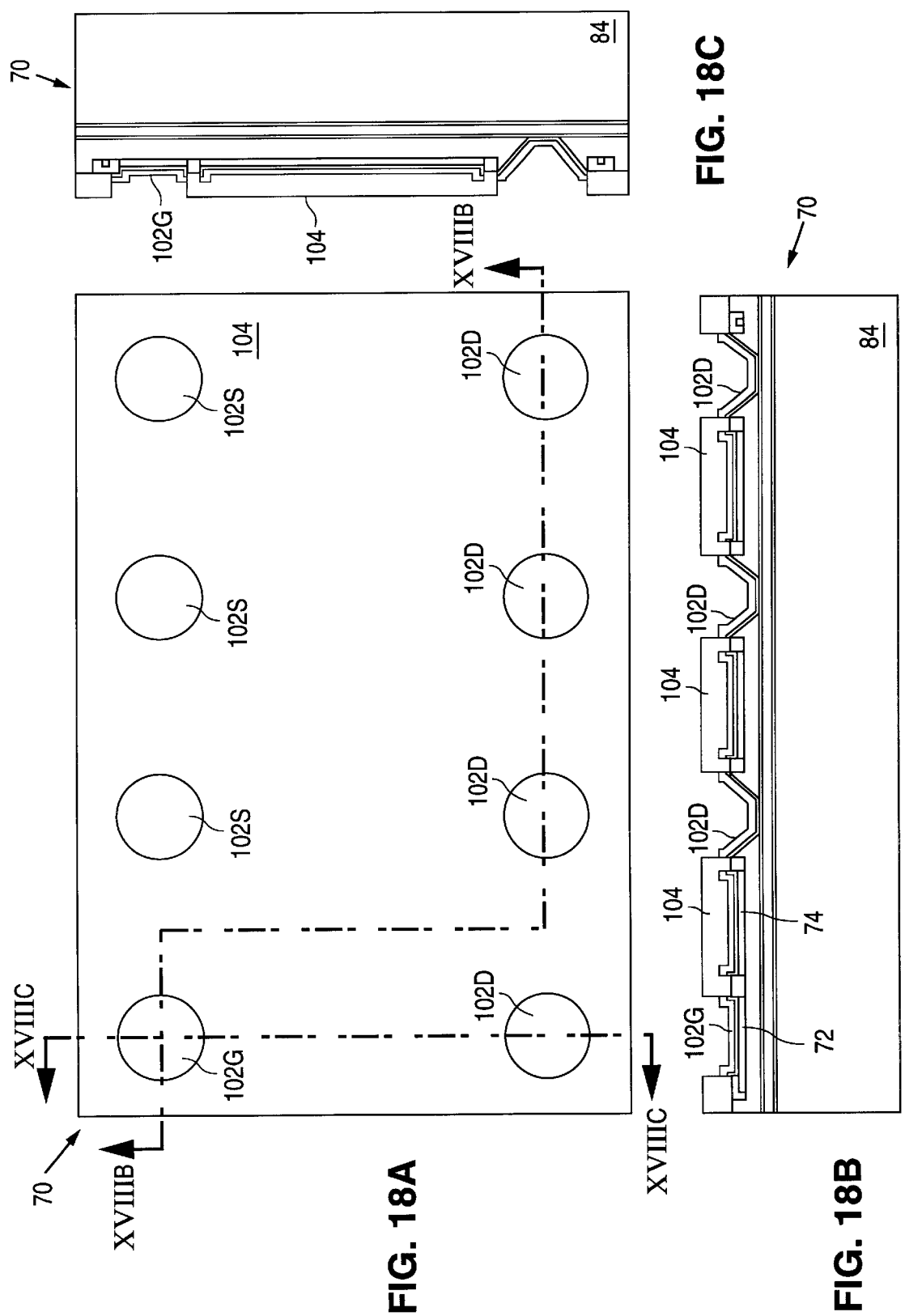

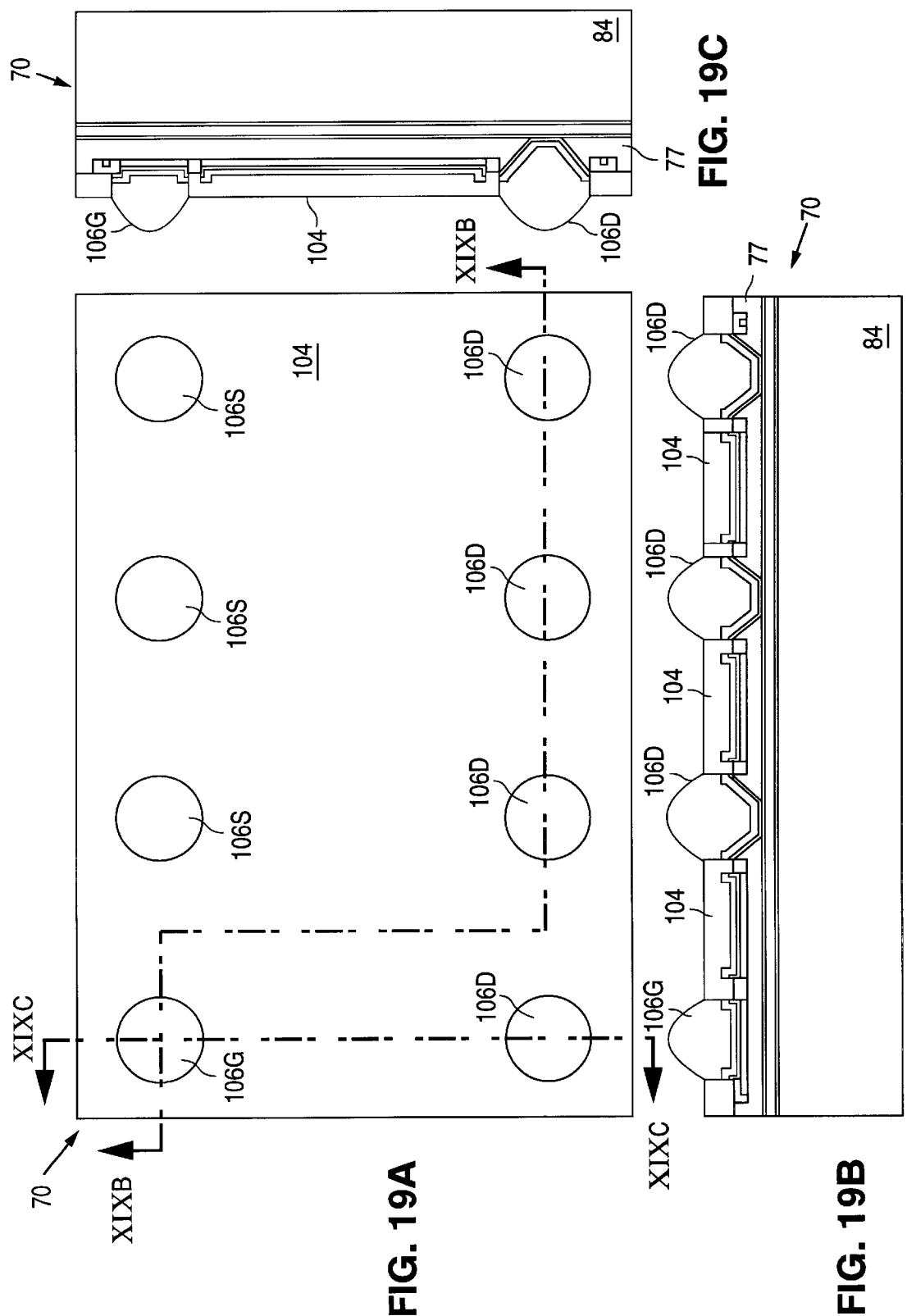

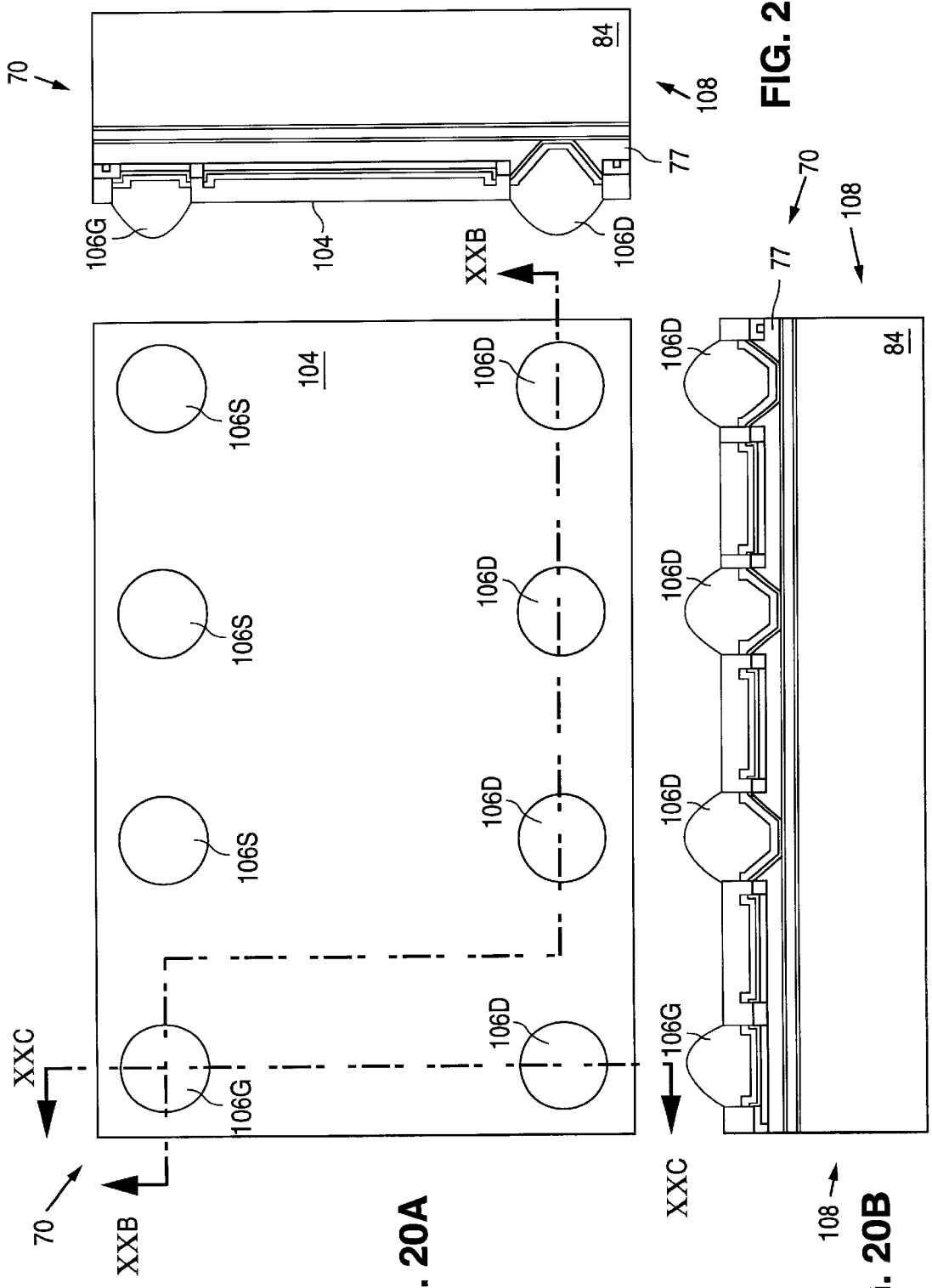

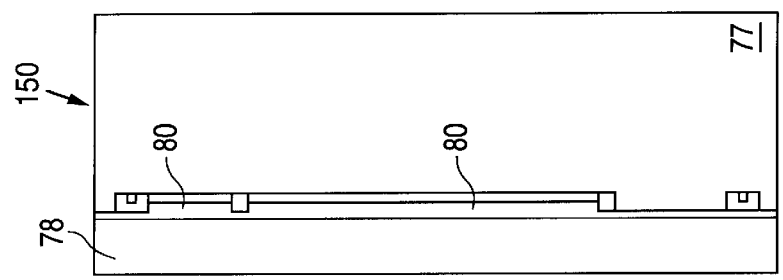
FIG. 22C
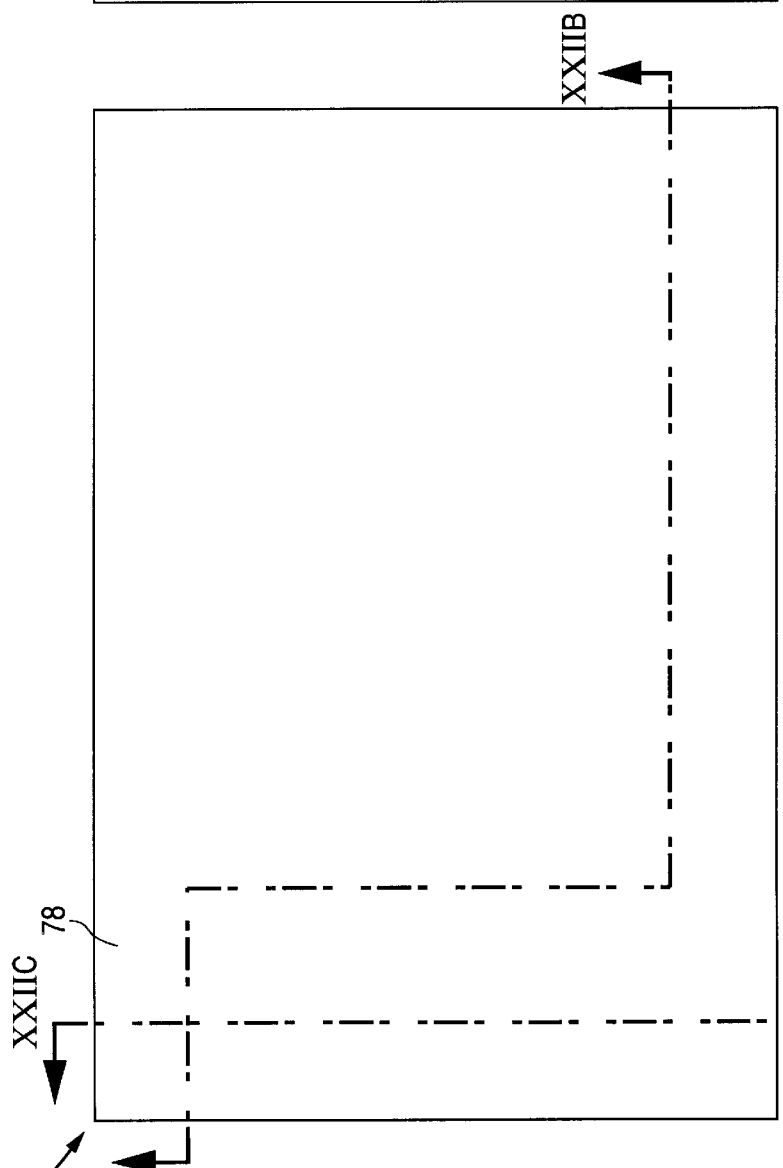
FIG. 22A
FIG. 22B

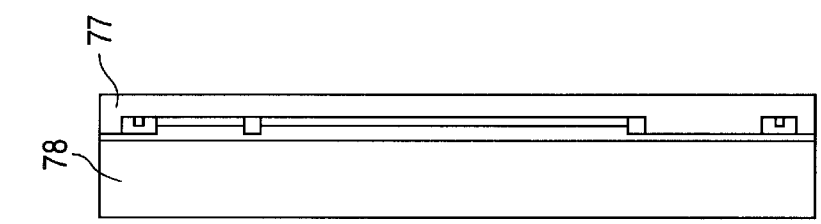
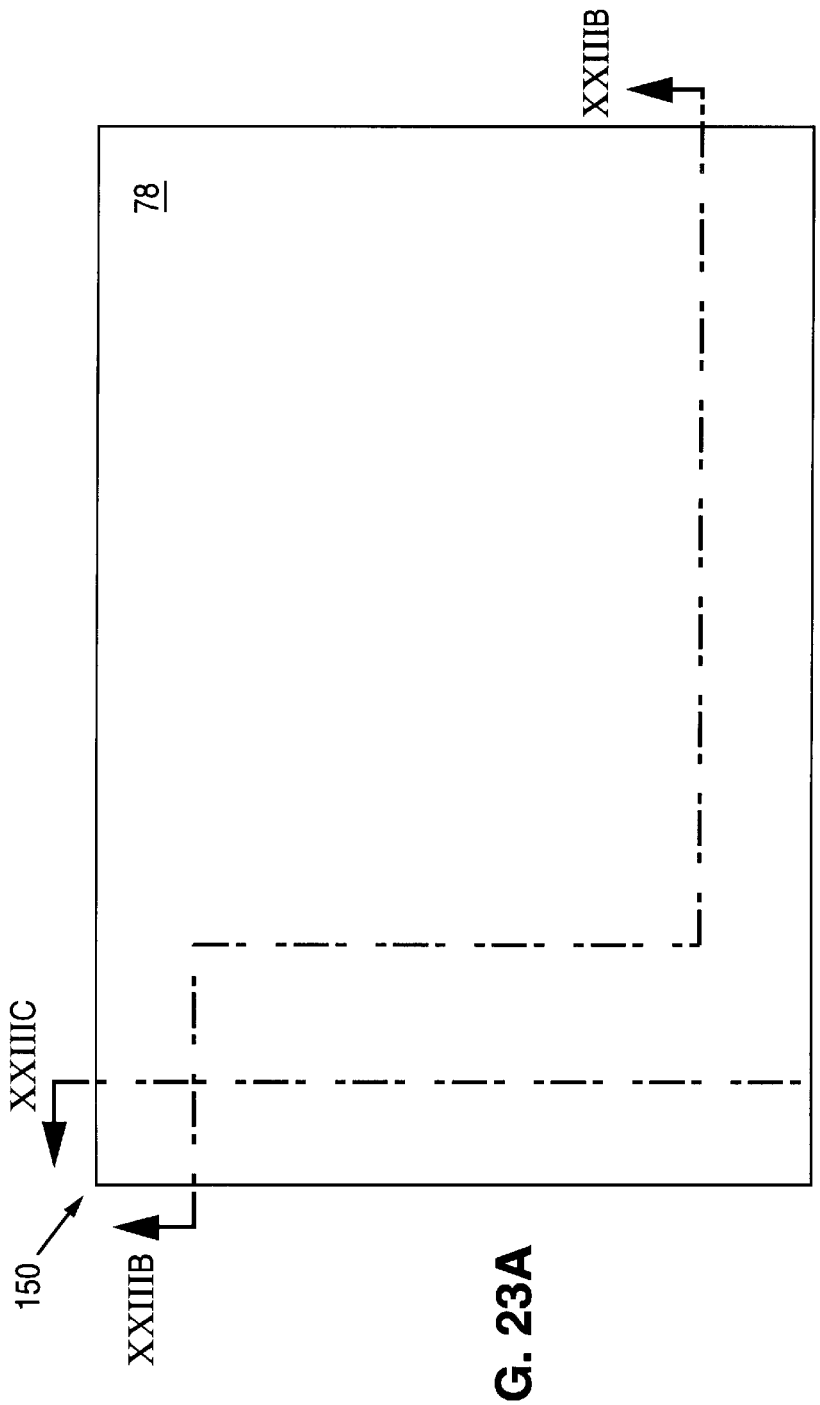
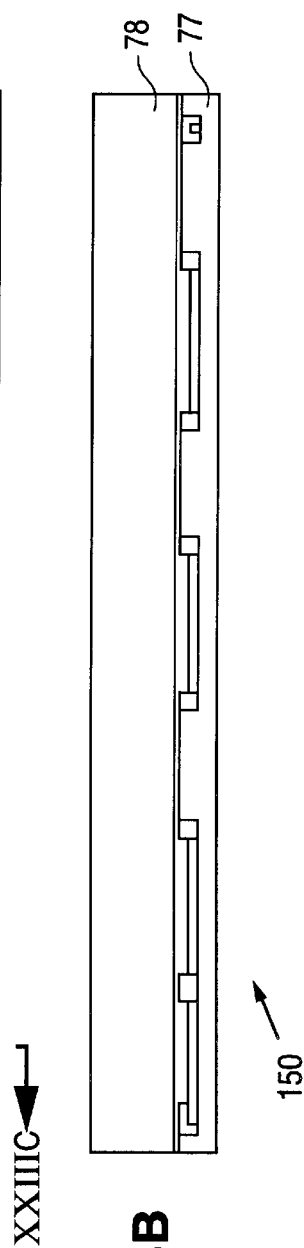
FIG. 23C
FIG. 23A
FIG. 23B

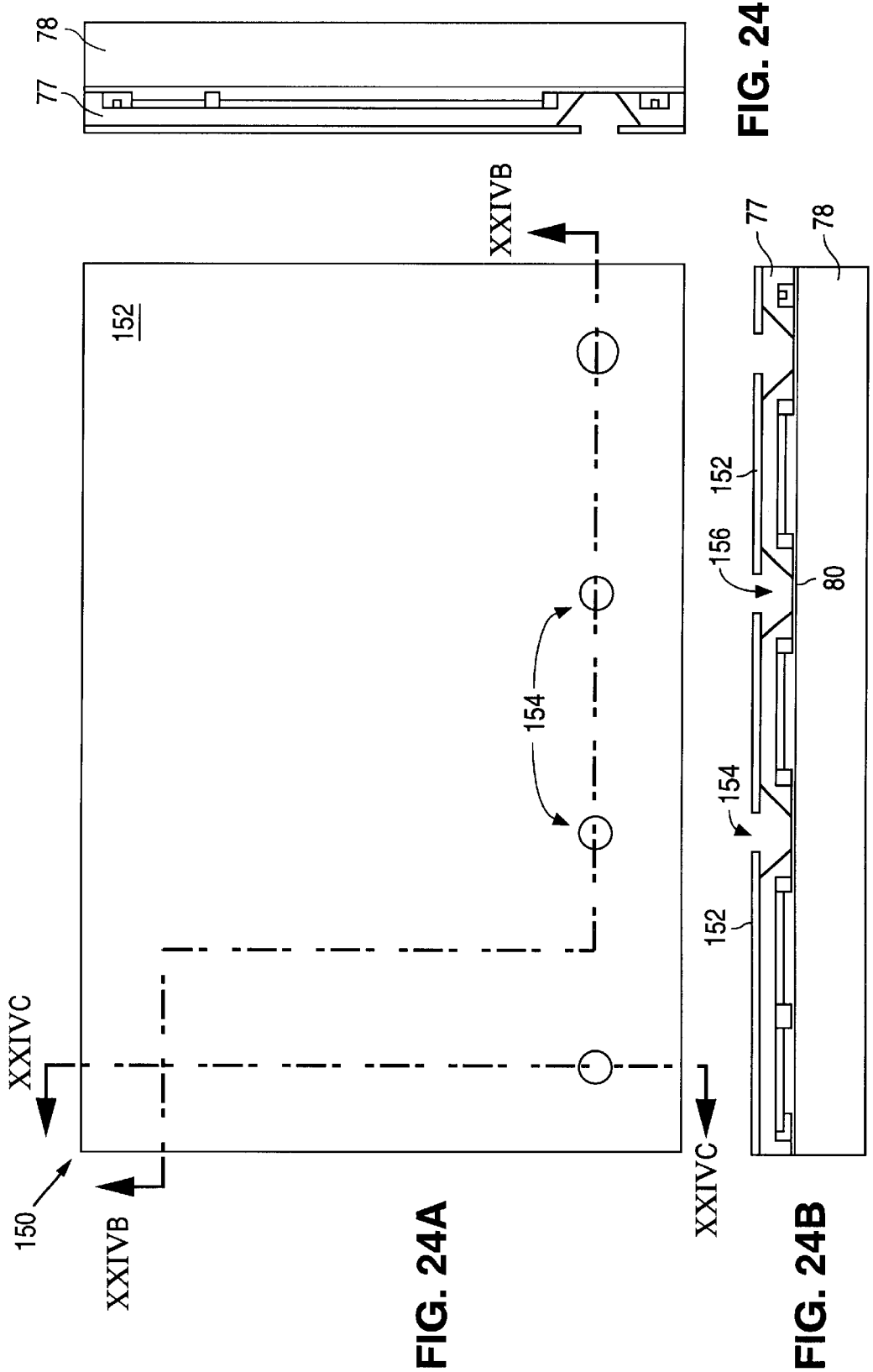

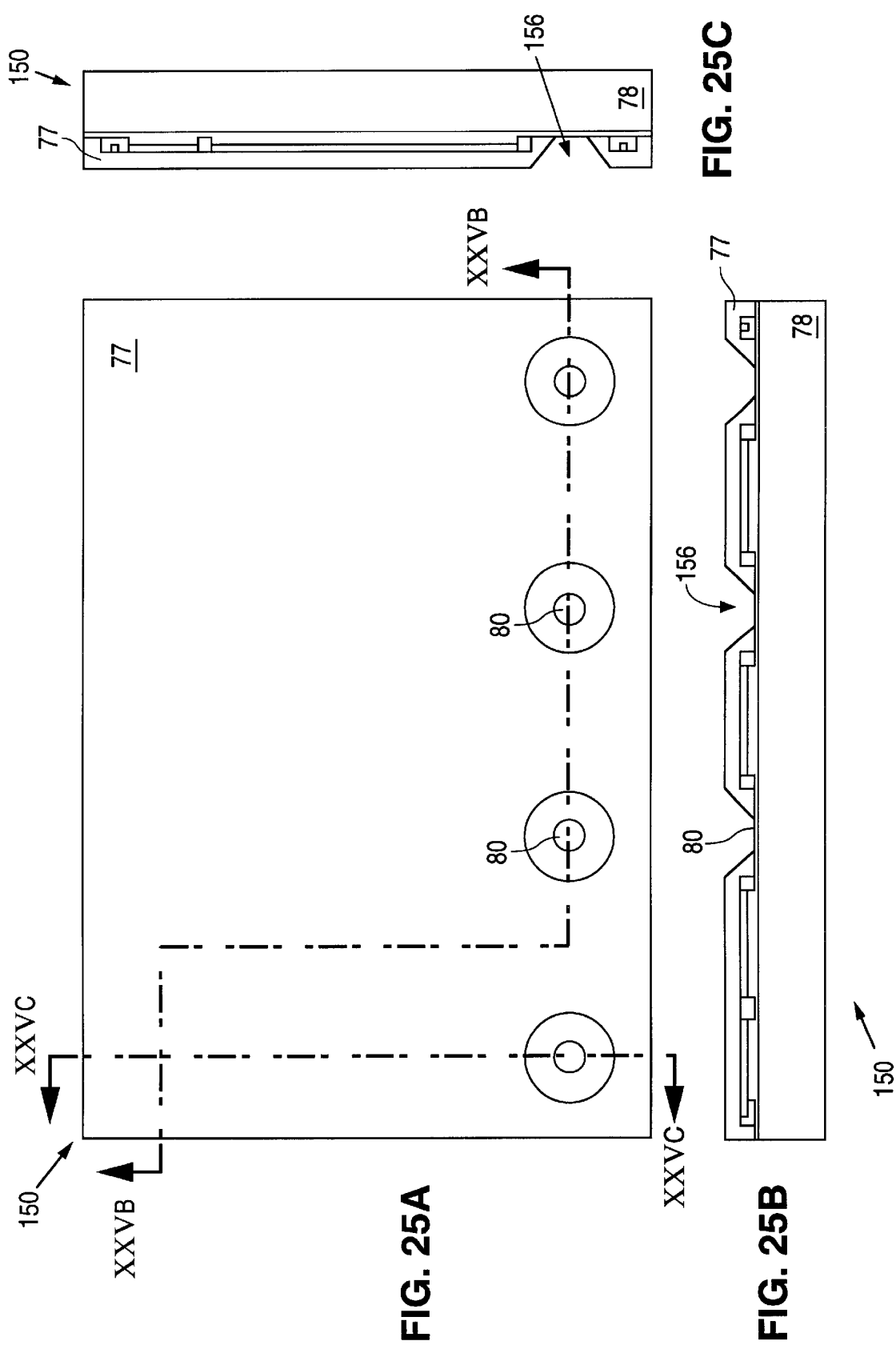

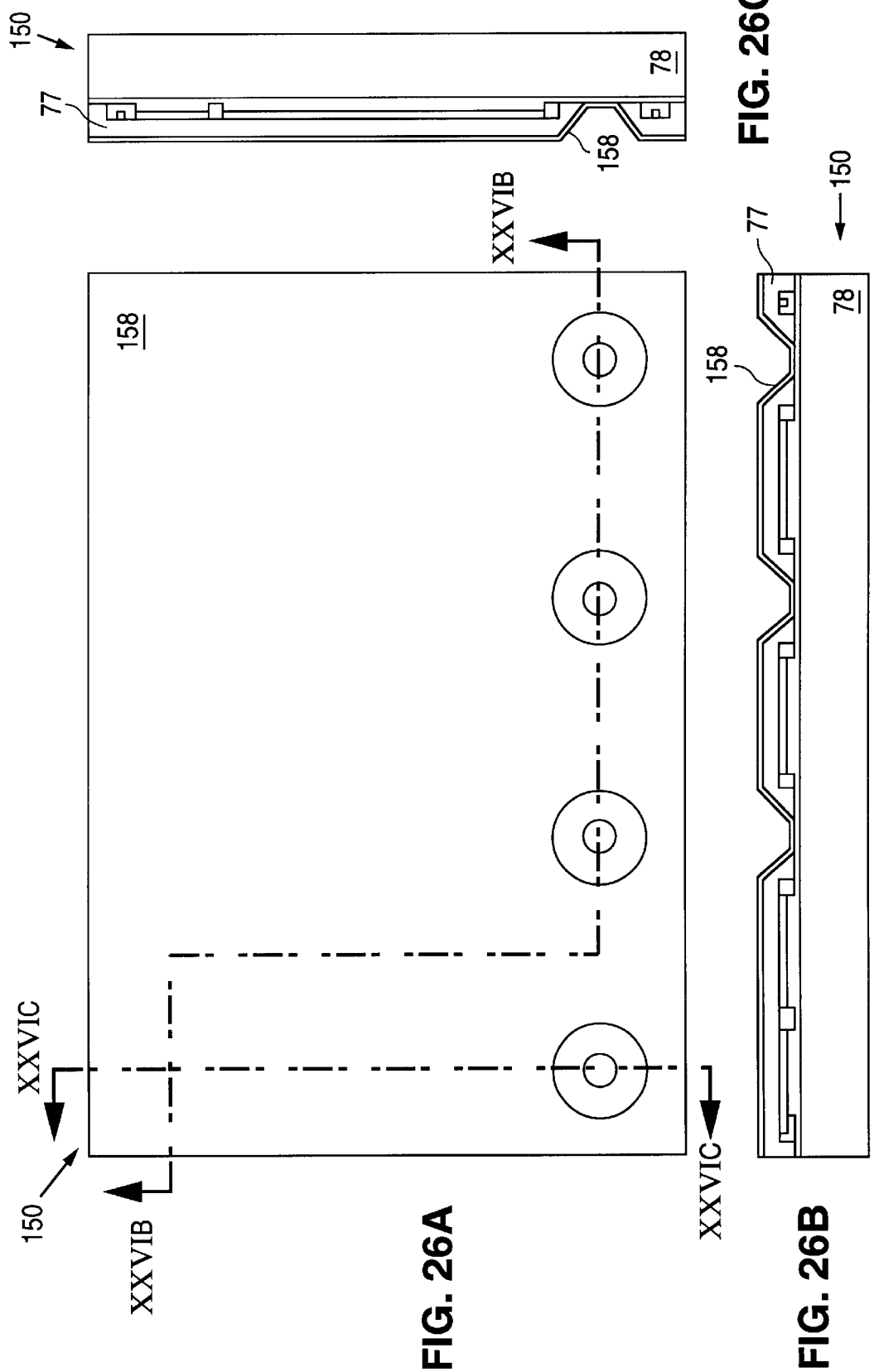

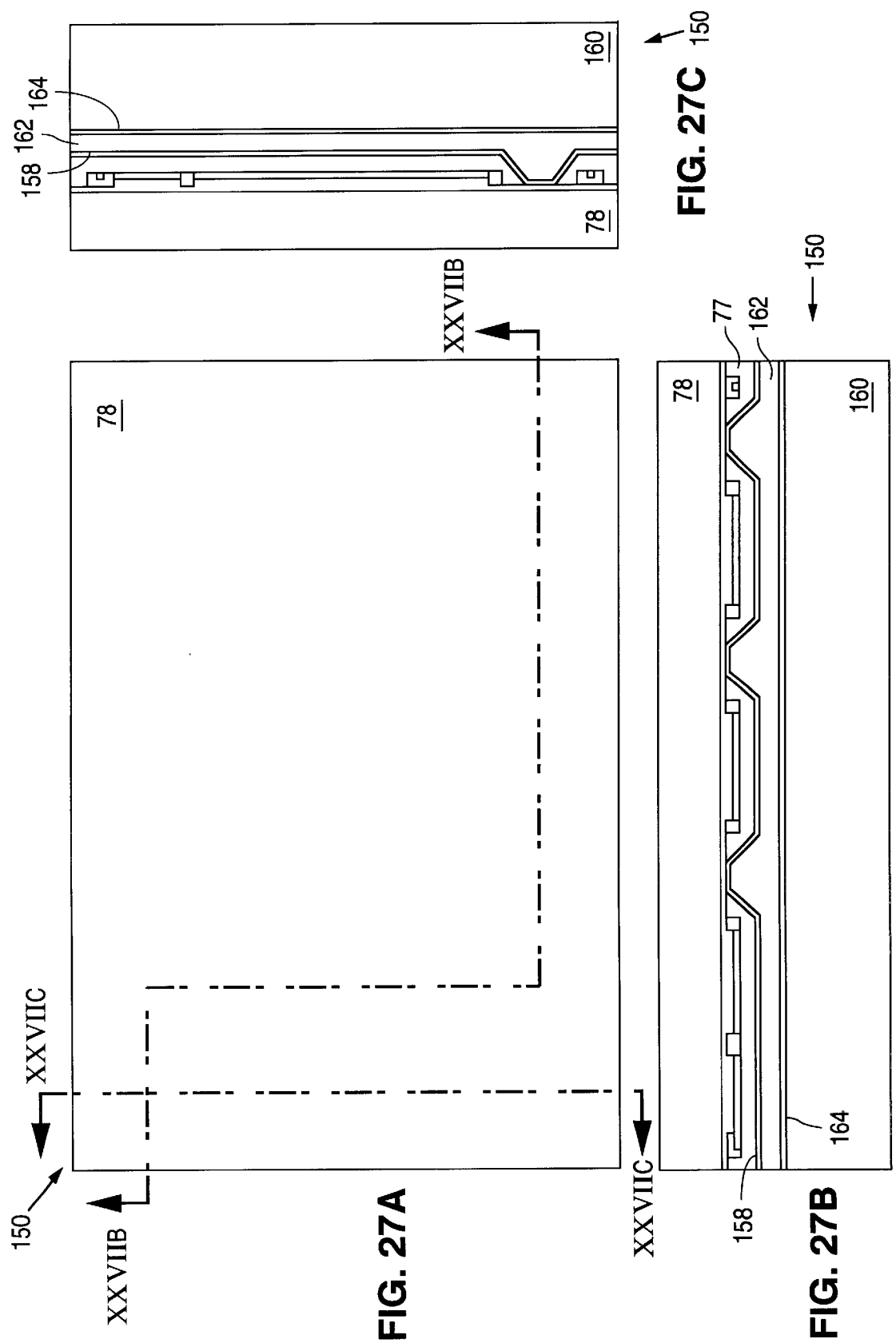

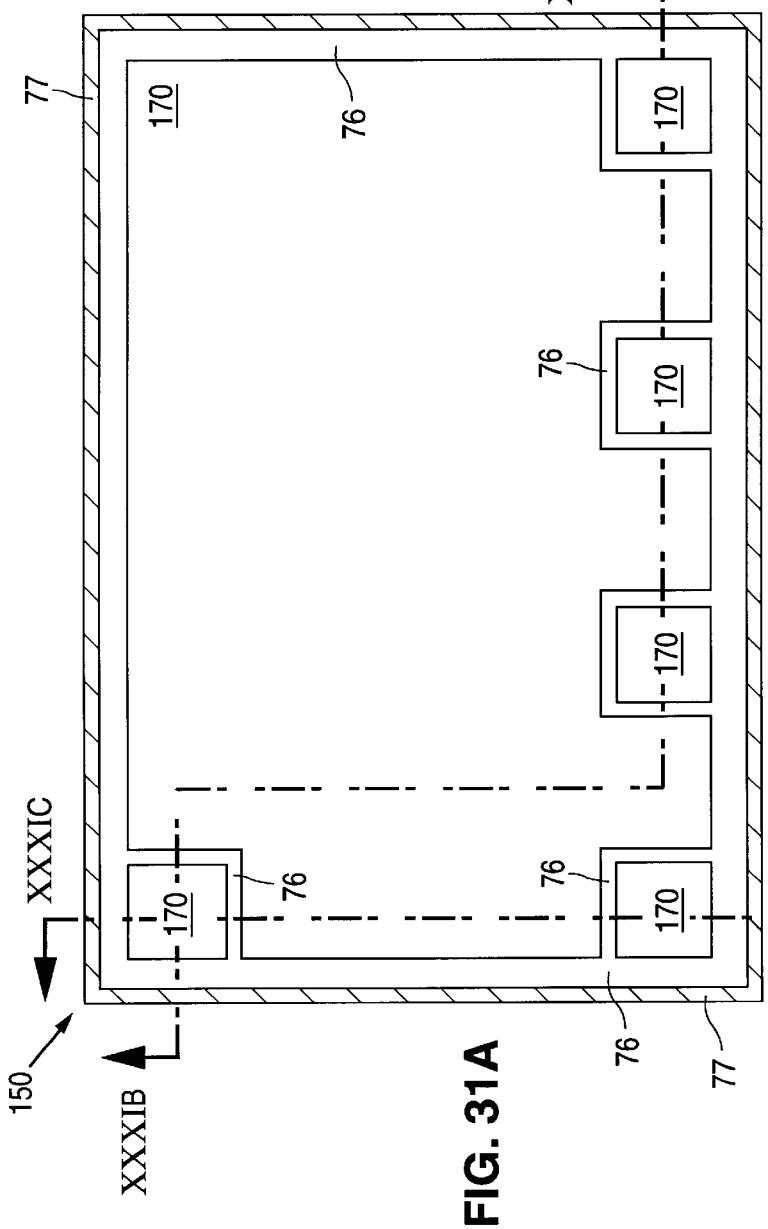
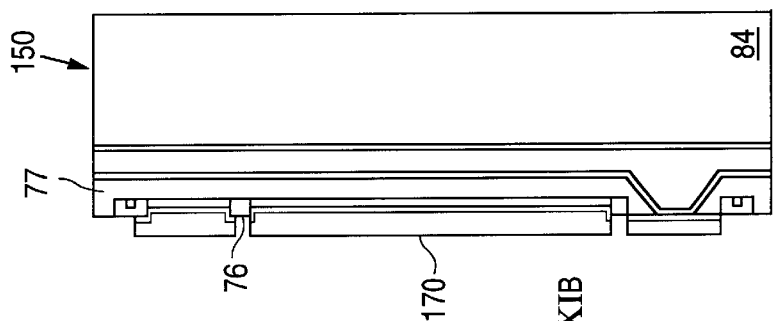
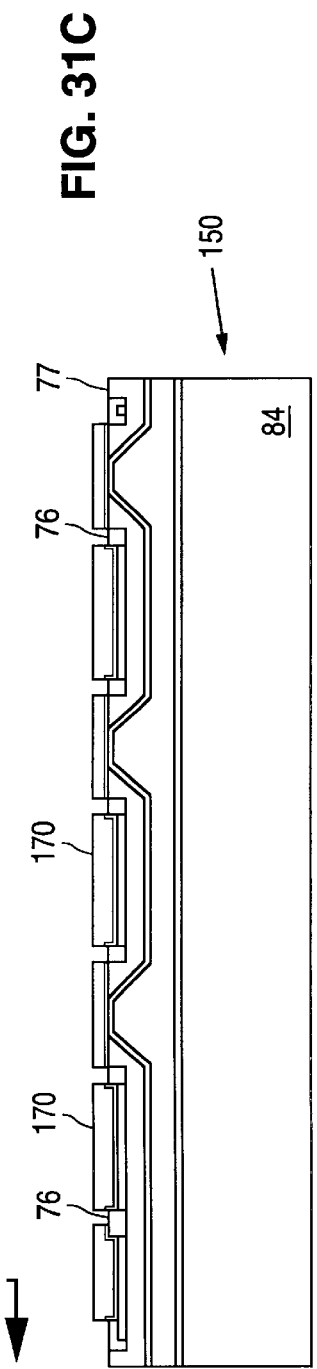

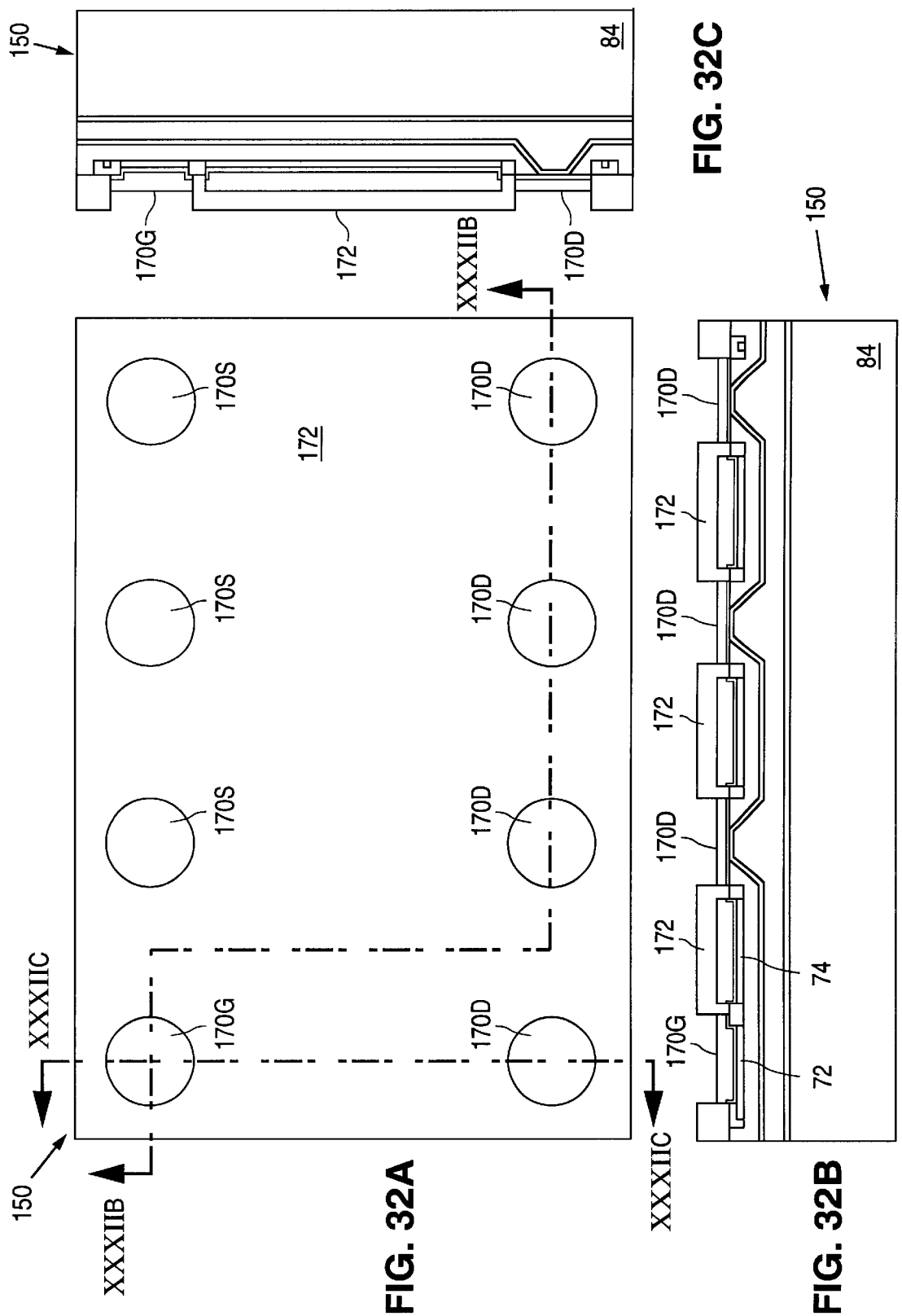

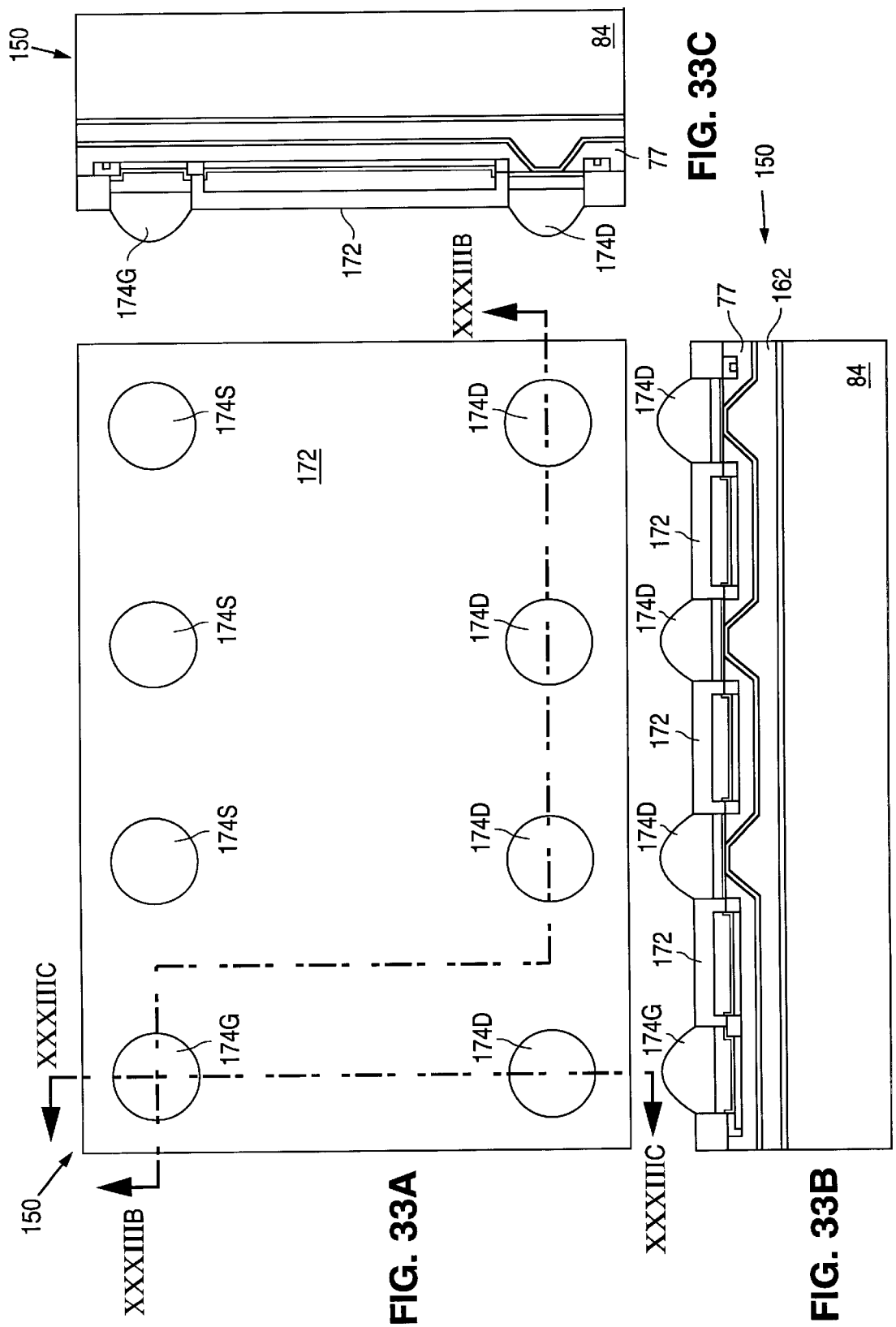

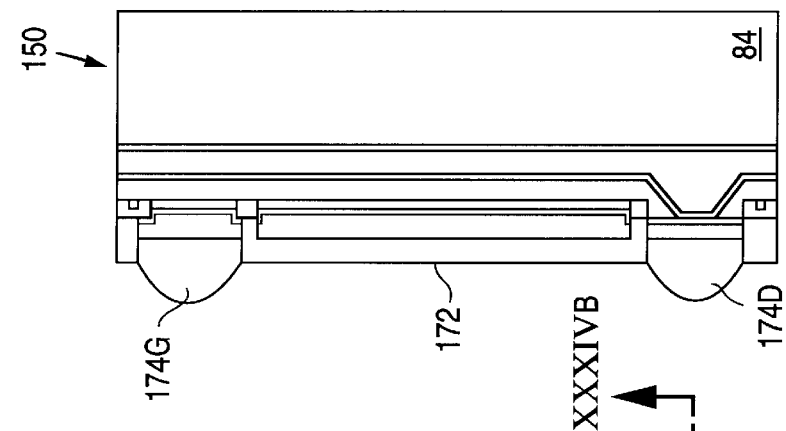
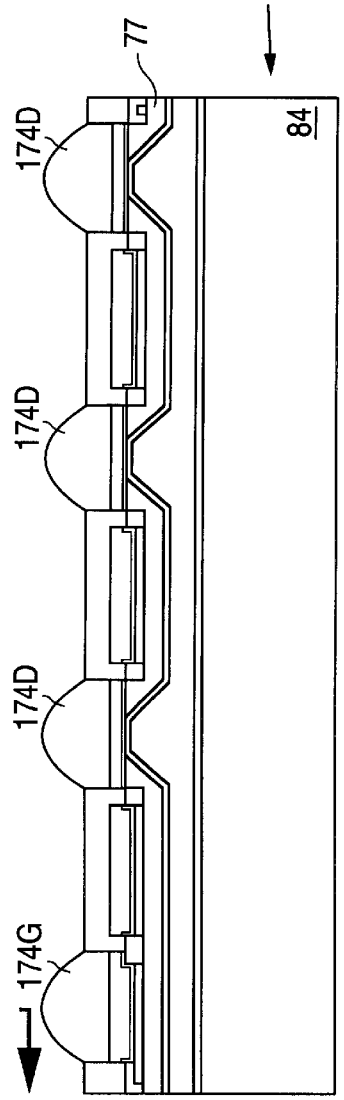
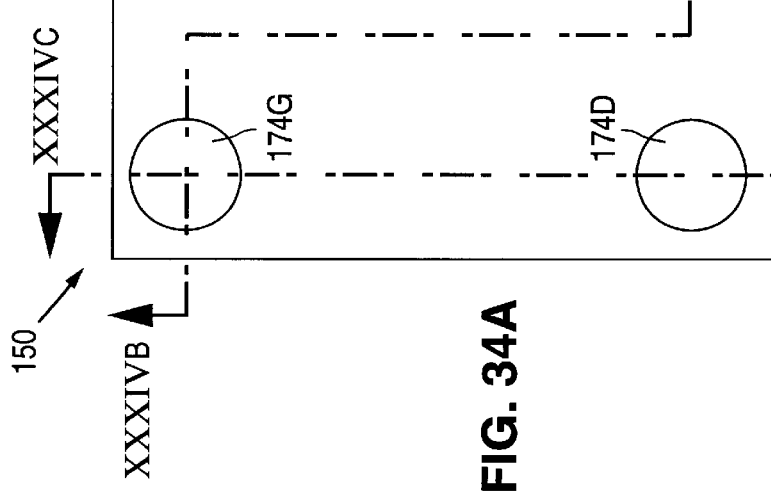
FIG. 34A
FIG. 34B
FIG. 34C

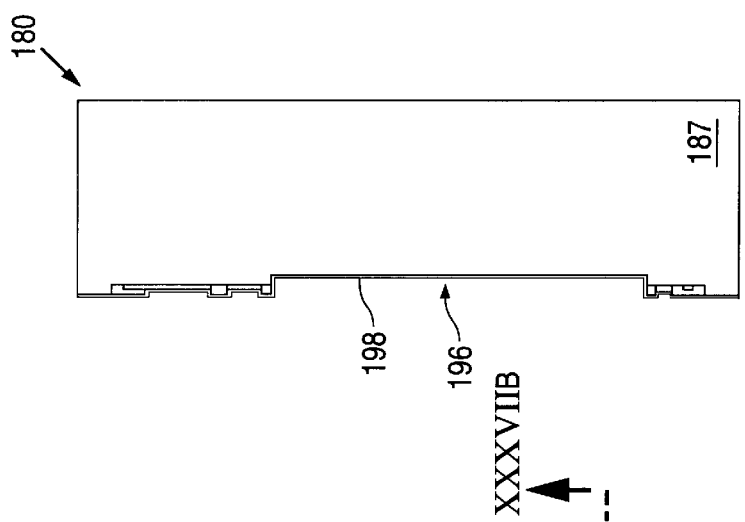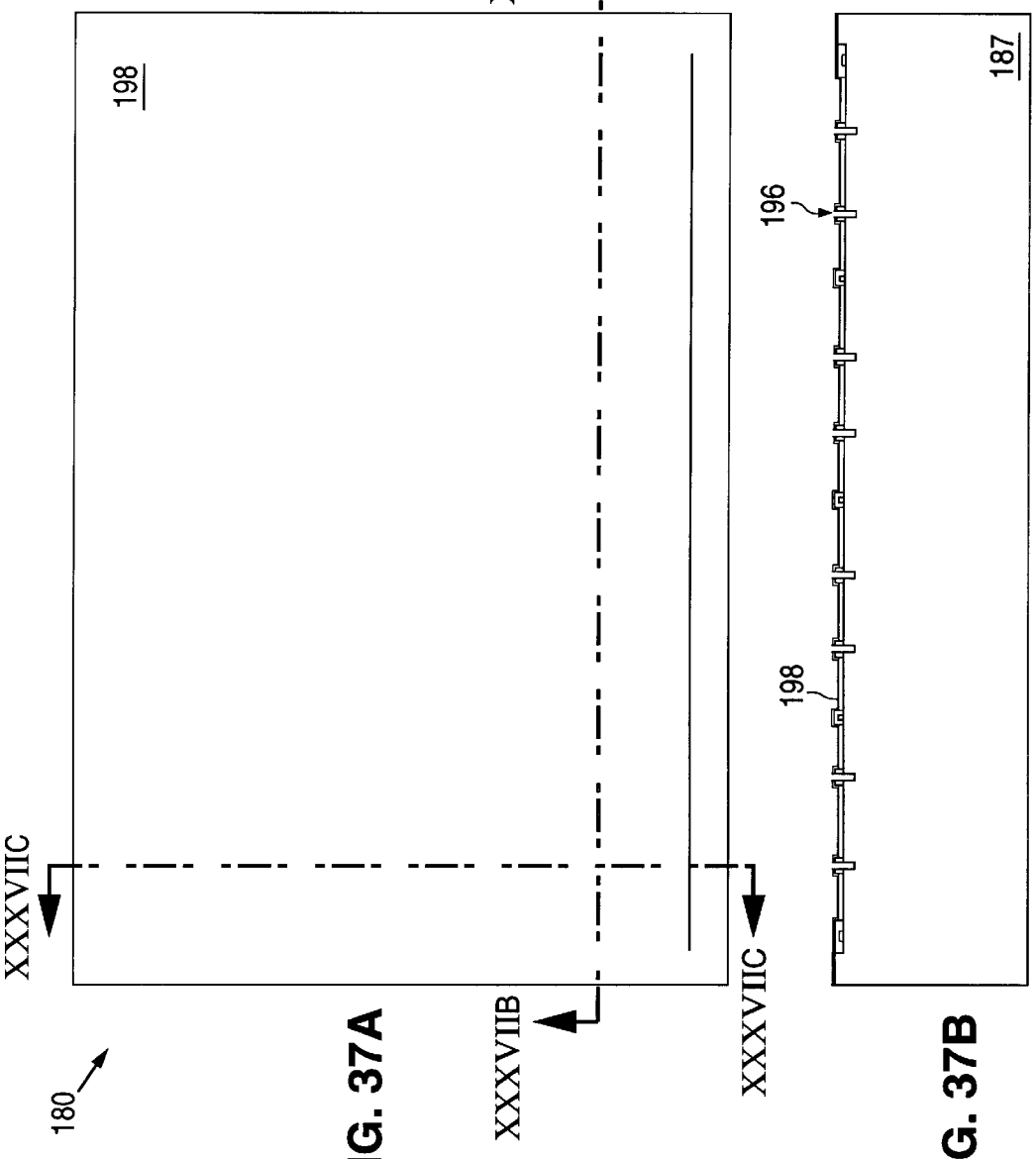

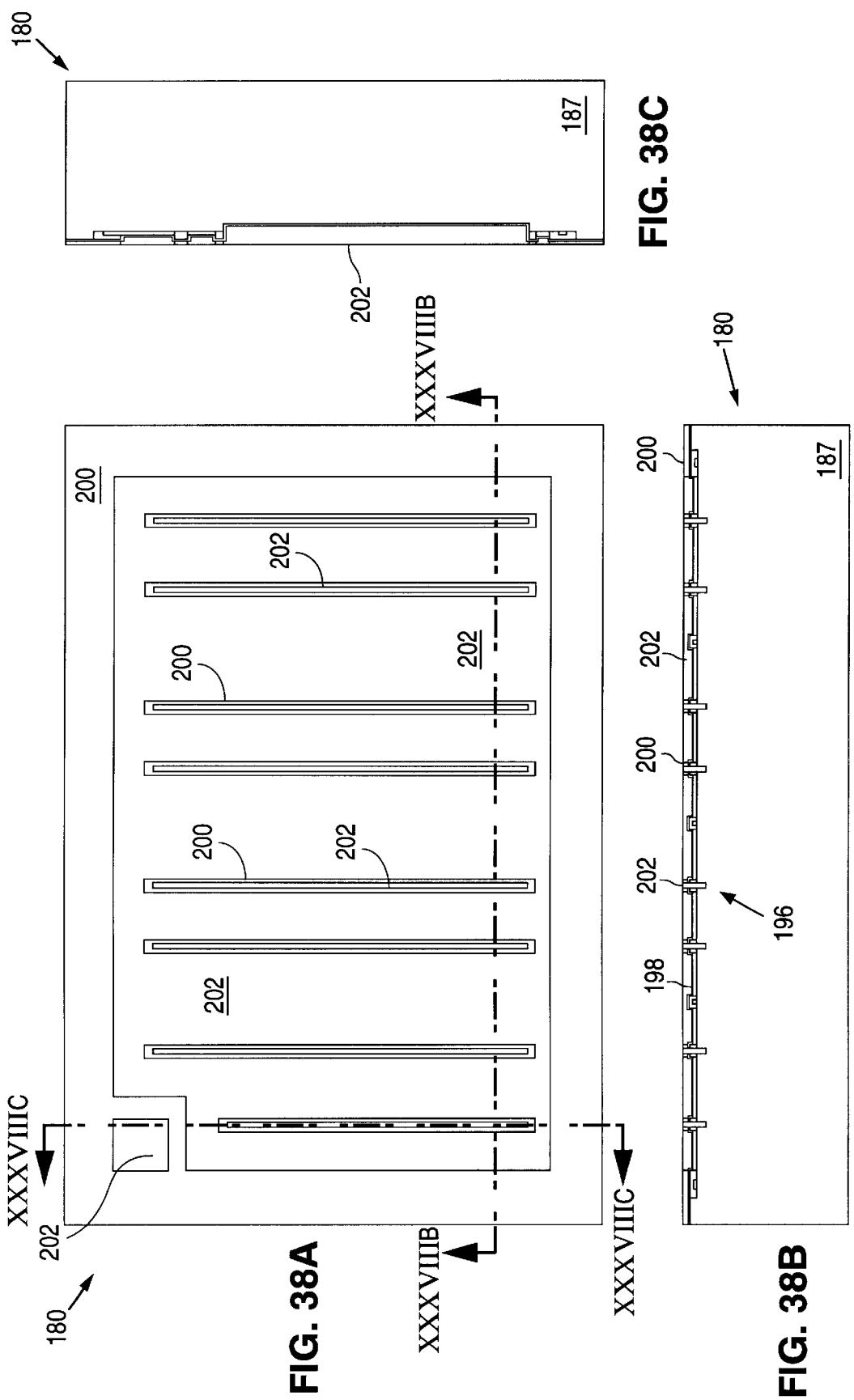

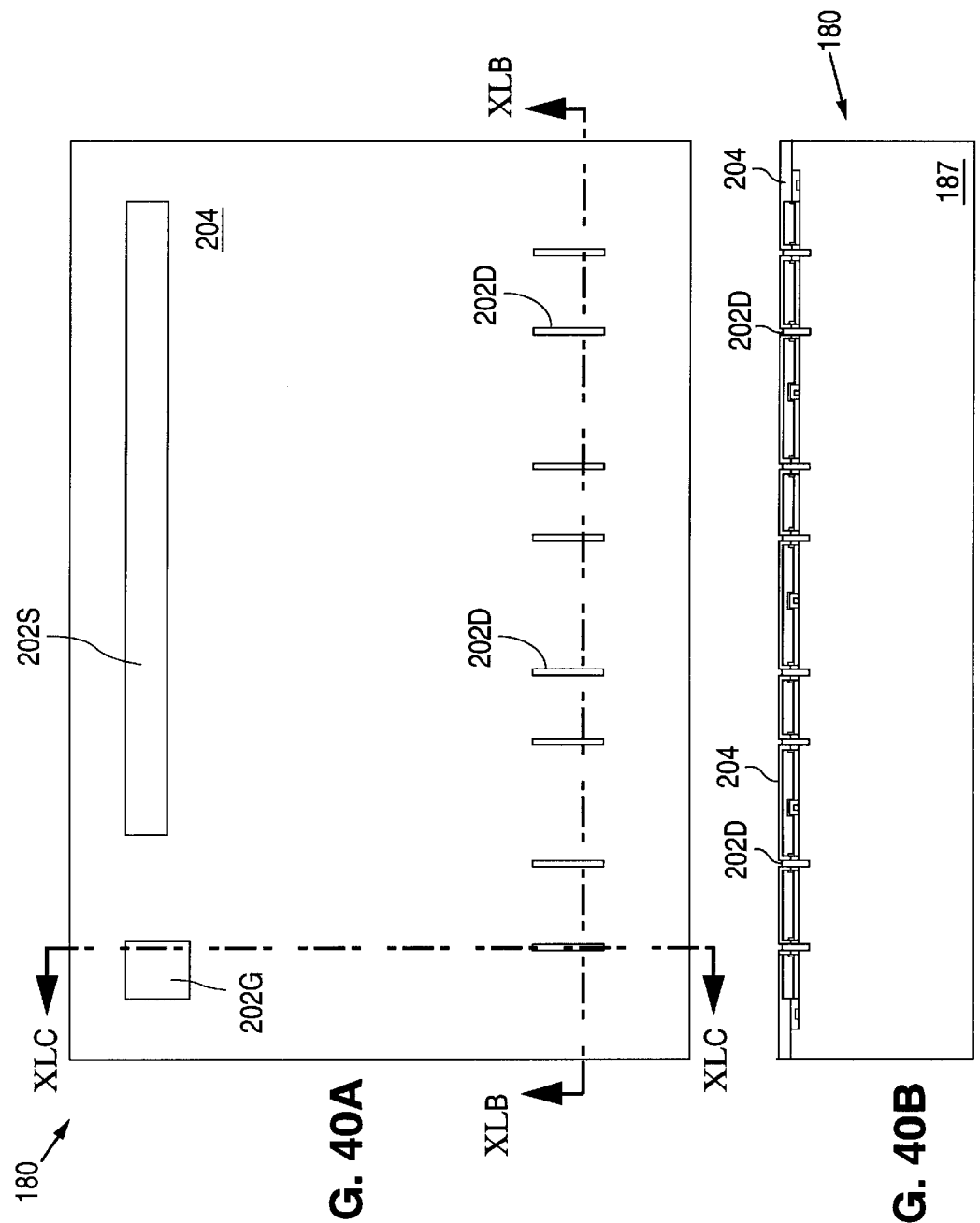

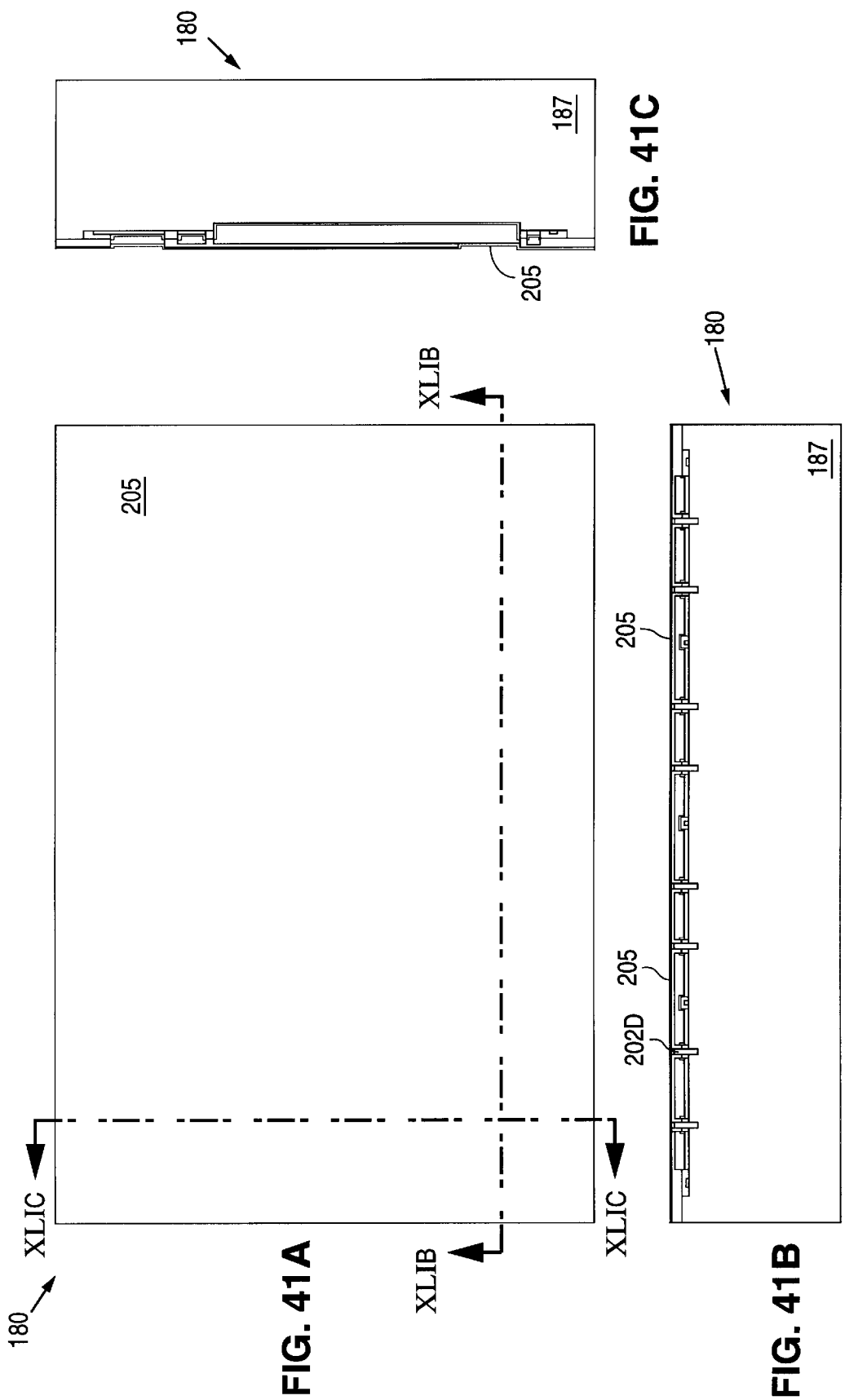

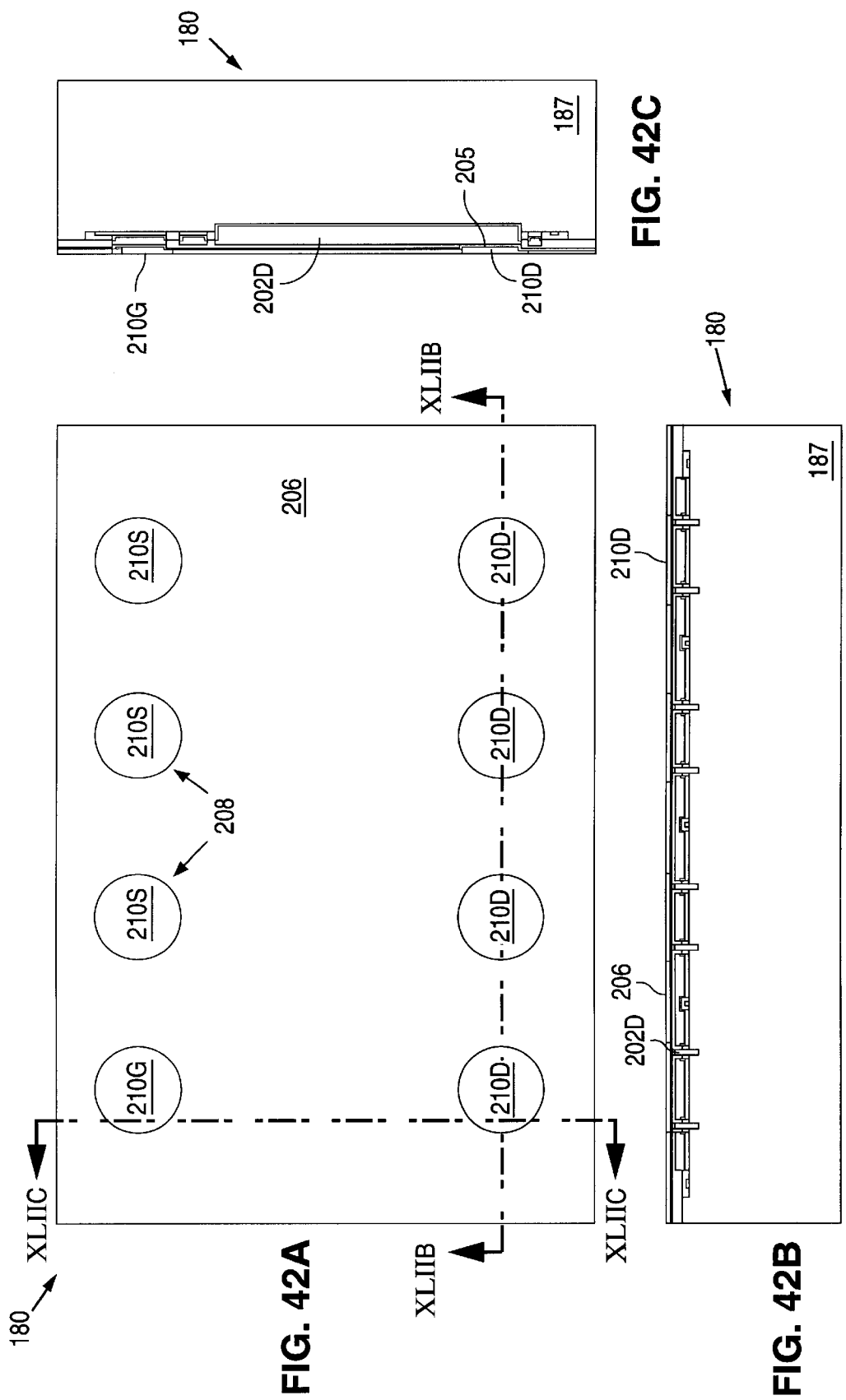

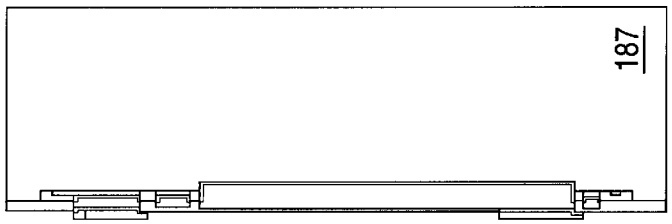
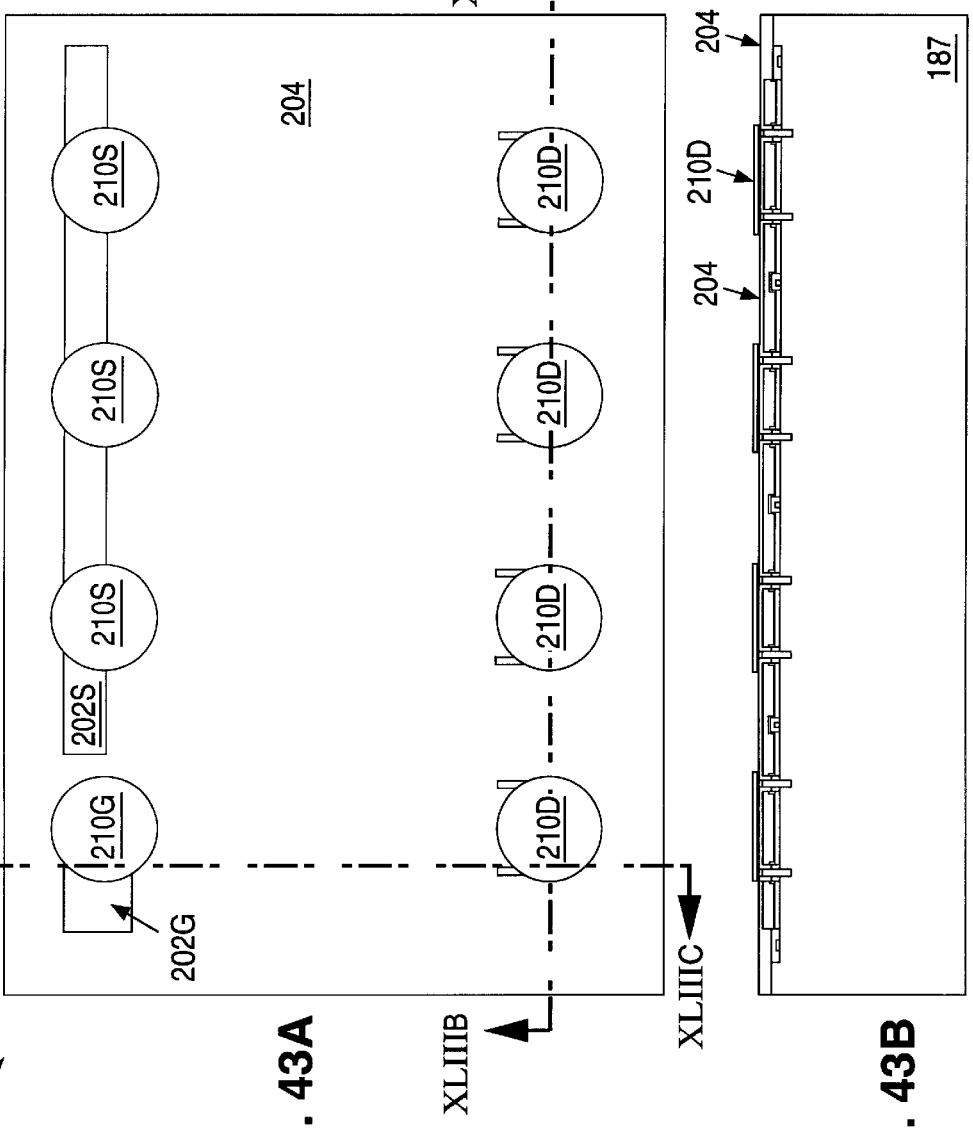
FIG. 43A  FIG. 43B  FIG. 43C

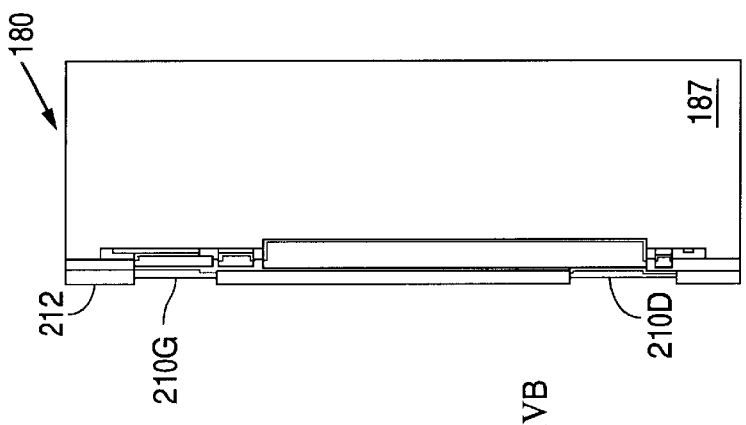
FIG. 44C
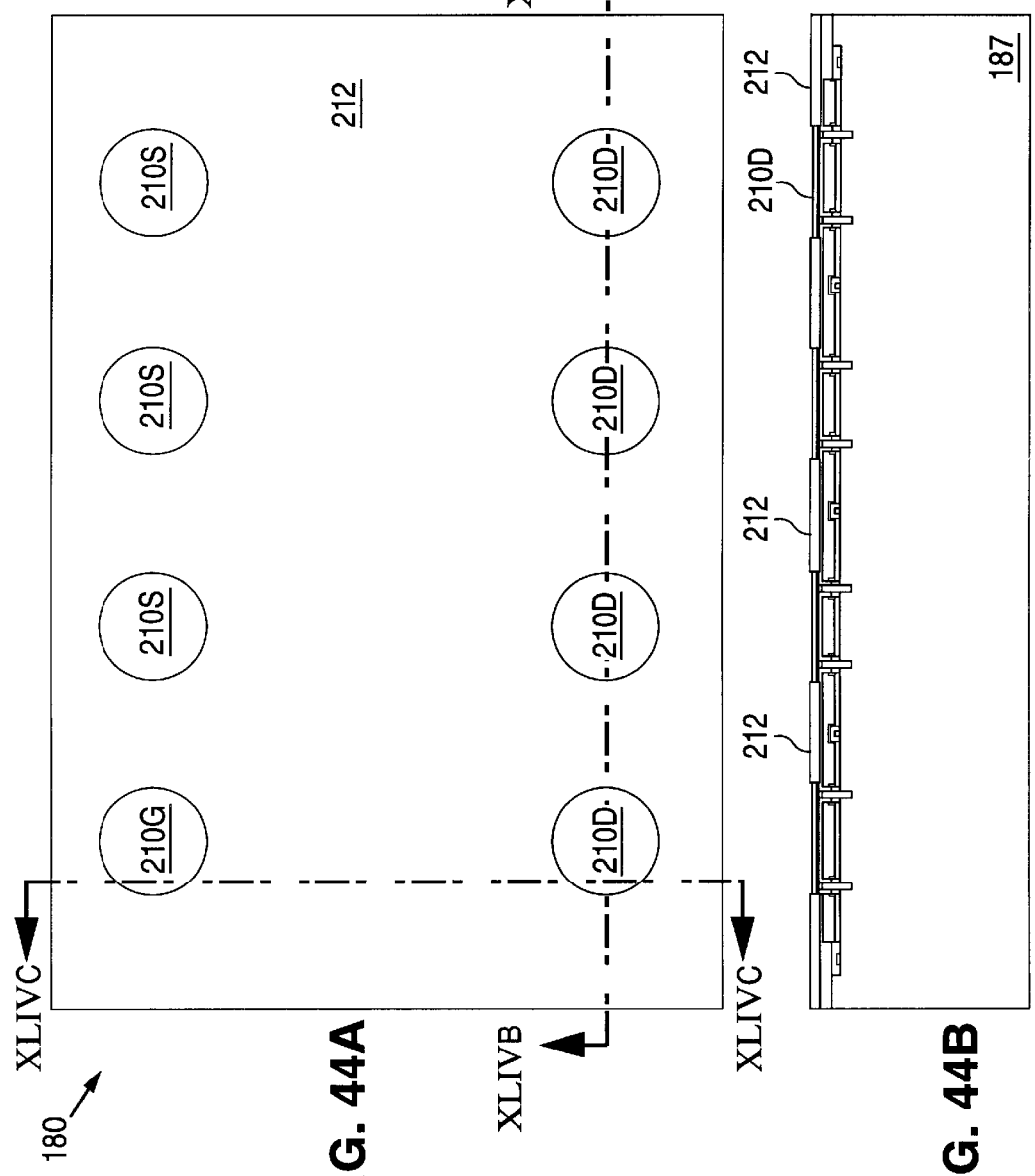
FIG. 44A
FIG. 44B

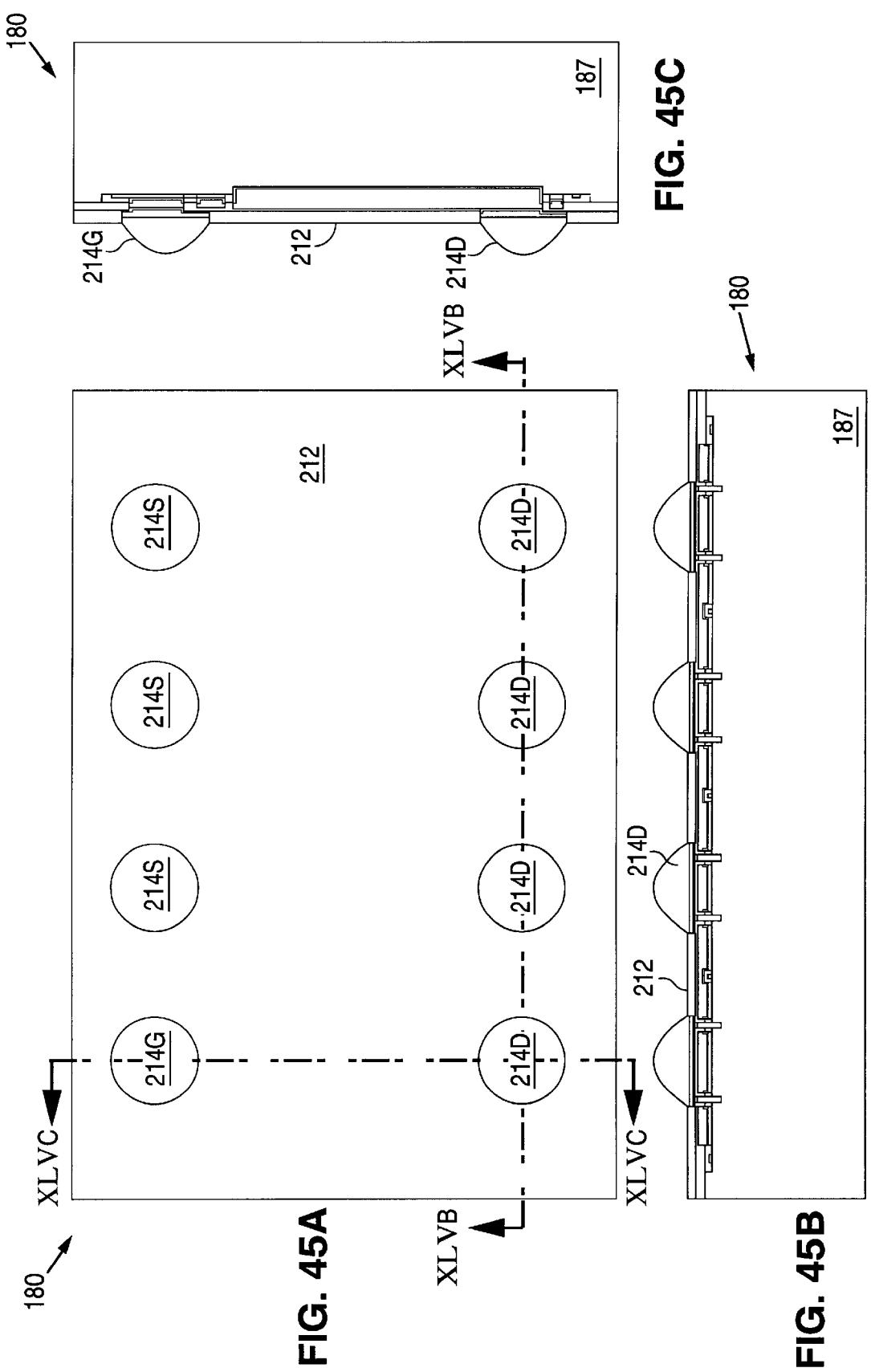

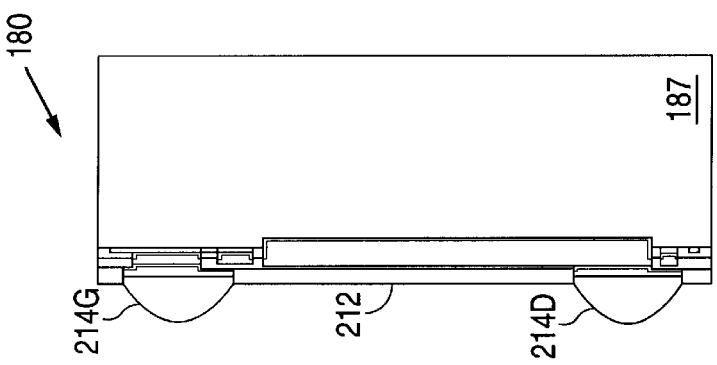
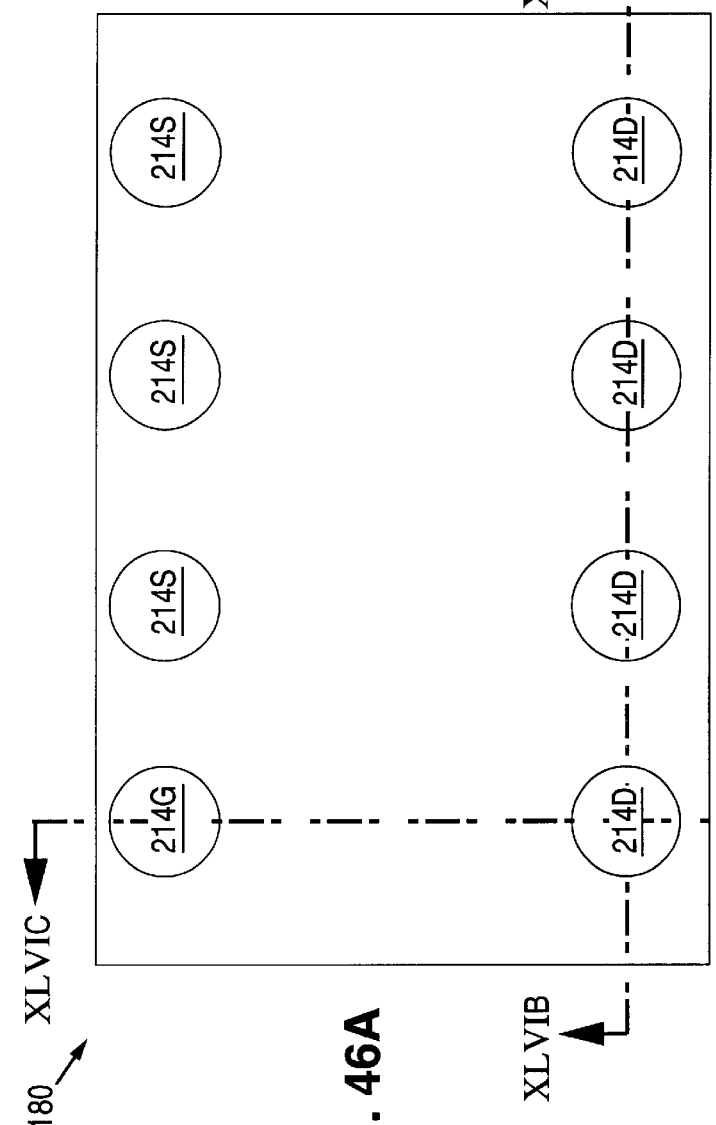
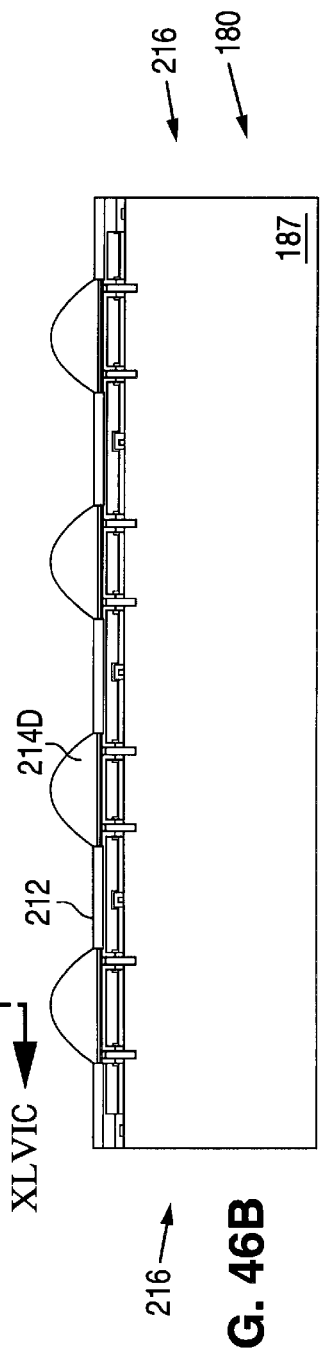
FIG. 46C
FIG. 46A
FIG. 46B

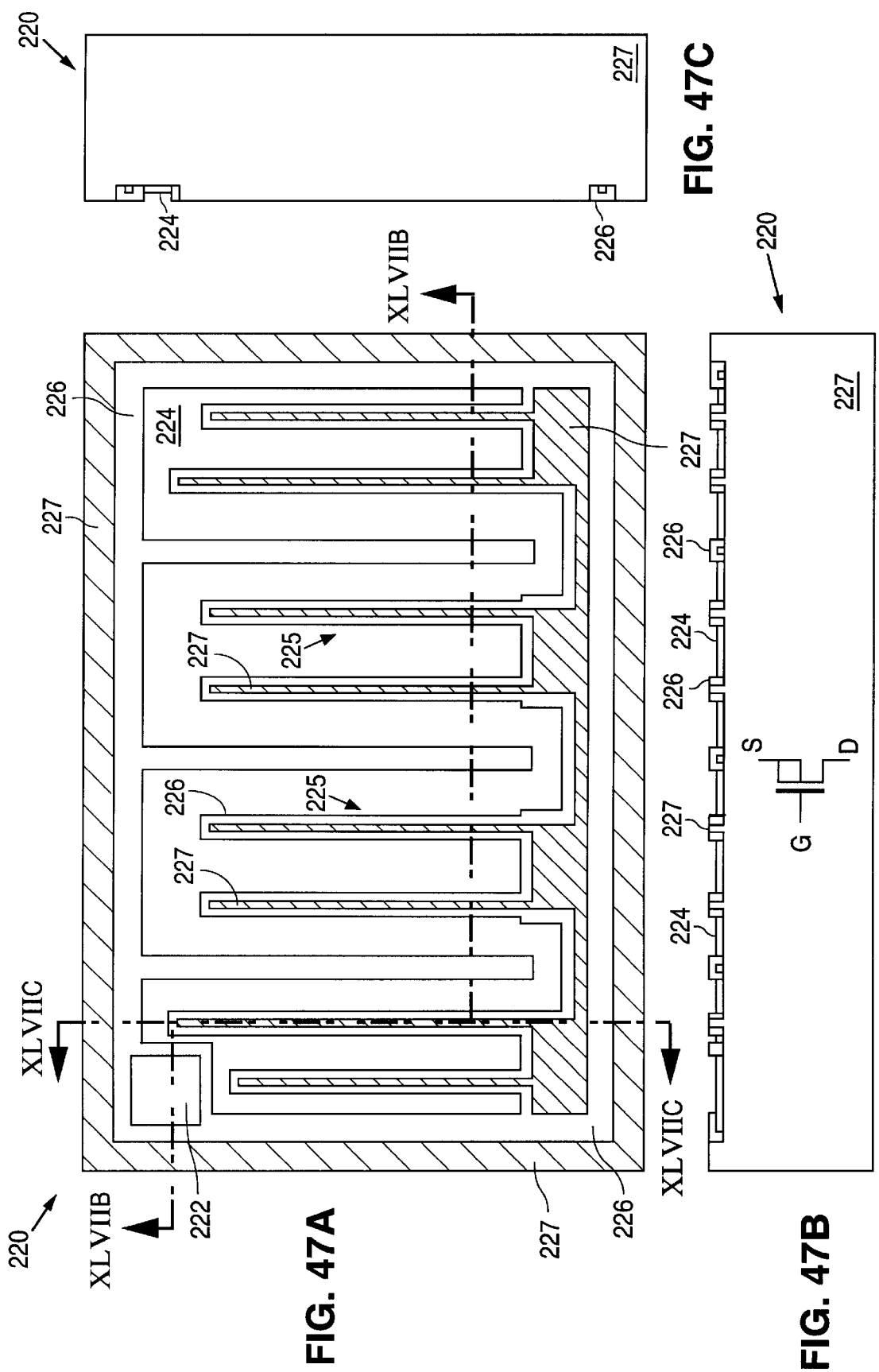

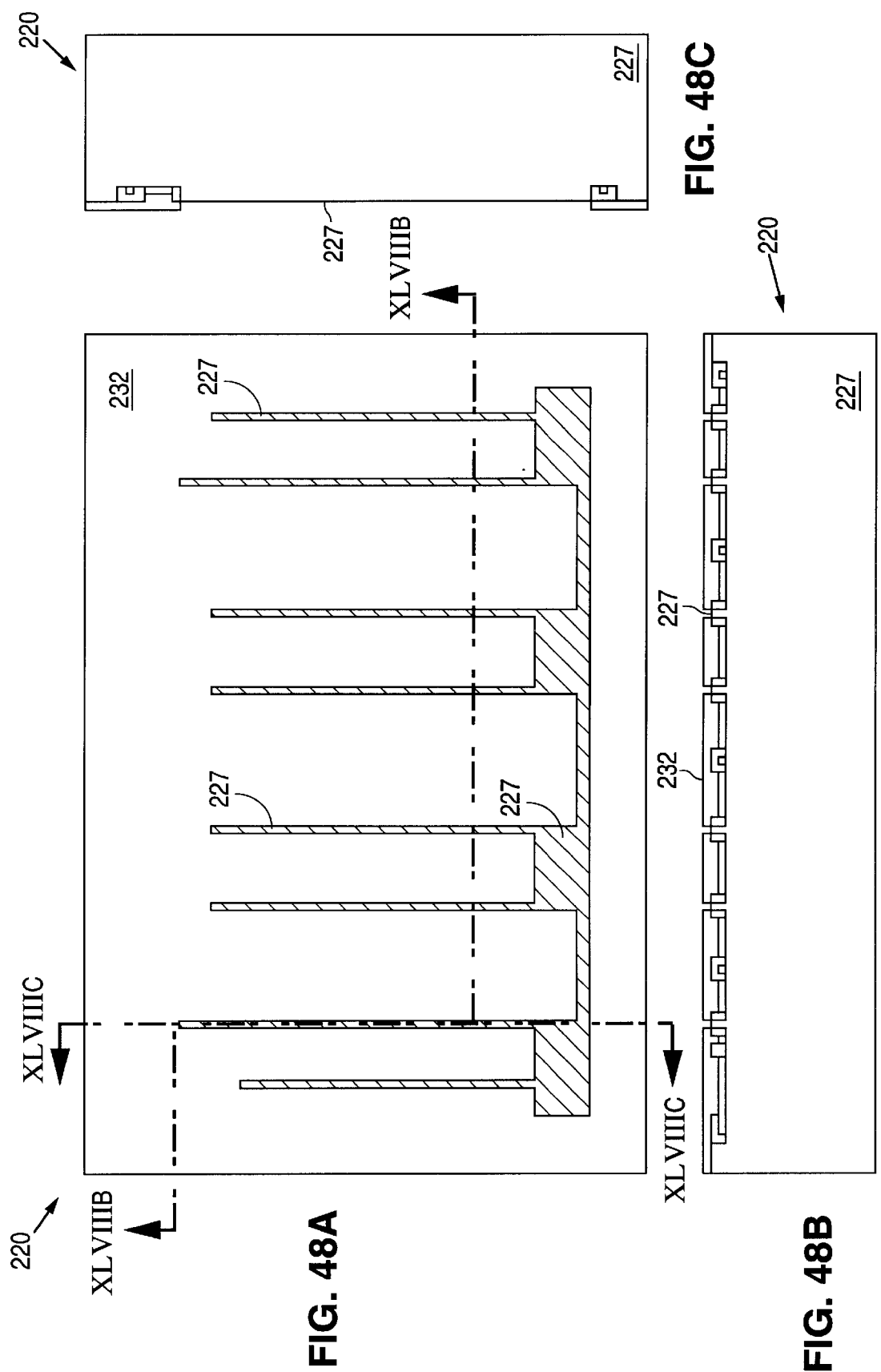

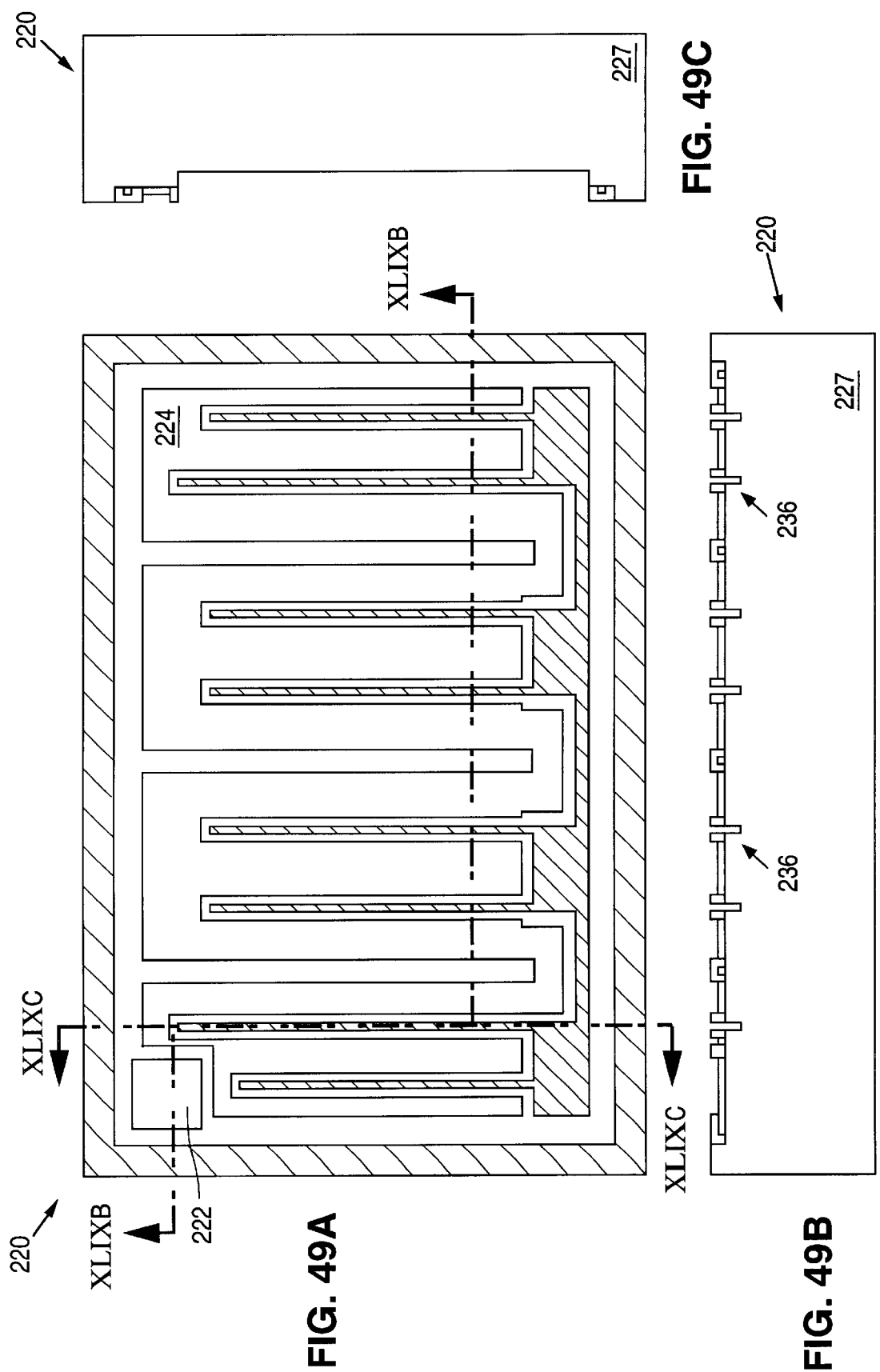

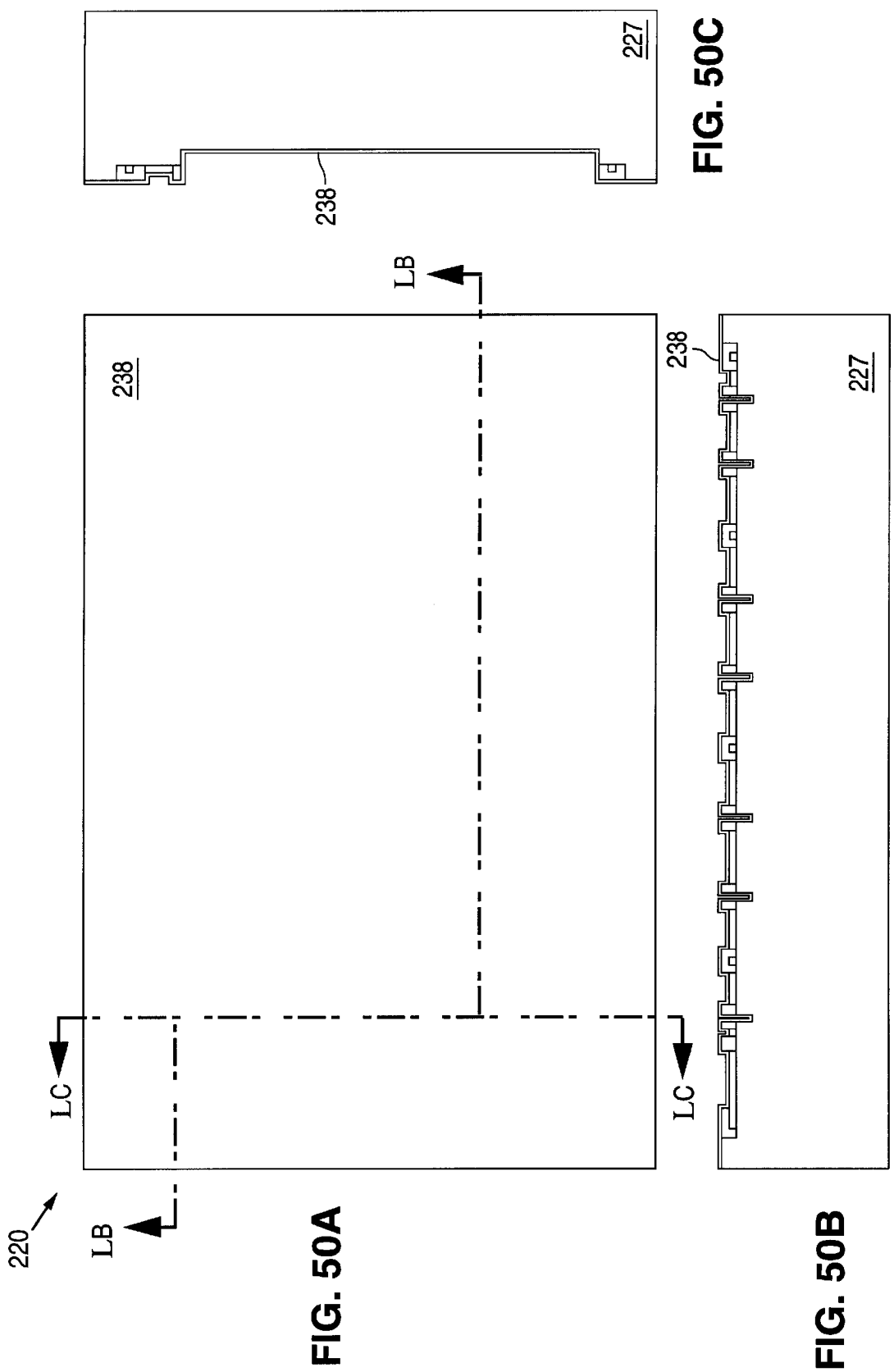

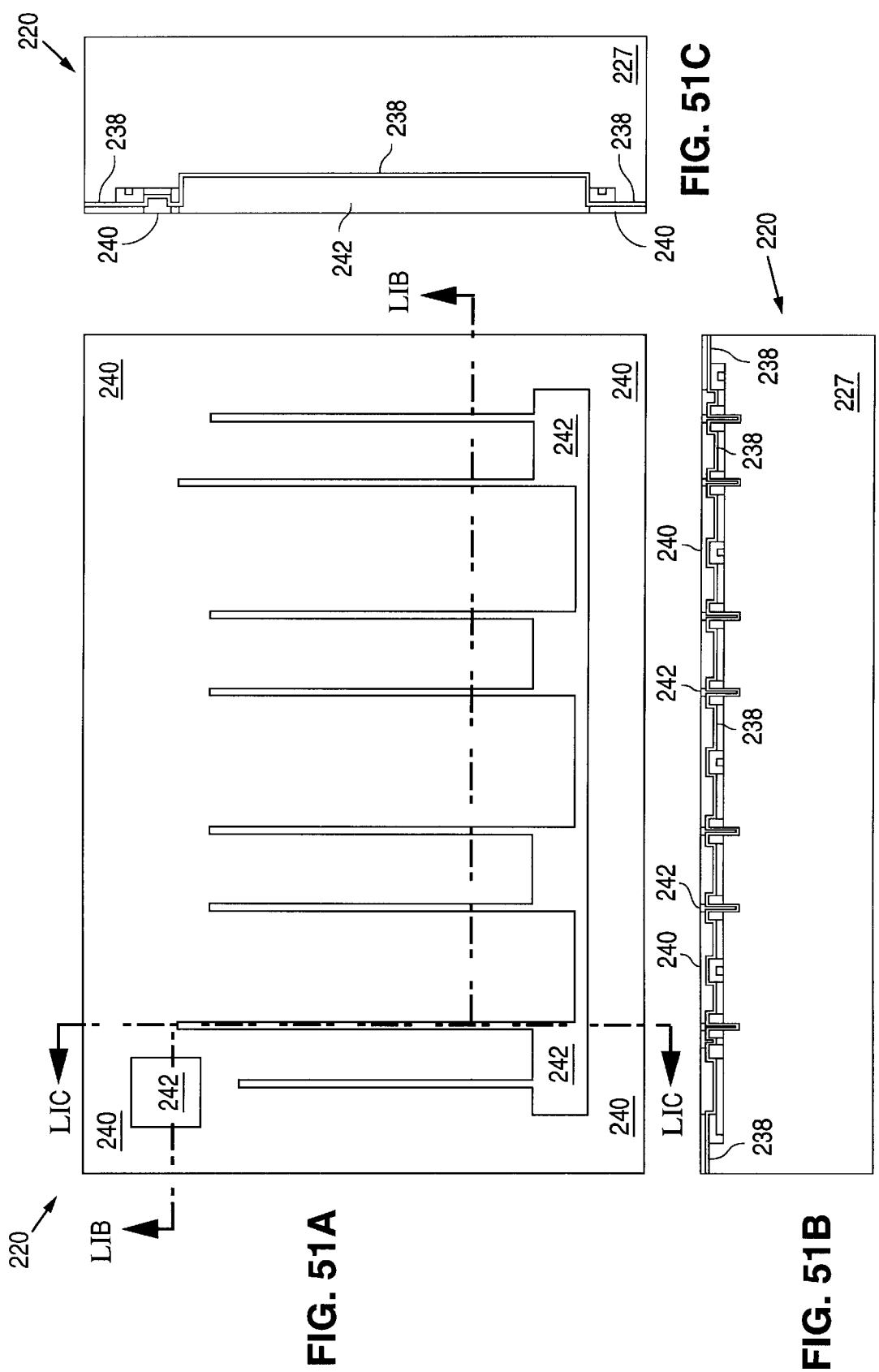

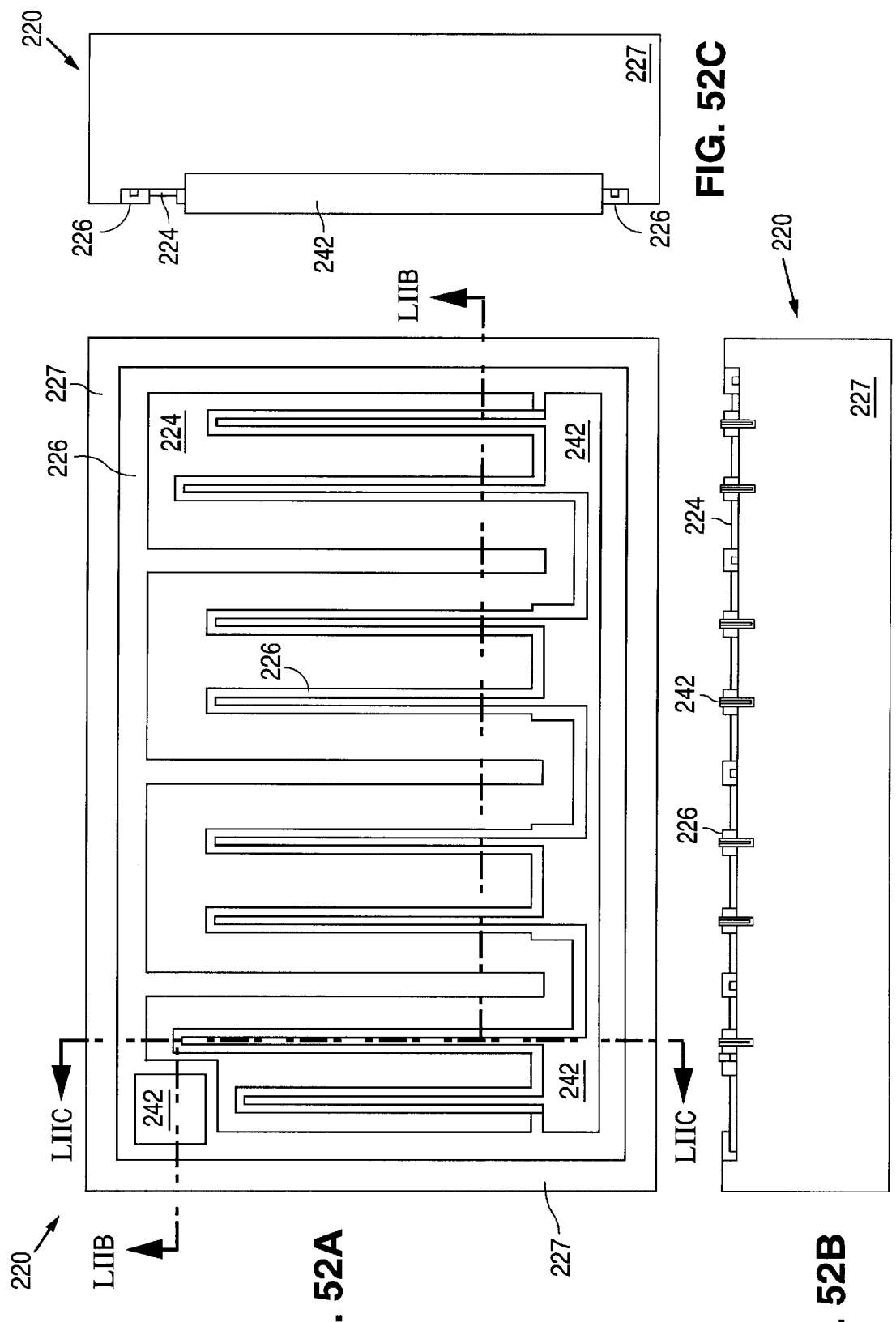

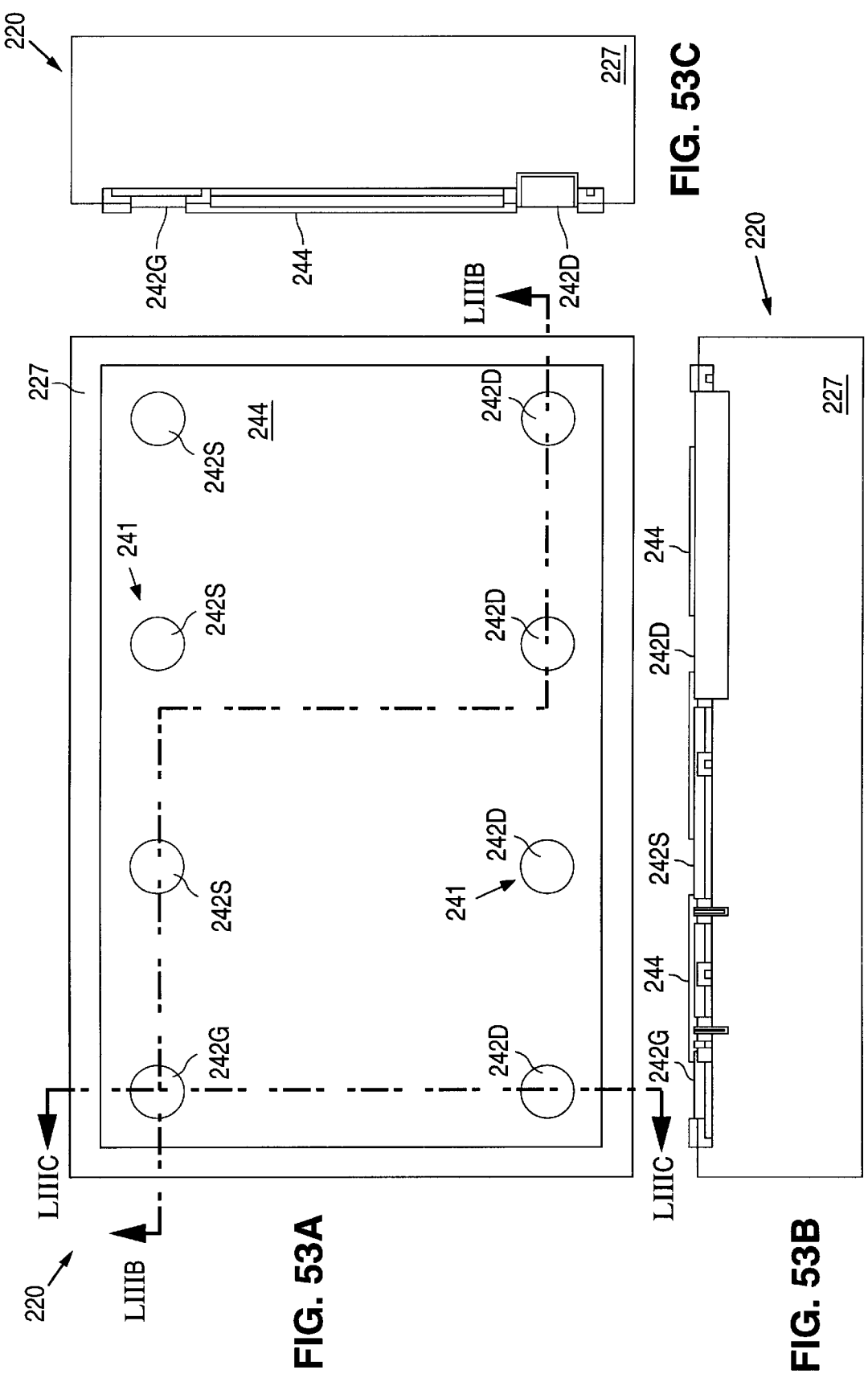

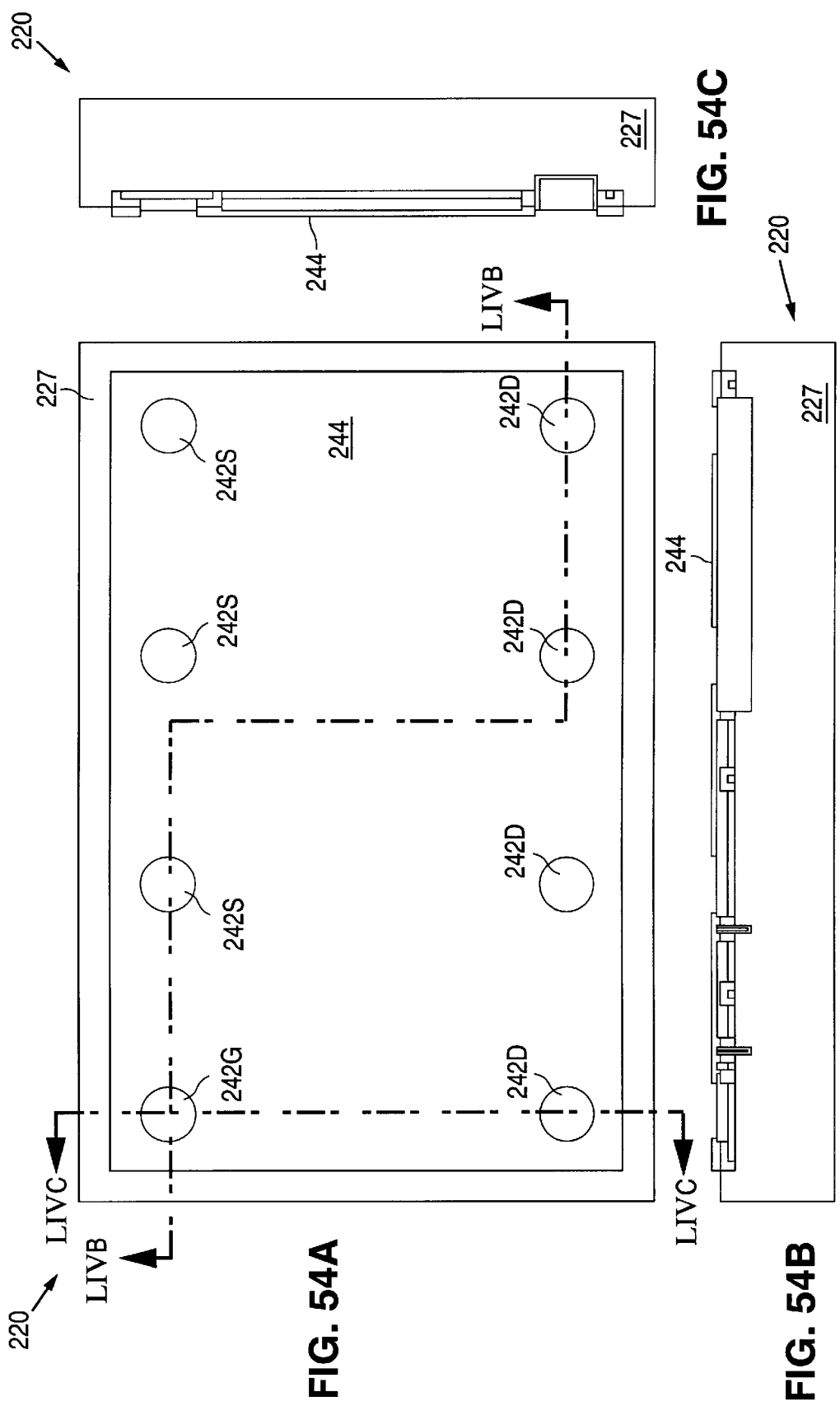

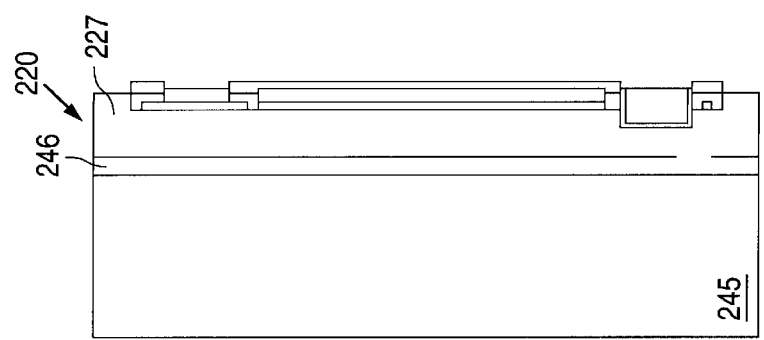
FIG. 55C
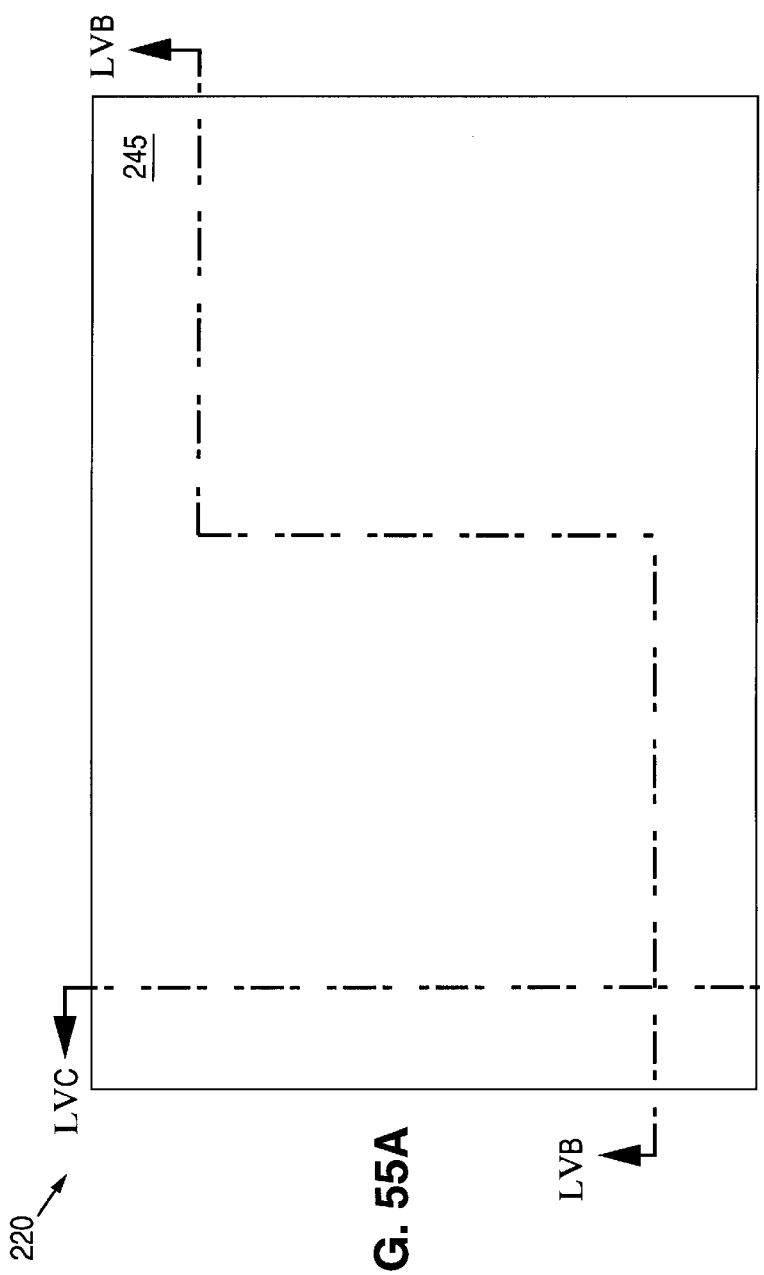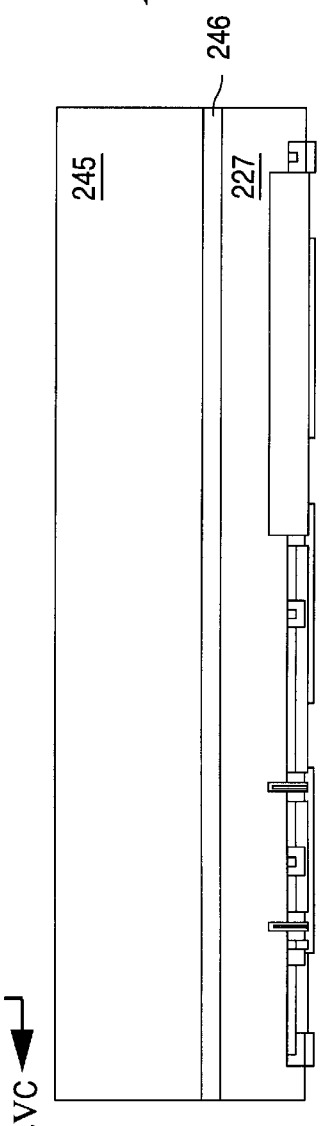
FIG. 55A
FIG. 55B

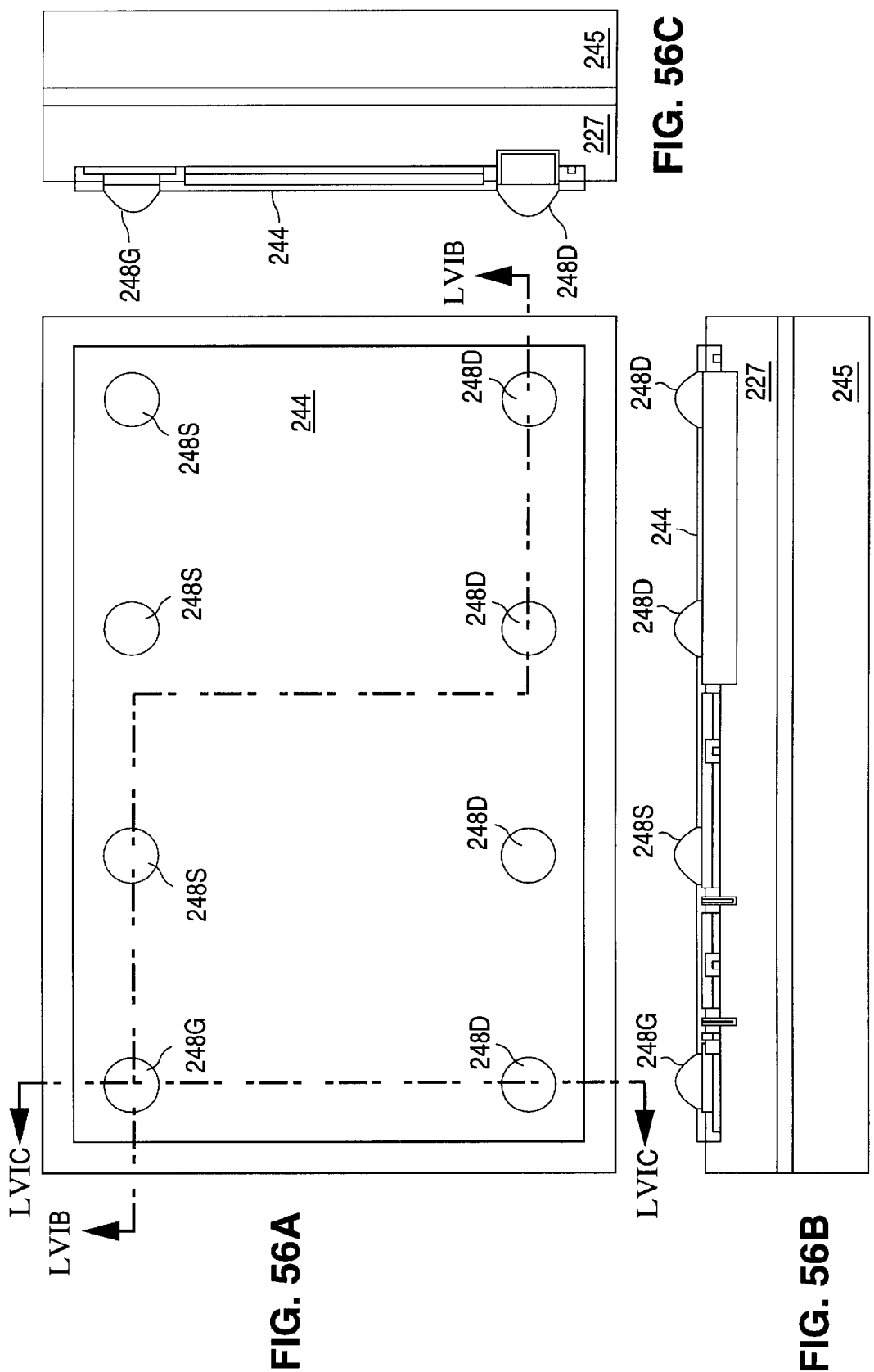

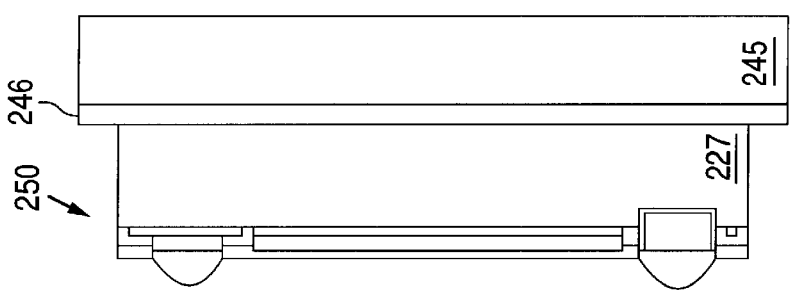
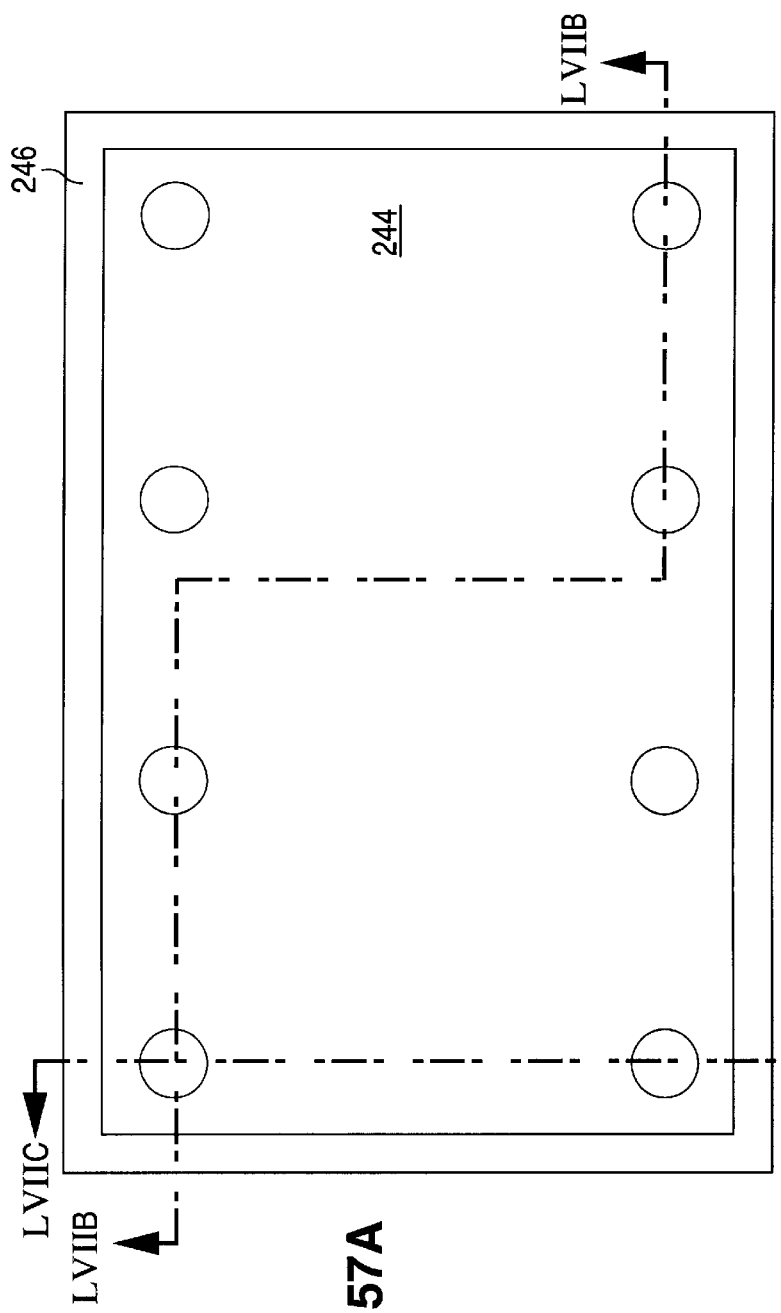
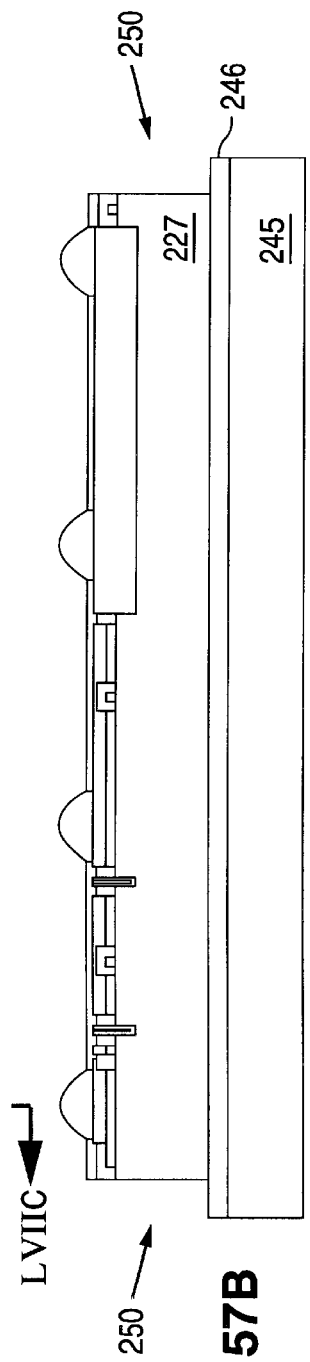
FIG. 57C
FIG. 57A
FIG. 57B

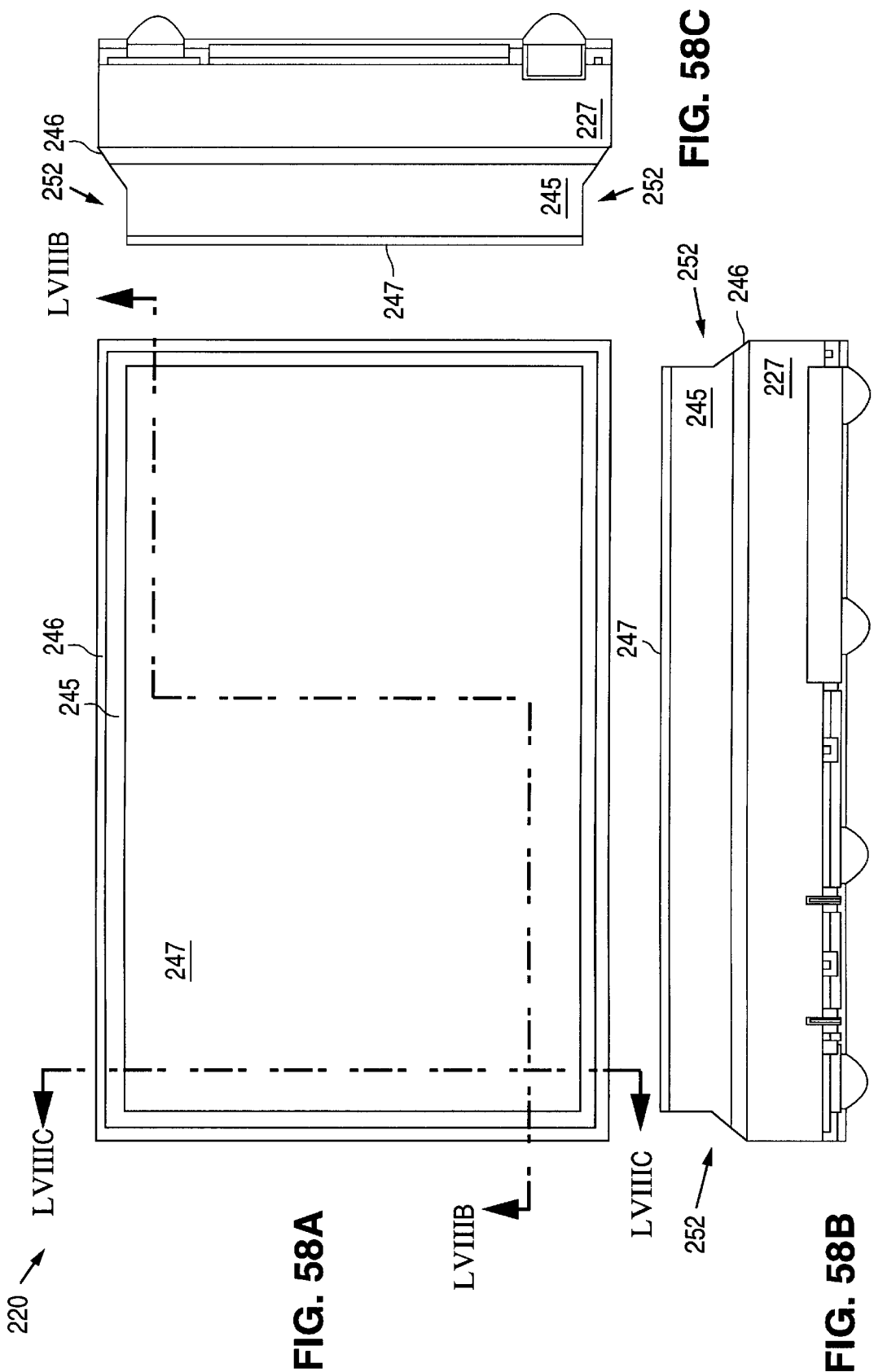

VERTICAL STRUCTURE FOR SEMICONDUCTOR WAFER-LEVEL CHIP SCALE PACKAGES

FIELD OF THE INVENTION

This invention relates to wafer-level packaging techniques for semiconductor chips and in particular to packaging techniques for active or passive semiconductor chips that contain devices or components, such as vertical power MOSFETs or capacitors, that have terminals on both sides of the chip.

BACKGROUND OF THE INVENTION

After the processing of a semiconductor wafer has been completed, the resulting semiconductor chips, which could be integrated circuit (IC) or MOSFET chips for example, must be separated and packaged in such a way that they can be connected to external circuitry. There are many known packaging techniques. Most involve mounting the chip on a leadframe, connecting the chip pads to the leadframe by wire-bonding or otherwise, and then encapsulating the chip and wire bonds in a plastic capsule, with the leadframe left protruding from the capsule. The encapsulation is often done by injection-molding. The leadframe is then trimmed to remove the tie bars that hold it together, and the leads are bent in such a way that the package can be mounted on a flat surface, typically a printed circuit board (PCB).

This is generally an expensive, time-consuming process, since the individual chips are typically handled separately. Moreover, the resulting semiconductor package is considerably larger than the chip itself, using up an undue amount of scarce "real estate" on the PCB. In addition, wire bonds are fragile and introduce a considerable resistance between the chip pads and the leads of the package.

The problems are particularly difficult when the device to be packaged is a "vertical" device, having terminals on opposite faces of the chip. For example, a power MOSFET typically has its source and gate terminals on the front side of the chip and its drain terminal on the back side of the chip. Similarly, a vertical diode has its anode terminal on one face of the chip and its cathode terminal on the opposite face of the chip. Bipolar transistors, junction field effect transistors (JFETs), and various types of integrated circuits (ICs) can also be fabricated in a "vertical" configuration, as can passive components such as semiconductor capacitors or resistors.

Accordingly, there is a need for a process which is simpler and less expensive than existing processes and which produces a package that is essentially the same size as the chip. There is a particular need for such a process and package that can be used with semiconductor dice having terminals on both their front and back sides. For reasons of economy and enhanced performance, it is desirable that the process be performed on all of the chips in the wafer form before they are separated from each other, i.e., that the process be vertical wafer-level chip-scale packaging.

SUMMARY OF THE INVENTION

All of these objectives are satisfied in a semiconductor chip package and method of fabricating the same in accordance with this invention.

A power MOSFET package in accordance with this invention comprises a semiconductor chip comprising a vertical power MOSFET. The power MOSFET comprises a source region and a gate electrode generally on a front side of the chip. A source contact, a gate contact and a drain contact are located adjacent the front side of the chip, the source contact being electrically connected to the source region, the gate contact being electrically connected to the gate, and the source, gate and drain contacts being electrically insulated from each other. One or more vias extend through the semiconductor chip from the front side to the back side, the vias being filled with a conductive material such as metal, the conductive material being electrically connected with the drain contact and a drain region of the MOSFET. The drain region may be located adjacent the back side of the MOSFET.

The source contact and the drain contact can each comprise pads, layers, bumps and other conductive elements.

In some embodiments, the vias are in the form of holes through the chip of a circular or other shape; in other embodiments, the vias are in the form of longitudinal trenches.

In some embodiments, a backside support substrate is attached to a back side of the semiconductor chip, the backside support substrate being electrically conductive, the conductive material being electrically connected with the backside support substrate In some embodiments according to the invention, the vias extend partially into the semiconductor chip from the front side and terminate in the drain region. The vias do not extend all the way through the semiconductor chip. The vias are filled with metal or another conductive material, the conductive material being electrically connected with the drain contact.

The principles of this invention are not limited to semiconductor chips that contain power MOSFETs. Rather, the principles of this invention can be used with virtually any semiconductor IC device that has terminals on both sides of the chip—for example, vertical diodes, vertical bipolar transistors, and junction field effect transistors (JFETs). Thus, in another aspect of this invention, a semiconductor package comprises a semiconductor chip having first and second principal surfaces and comprising a vertical semiconductor device of any kind. The device has a first terminal located adjacent the first principal surface and a second terminal located adjacent the second principal surface. A first contact is located at the first principal surface of the semiconductor chip and is electrically connected to the first terminal of the device. A second contact is also located at the first principal surface. One or more vias extend at least part of the way through the semiconductor chip, the vias being filled with a conductive material and the conductive material being electrically connected to the second contact and the second terminal of the device. The vias may extend part of the way through the semiconductor chip or entirely through the semiconductor chip. The semiconductor package can comprise a support substrate attached to the second principal surface of the semiconductor chip. The support substrate may be electrically conductive and/or may be attached to the second principal surface of the semiconductor chip with an electrically conductive adhesive.

The invention also includes a process of fabricating a power MOSFET package in wafer form, the process comprising the steps of: providing a semiconductor wafer comprising a plurality of chips, each of the chips comprising a power MOSFET, each of the chips having a front side adjacent to which a source region and a gate electrode are located; forming a mask over a front side of the wafer, the mask having a plurality of openings; etching the wafer through the openings in the mask to form a plurality of vias extending through the wafer; depositing metal in the vias; and separating the chips from each other. The process may also include the steps of thinning the wafer, for example by grinding or lapping the back side of the wafer, and/or attaching a support substrate to a back side of the wafer. The support substrate can be electrically conductive.

The process may also include forming solder bumps in the openings for the source, gate and drain pads and insulating the solder bumps by forming, a passivation layer.

Alternatively, the wafer can be etched such that the vias extend only partially through the wafer, thereby making electrical contact between the metal in the vias and the drain of the power MOSFET.

According to yet another embodiment, the mask can be formed over the back side of the wafer, and the wafer can be etched through the openings in the mask from the back side to the front side of the wafer.

The process of this invention can be used to fabricate a package for any semiconductor device that has terminals on both sides of the chip—for example, vertical diodes, vertical bipolar transistors, and junction field effect transistors (JFETs). Thus the invention also includes a process of fabricating a package for any type of semiconductor device comprising: providing a semiconductor wafer comprising a plurality of chips, each of the chips comprising the semiconductor device, the wafer having first and second principal surfaces; the semiconductor device having a first terminal located adjacent the first principal surface and a second terminal located adjacent the second principal surface; forming a mask over the first principal surface of the wafer, the mask having a plurality of openings, there being at least one of the openings adjacent each of the chips; etching the wafer through the openings in the mask from the first principal surface to the second principal surface to form a plurality of vias extending entirely through the wafer; removing the mask; depositing an electrically conductive material in the vias; and separating the chips from each other.

BRIEF DESCRIPTION OF THE DRAWINGS

FIGS. 7A–7C through 20A–20C illustrate steps of a process of fabricating a package wherein the vias are formed from the front side to the back side of the chip.

FIGS. 21A–21C through 34A–34C illustrate steps of a process of fabricating a package wherein the vias are formed from the back side to the front side of the chip.

FIGS. 35A–35C through 46A–46C illustrate steps of a process of fabricating a package wherein the vias are formed part way through the chip.

FIGS. 47A–47C through 58A–58C illustrate steps of another process of fabricating a package wherein the vias are formed part way through the chip.

DESCRIPTION OF THE INVENTION

Figure 1:
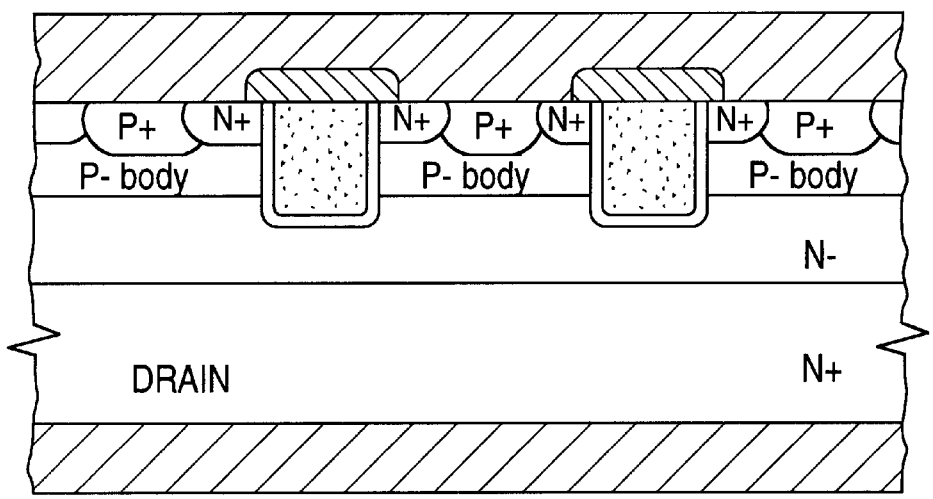
FIG. 1 is a cross-sectional view of a conventional vertical trench MOSFET.
Figure 2:
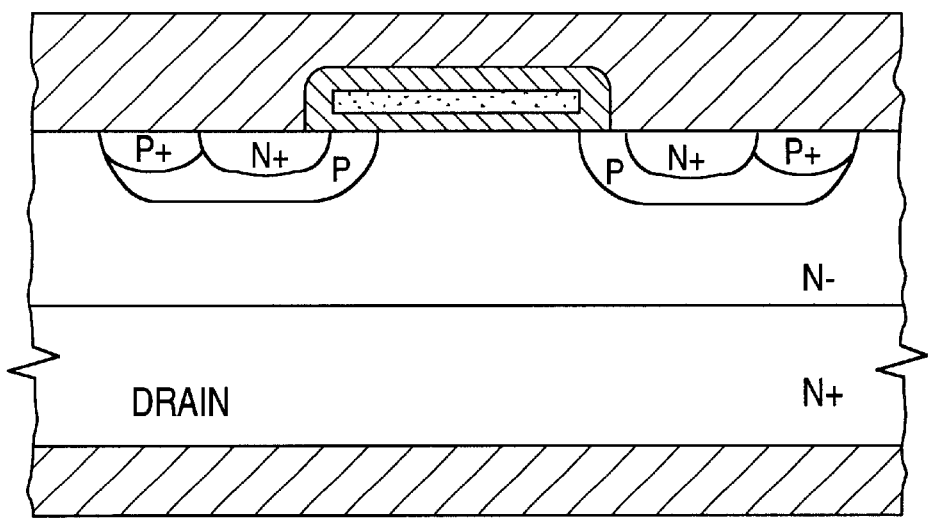
FIG. 2 is a cross-sectional view of a conventional vertical planar DMOSFET.

FIGS. 1 and 2 show cross-sectional views of typical vertical MOSFETs. FIG. 1 shows a trench MOSFEET, in which the N+ source regions are located adjacent the trenches at the front side of the chip. A P-body region abuts the N+ source regions along the sides of the trenches, where a channel is formed when the device is conductive. A metal layer on the front side contacts the N+ source regions and the P-body region through a P+ body contact region. An N+ substrate and an N-drift region form the drain region of the MOSFET which is normally contacted by a metal layer at the back side of the chip. The gate is formed in the trenches and controls a flow of current through the channel adjacent the sides of the trenches. FIG. 2 shows a vertical planar double-diffused DMOSFET. The structure is generally similar, but the gate is located over the surface of the chip instead of being in a trench, and controls a flow of current laterally in a channel just below the surface of the P-body regions. Again the drain is located at the back side of the chip. It is important to note that in both devices the drain terminal is located at the back side of the chip and is difficult to access in a package that is to have all terminals on the front side of the chip. (Note: The designations "source" and "drain" are somewhat arbitrary. As used herein, the term "source" refers to the terminal region adjacent the front side of the chip and the term "drain" refers to the terminal region adjacent the back side of the chip.)

Figure 3A:
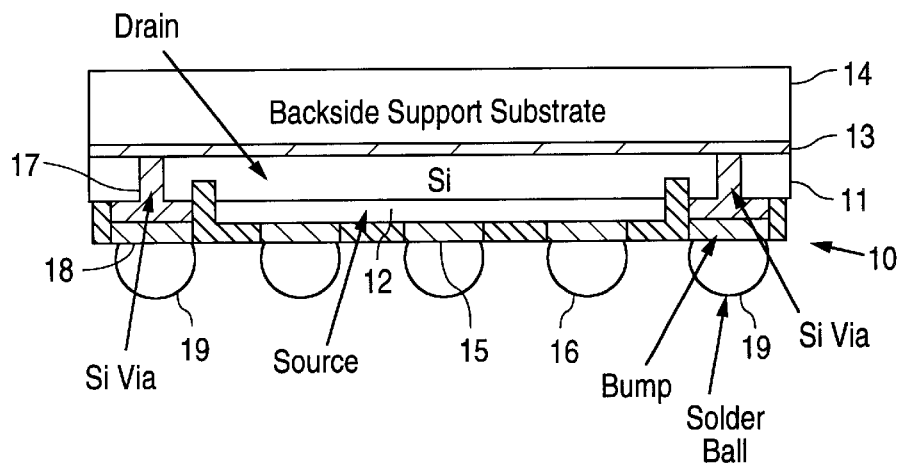
FIG. 3A is a general conceptual cross-sectional view of a first embodiment of a semiconductor package in accordance with the invention.
Figure 3B:
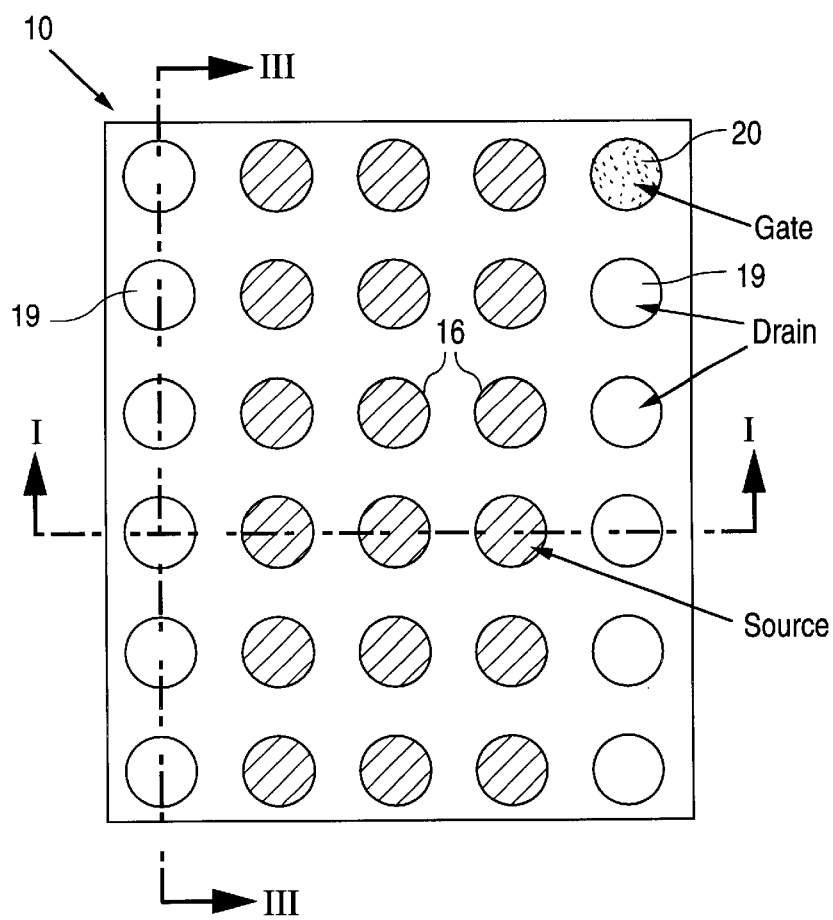
FIG. 3B is a bottom view of the package shown in FIG. 3A.
Figure 3C:
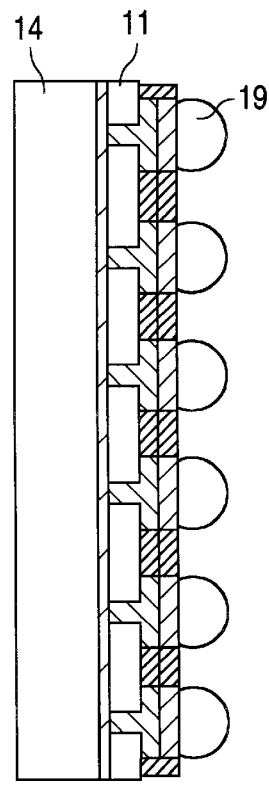
FIG. 3C is another cross-sectional view of the package shown in FIG. 3A.

An embodiment of a power MOSFET package in accordance with this invention is shown in concept in FIGS. 3A–3C. As shown in FIG. 3A, package 10 includes a silicon chip 11, in which a power MOSFET (not shown) has been formed by known processes of implantation and diffusion of dopants into the silicon. The power MOSFET would often contain an epitaxial layer grown over a silicon substrate, with the active regions of the device being formed in the epitaxial layer. A backside support substrate 14 is attached to the back side of chip 11 with a layer of conductive adhesive 13, which could be a conductive epoxy or metal foils. Since the power MOSFET within chip 11 is a vertical device, some of the terminals (e.g., the source and the gate terminals) are located adjacent the front side of the chip 11, and another terminal (e.g., the drain) is located adjacent the back side of the chip 11, electrically connected to the adhesive layer 13. A source contact, including a source metal layer 12, source pads 15 and source solder bumps 16 is electrically connected to the source terminal. Vias 17 extend entirely through the chip 11 and are filled with metal that makes electrical contact with the adhesive layer 13. A drain contact, including drain pads 18 and drain solder bumps 19, is electrically connected to the metal in vias 17.

Thus package 10 can be mounted on a printed circuit board (PCB) or other structure with electrical contact to the drain of power MOSFET being made through solder bumps 19 and electrical contact to the source being made through solder bumps 16.

FIG. 3B shows a bottom view of package 10, showing the section I—I through which FIG. 3A is taken. The locations of the drain solder bumps 19 along opposite sides of the package 10 and the source solder bumps 16 in a central region of the chip 11 are shown. Also shown is a gate solder bump 20 at a corner of the chip 11 which makes electrical contact with a gate metal layer within package 10. The formation and arrangement of the source and gate metal layers within the package 10 are well known in the art and do not form a part of this invention. FIG. 3C is a cross-sectional view of package 10 taken at the section III–III shown in FIG. 3B along the row of drain solder bumps 19.

Figure 4:
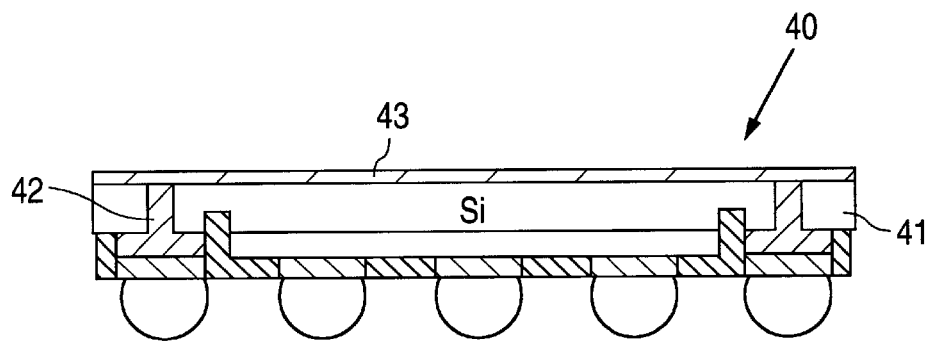
FIG. 4 is a cross-sectional view of an embodiment without a backside support substrate.
Figure 5:
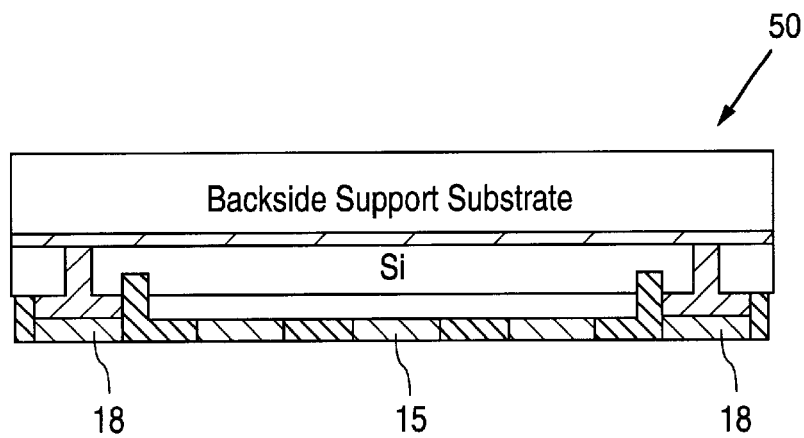
FIG. 5 is a cross-sectional view of an embodiment with a backside support substrate.
Figure 6:
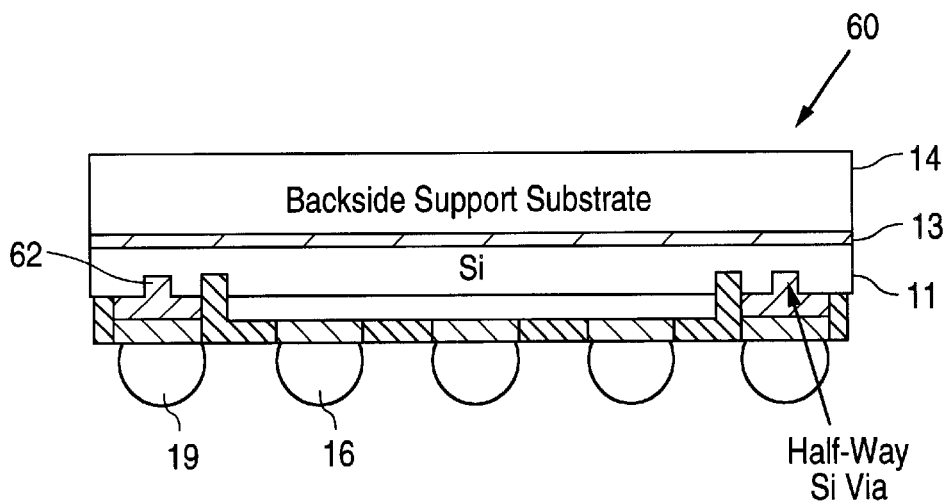
FIG. 6 is a cross-sectional view of an embodiment wherein the vias extend only part of the way through the semiconductor substrate.
Figure 21A:
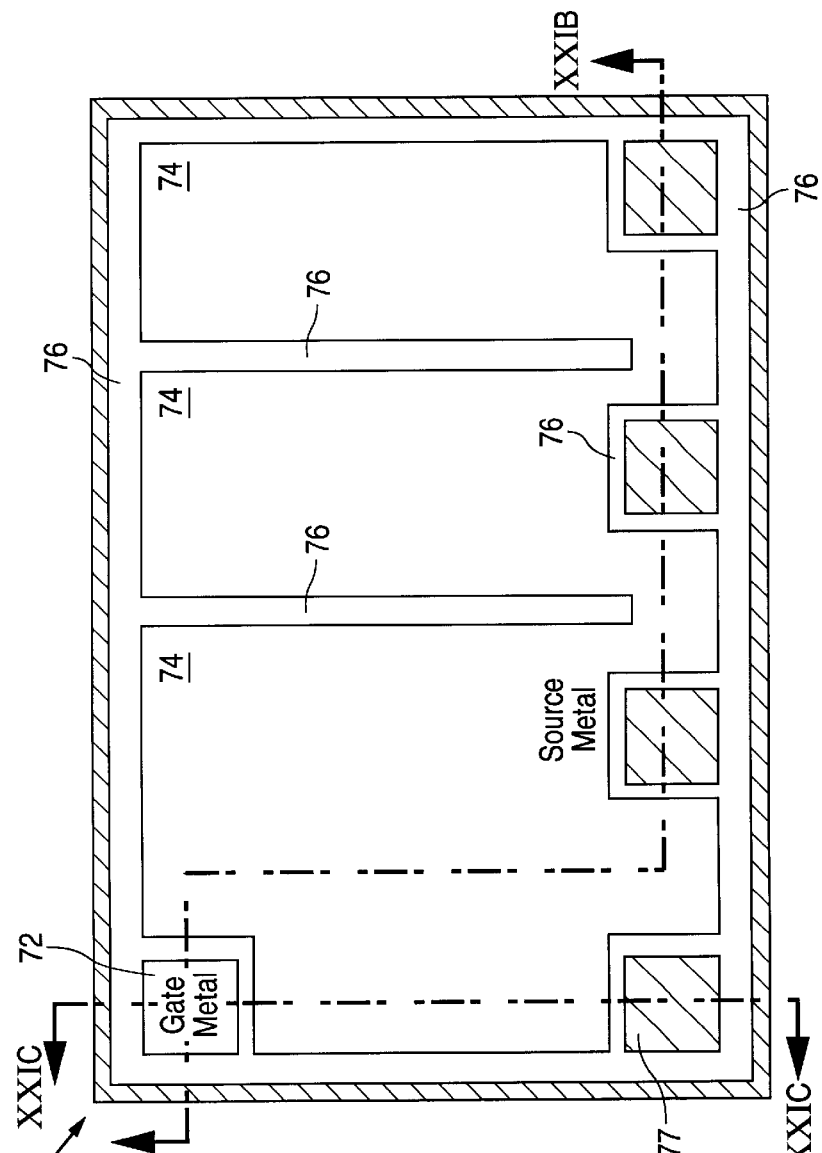
Figure 21B:
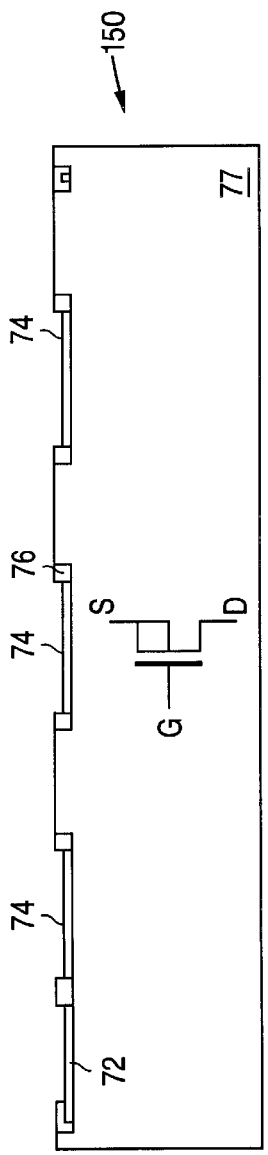
Figure 21C:
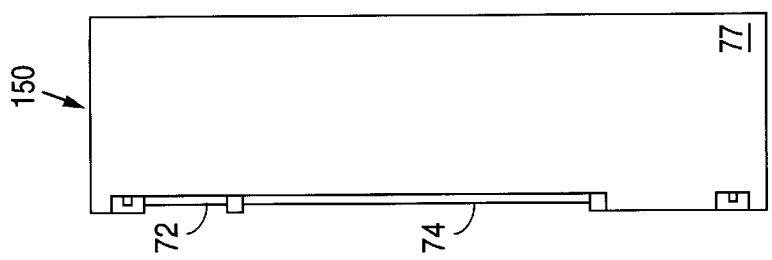

FIGS. 4–6 illustrate several additional embodiments according to the invention. Package 40 shown in FIG. 4 omits the backside support substrate 14, and chip 41 would therefore typically be somewhat thicker than chip 11, but otherwise package 40 is similar to package 10 shown in FIG. 1. Vias 42 extend through chip 41 to a layer 43 of conductive material on the back side of chip 41.

Package 50 shown in FIG. 5 is similar to package 10 but solder balls 16 and 19 are omitted. Package 50 is mounted on a PCB or other structure by making direct connections to source pads 15 and drain pads 18.

Package 60 shown in FIG. 6 is also similar to package 10, but vias 62 terminate in chip 11 instead of extending entirely through the chip. Vias 62, which can be in the form of holes or trenches, terminate in the doped region of the power MOSFET within chip 11 that is adjacent the back side of the chip. For example, for an N-channel MOSFET vias 62 would terminate in the N+ region that forms the drain terminal adjacent the back side of the chip 11.

FIGS. 7A–7C through 58A–58C illustrate several processes that may be used to fabricate a package for a power MOSFET in accordance with this invention. In each drawing, the figure labeled "A" is a top view of the chip and the figures labeled "B" and "C" are cross-sectional views taken at the sections designated accordingly in the figure labeled "A".

FIGS. 7A–7C through 20A–20C illustrate a process sequence which includes forming vias from the front side to the back side of the chip. The initial form of the chip 70 after the power MOSFET and metal contact pads have been formed is shown in FIGS. 7A–7C. As shown in the top view of FIG. 7A, the upper surface of the chip 70 includes a gate contact pad 72 and a source contact pad 74 insulated from each other by a passivation layer 76. The gate and source contact pads 72 and 74 are typically made of aluminum, but they could also be made of other metals such as copper or nonmetallic electrically conductive materials. A power MOSFET (shown symbolically) is formed in a semiconductor substrate 77, typically silicon. Cross-sectional views taken at sections VIIB—VIIB and VIIC—VIIC, respectively, are shown in FIGS. 7B and 7C.

A substrate 78 is removably attached to the front side of chip 70 with a layer 80 of wax or some other material that allows support substrate 78 to be detached front chip 70 at a later stage. (FIGS. 8A–8C)

Substrate 77 is thinned by grinding its back side. Alternatively, other thinning techniques such as wet etching and vacuum plasma etching can be used to thin substrate 77. Another possibility is the atmospheric downstream plasma (ADP) plasma etching system available from Tru-Si Technologies, Inc. of Sunnyvale, Calif. In this manner, substrate 77 can be thinned to a thickness of only 2 mils, for example. (FIGS. 9A–9C)

A barrier layer 82 of Ta/Cu is sputtered on the back side of substrate 77. Layer 82 can be 0.5–1.0 µm thick, for example. Alternatively, conductive materials other than Ta/Cu can be used and processes other than sputtering can be used to form the layer. (FIGS. 10A–10C)

A barrier layer 88 of Ta/Cu is sputtered on a backside substrate 84, and backside substrate 84 is attached to the back side of silicon substrate 77 by means of a layer 86 of solder or another conductive material such as epoxy. (FIGS. 11A–11C)

Wax layer 80 is heated and support substrate 78 is removed from the front side of silicon substrate 77. (FIGS. 12A–12C)

A photoresist layer 92 is deposited on the front side of silicon substrate 77. Photoresist layer is patterned and etched to produce openings 94. The etch can be a conventional wet etch process, for example. While openings 94 are circular, they could be any shape. Silicon substrate 77 is etched through openings to form vias 96 and thereby expose the surface of barrier layer 82. As shown vias 96 are conical in shape because silicon etches along oblique planes. Again, depending on the shape of openings 94, vias 96 could be any shape. As used herein, the word "via" refers to a cavity of any shape whatever that extends partially or entirely through a semiconductor substrate. (FIGS. 13A–13C)

Photoresist layer 92 is removed exposing vias 96 which extend to the surface of barrier layer 82. (FIGS. 14A–14C)

A layer 98 of Ta/Cu is sputtered onto the entire surface of chip 70. Ta/Cu layer 98 can be 0.5–1.0 µm thick, for example. (FIGS. 15A–15C)

A photoresist layer 100 is deposited and patterned, leaving portions of the Ta/Cu layer 98 exposed. A copper layer 102 is plated onto the exposed portions of Ta/Cu layer 98. Copper layer 102 generally overlies the gate and source metals and the areas where vias 96 are located. (FIGS. 16A–16C)

Photoresist layer 100 is removed, leaving the copper layer 102 in place and exposing portions of the silicon substrate 77 and the passivation layer 76. (FIGS. 17A–17C)

A passivation layer 104 is patterned over the surface of chip 70 by screen printing, with openings that expose portions of copper layer 102. The portion labeled 102G is electrically connected to gate contact pad 72, portions labeled 102S are electrically connected to source contact pad 74, and portions 102D are electrically connected to solder layer 86, backside substrate 84 and the drain terminal of the power MOSFET. (FIGS. 18A–18C)

If desired, chip 70 and the other chips in the wafer can be labeled with a product or company designation by laser marking the surface of the backside substrate 84.

Solder bumps 106 are formed over the exposed portions 102G, 102S and 102D of the copper layer 102. Bumps 106G and 106S are electrically connected to the gate and source metal, respectively. Bumps 106D are electrically connected to solder layer 86 and backside substrate 84. (FIGS. 19A–19C)

Chip 70 is separated from other chips in the wafer by sawing at the locations designated 108. The result is a power MOSFET package that can be mounted on a PCB or other structure using flip-chip mounting techniques. (FIGS. 20A–20C)

FIGS. 21A–21C through 34A–34C illustrate a process sequence which includes forming vias from the back side to the front side of the chip. The process begins with a chip 150, shown in FIGS. 21A–21C, that is identical to chip 70 shown in FIGS. 7A–7C.

The support substrate 78 is removably attached to the front side of chip 150 with the layer 80 of wax or some other material that allows support substrate 78 to be detached from chip 150 at a later stage. (FIGS. 22A–22C)

Silicon substrate 77 is thinned by grinding its back side. Alternatively, other thinning techniques such as wet etching and vacuum plasma etching can be used to thin substrate 77. Another possibility is the atmospheric downstream plasma (ADP) plasma etching system available from Tru-Si Technologies, Inc., of Sunnyvale, Calif. In this manner, substrate 77 can be thinned to a thickness of only 2 mils, for example. (FIGS. 23A–23C)

A photoresist layer 152 is deposited on the back side of the thinned substrate 77. Photoresist layer 152 is patterned and etched to form openings 154. Substrate 77 is etched through openings 154 to form vias 156, with wax layer 80 acting as an etch stop. As shown, vias 156 are conical in shape because silicon etches along oblique planes. Depending on the shape of openings 154, vias 156 could be any shape. (FIGS. 24A–24C)

Photoresist layer 152 is removed, leaving vias 156 exposed. (FIGS. 25A–25C)

A layer 158 of Ta/Cu is sputtered onto the back side of chip 70, extending into the vias 156 and covering the wax layer 80 at the bottom of the vias 156. Ta/Cu layer 158 can be 0.5–1.0 μm thick, for example. (FIGS. 26A–26C)

Layer 164 of Ta/Cu is sputtered on a backside substrate 160, and backside substrate 160 is attached to the back side of silicon substrate 77 by means of a layer 162 of solder or another conductive material such as epoxy. Solder layer 162 fills the vias 156. (FIGS. 27A–27C)

Figures 28A, 28B, 28C:
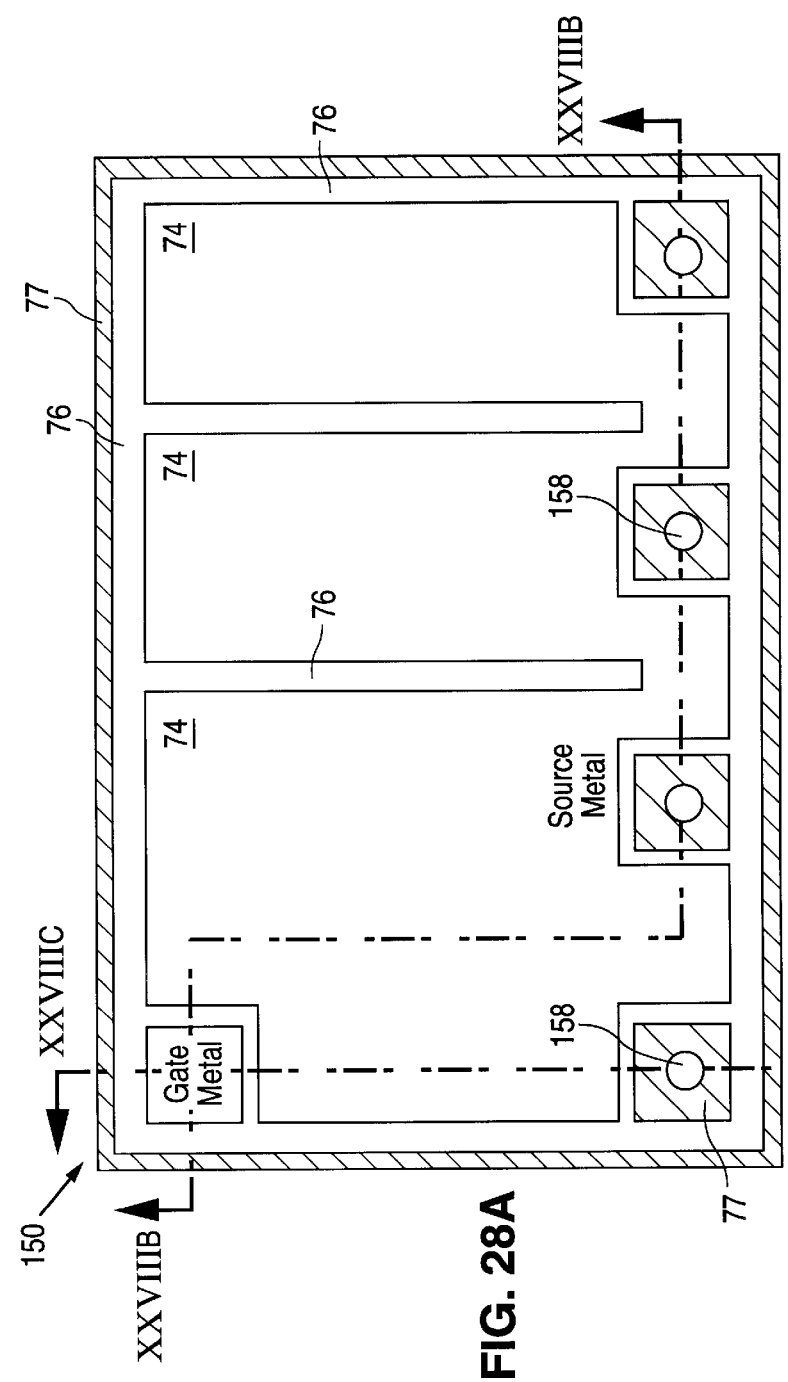

Wax layer 80 is heated and support substrate 78 is removed from the front side of silicon substrate 77. (FIGS. 28A–28C)

Figure 29C:
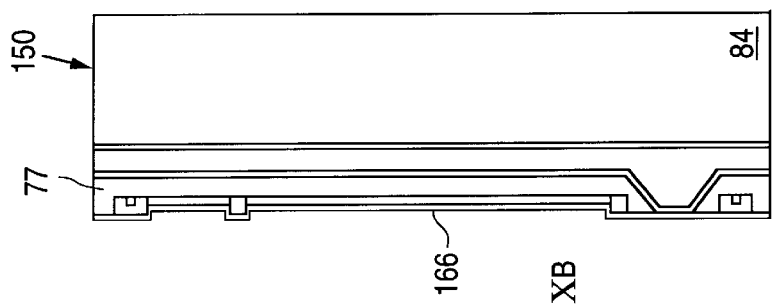
Figure 29A:
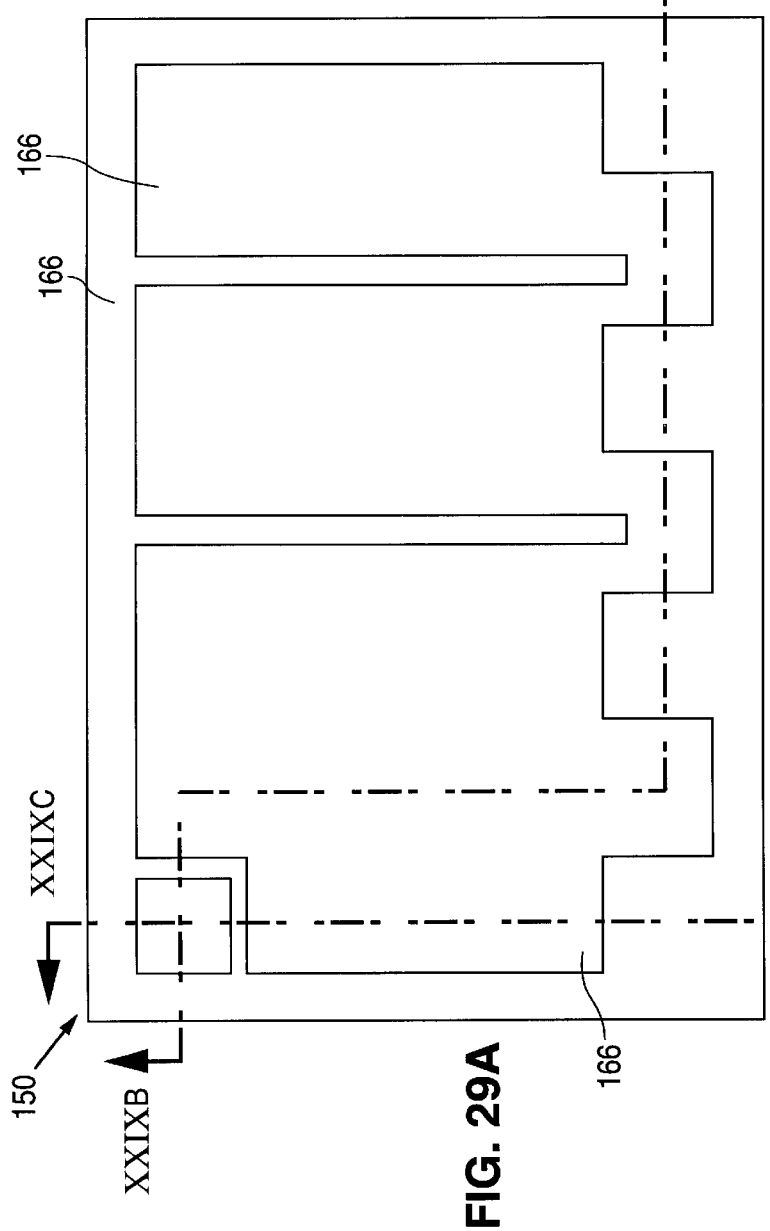
Figure 29B:
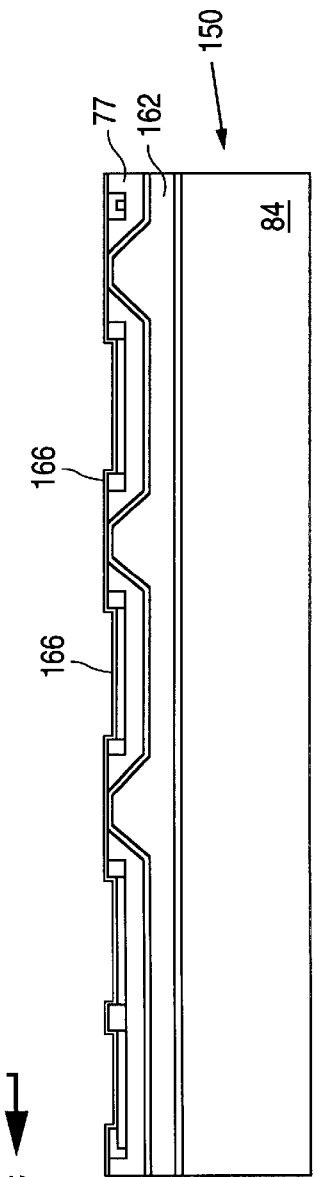

A layer 166 of Ta/Cu is sputtered onto the entire surface of chip 150. Ta/Cu layer 166 can be 0.5–1.0 μm thick, for example. (FIGS. 29A–29C)

Figure 30C:
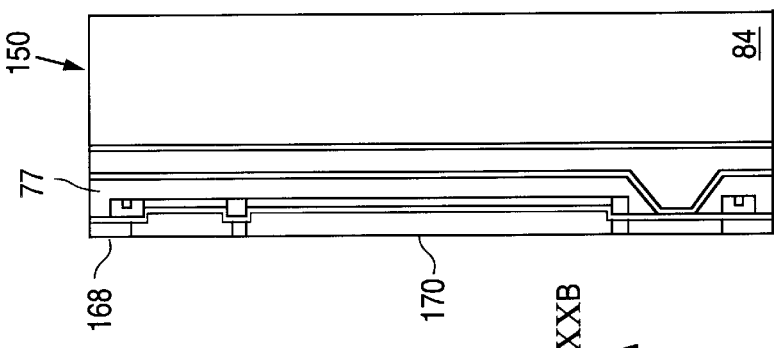
Figure 30A:
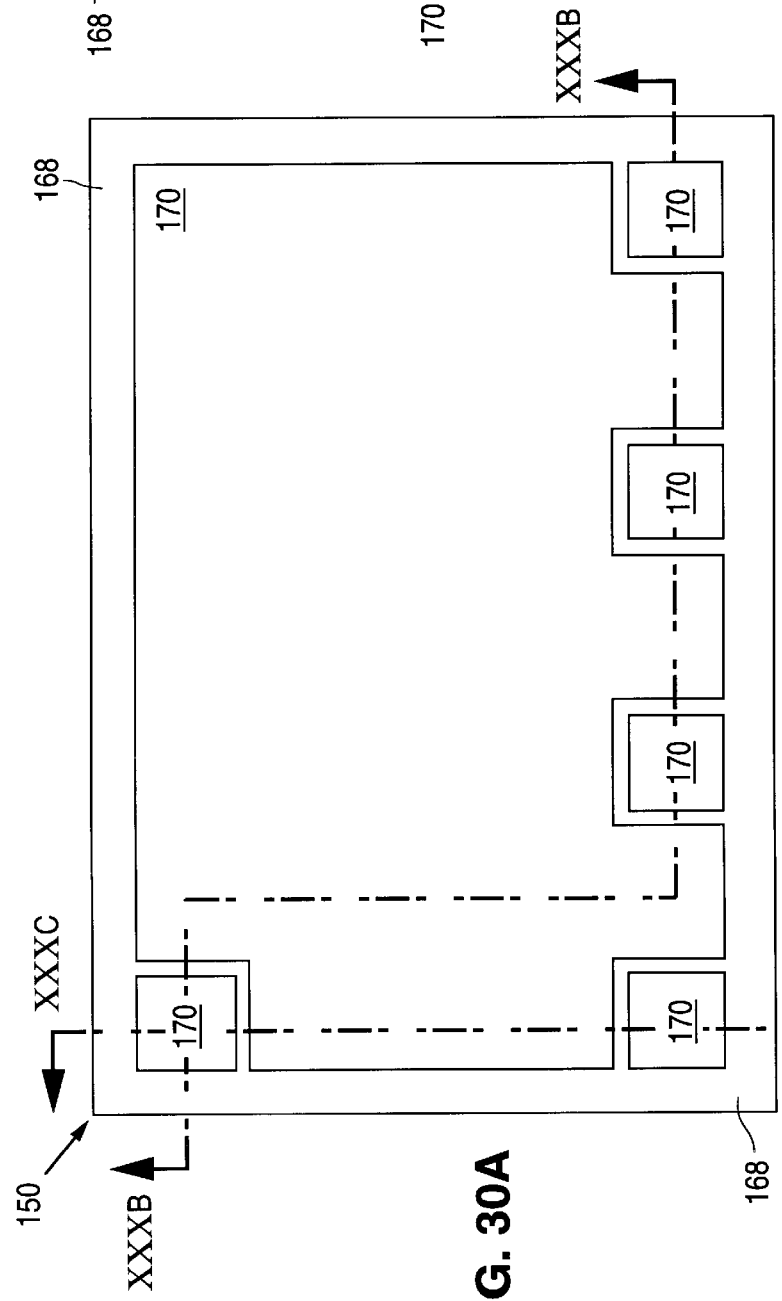
Figure 30B:
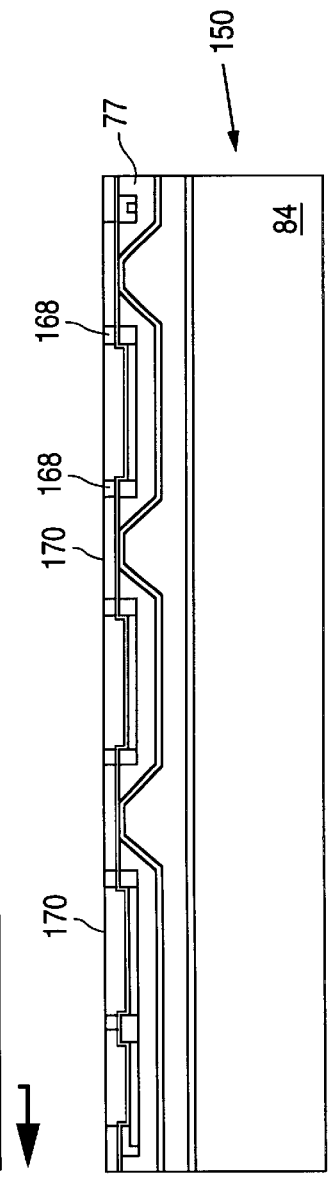

A photoresist layer 168 is deposited and patterned, leaving portions of the Ta/Cu layer 166 exposed. A copper layer 170 is plated onto the exposed portions of Ta/Cu layer 166. Copper layer 170 generally overlies the gate and source metals and the areas where vias 156 are located. (FIGS. 30A–30C)

Photoresist layer 168 is removed, leaving the copper layer 170 in place and exposing portions of the silicon substrate 77 and the passivation layer 76. (31A–31C)

A passivation layer 172 is patterned over the surface of chip 150 by screen printing, with openings that expose portions of copper layer 170. The portion labeled 170G is electrically connected to gate contact pad 72, portions labeled 170S are electrically connected to source contact pad 74, and portions 170D are electrically connected to solder layer 162, backside substrate 84 and the drain terminal of the power MOSFET. (FIGS. 32A–32C)

If desired, chip 150 and the other chips in the wafer can be labeled with a product or company designation by laser marking the surface of the backside substrate 84.

Solder bumps 174 are formed over the exposed portions 170G, 170S and 170D of the copper layer 170. Bumps 174G and 174S are electrically connected to the gate and source metal, respectively. Bumps 174D are electrically connected to solder layer 162 and backside substrate 84. (FIGS. 33A–33C)

Chip 150 is separated from other chips in the wafer by sawing at the locations designated 176. The result is a power MOSFET package that can be mounted on a PCB or other structure using flip-chip mounting techniques. (FIGS. 34A–34C)

In other embodiments such as those shown in FIGS. 4, 5 and 6, vias extend into the drain region but not entirely through the chip. Two methods for fabricating packages with this configuration are described below. In both of these methods the resulting package contains vias in the form of trenches that extend into the drain region.

Figure 35C:
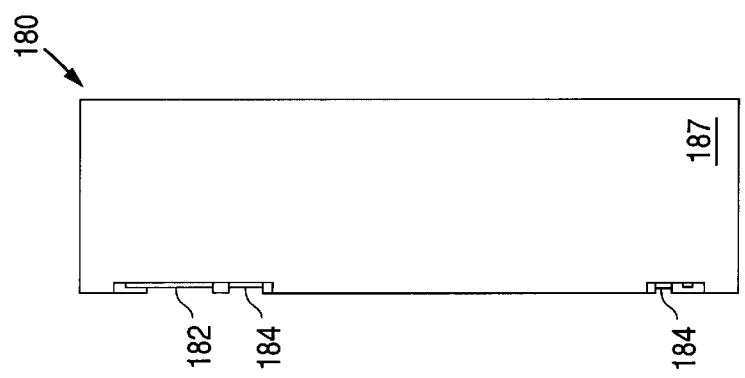
Figure 35A:
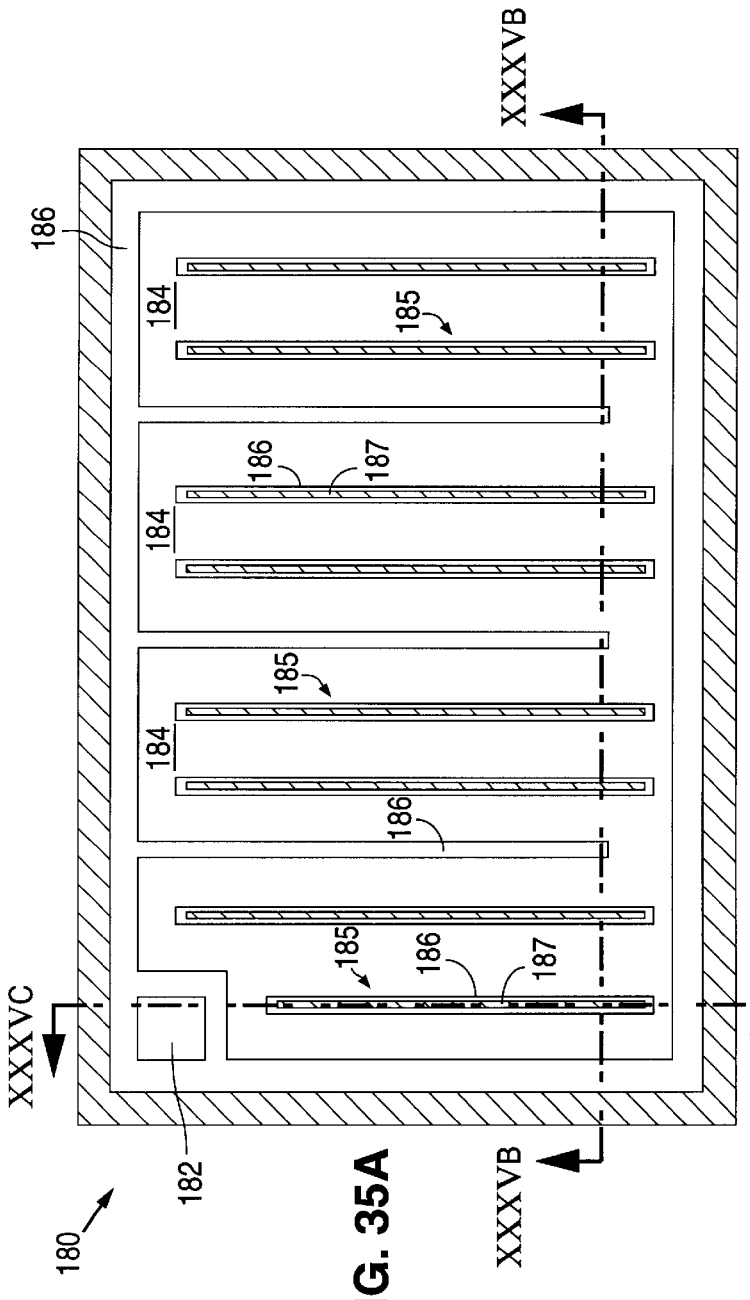
Figure 35B:
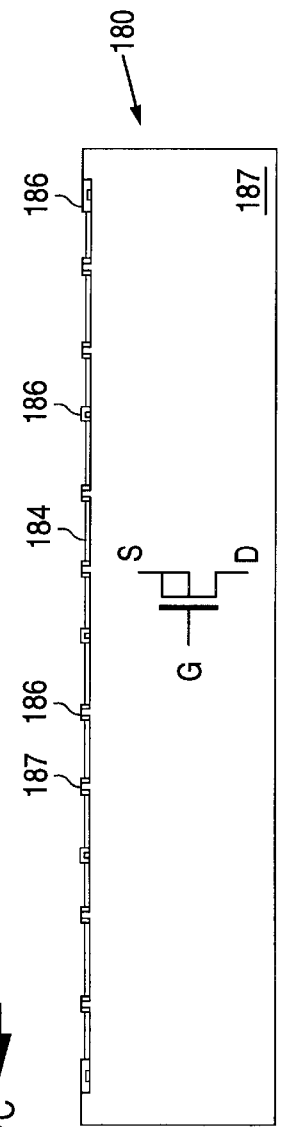

The first method is described in FIGS. 35A–35C to 46A–46C. The initial form of the chip 180 after the power MOSFET and metal contact pads have been formed is shown in FIGS. 35A–35C. As shown in the top view of FIG. 35A, the upper surface of the chip 180 includes a gate contact pad 182, a source contact pad 184 and a passivation layer 186. A power MOSFET (shown symbolically) is formed in a semiconductor substrate 187. A series of stripes 185 are formed in source contact pad 184, each of stripes 185 containing a central area of substrate 187 surrounded by a border area of passivation layer 186. Stripes 185 are formed by the same photolithographic techniques used to pattern the remainder of the surface of chip 180. In place of stripes 185 other geometric shapes could be used to form areas of exposed substrate 187.

Figure 36C:
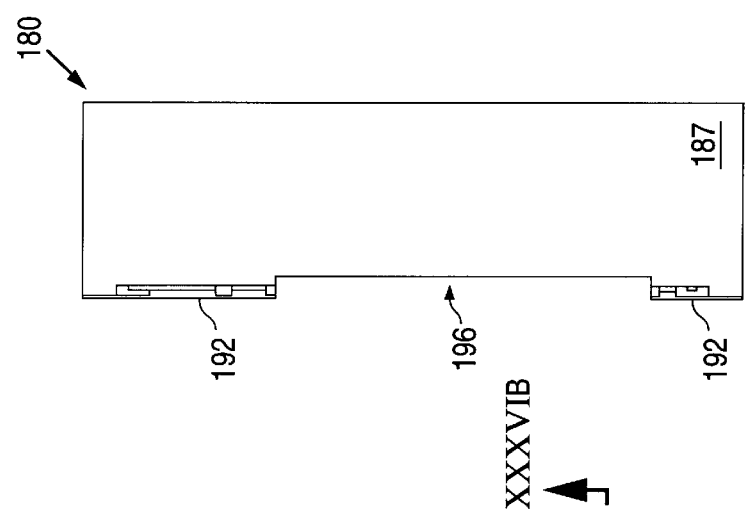
Figure 36A:
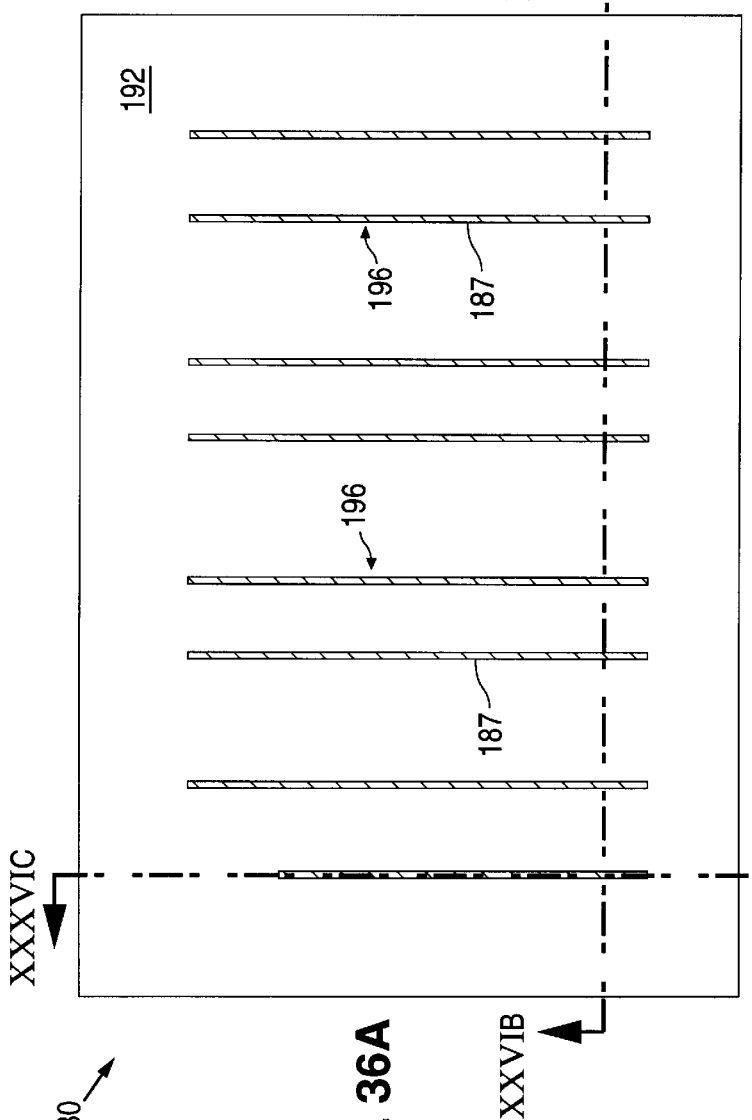
Figure 36B:
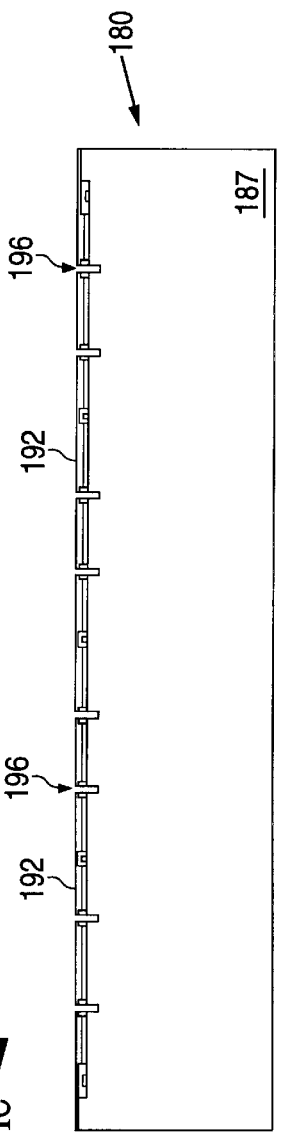

A photoresist layer 192 (e.g., 5 μm thick) is deposited on the front side of chip 180. Photoresist layer 192 is patterned and etched to produce openings overlying the areas of substrate 187 within the stripes 185. Silicon substrate 187 is etched through the openings in photoresist layer 192 to form trenches 196 in substrate 187. Trenches 196 can be 5 μm deep. Again, depending on the shape of the openings in photoresist layer 192, circular holes or cavities of other shapes could be formed extending into substrate 187. As stated above, the word "via" is used herein as a generic term referring to trenches, holes or other cavities of any shape whatever that extend partially or entirely through a semiconductor substrate. (FIGS. 36A–36C)

Photoresist layer 192 is removed and a layer 198 of Ta/Cu is sputtered onto the entire surface of chip 180, including the inside surfaces of trenches 196. Ta/Cu layer 198 can be 0.5–1.0 μm thick, for example. (FIGS. 37A–37C)

A photoresist layer 200 is deposited and patterned, leaving portions of the Ta/Cu layer 198 exposed. A copper layer 202 is plated onto the exposed portions of Ta/Cu layer 198. Copper layer 202 generally overlies the gate and source metals and fills the trenches 196. (FIGS. 38A–38C)

Figure 39C:
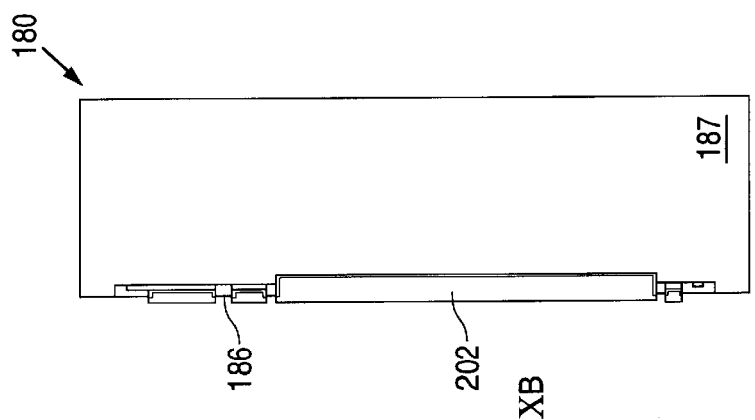
Figure 39A:
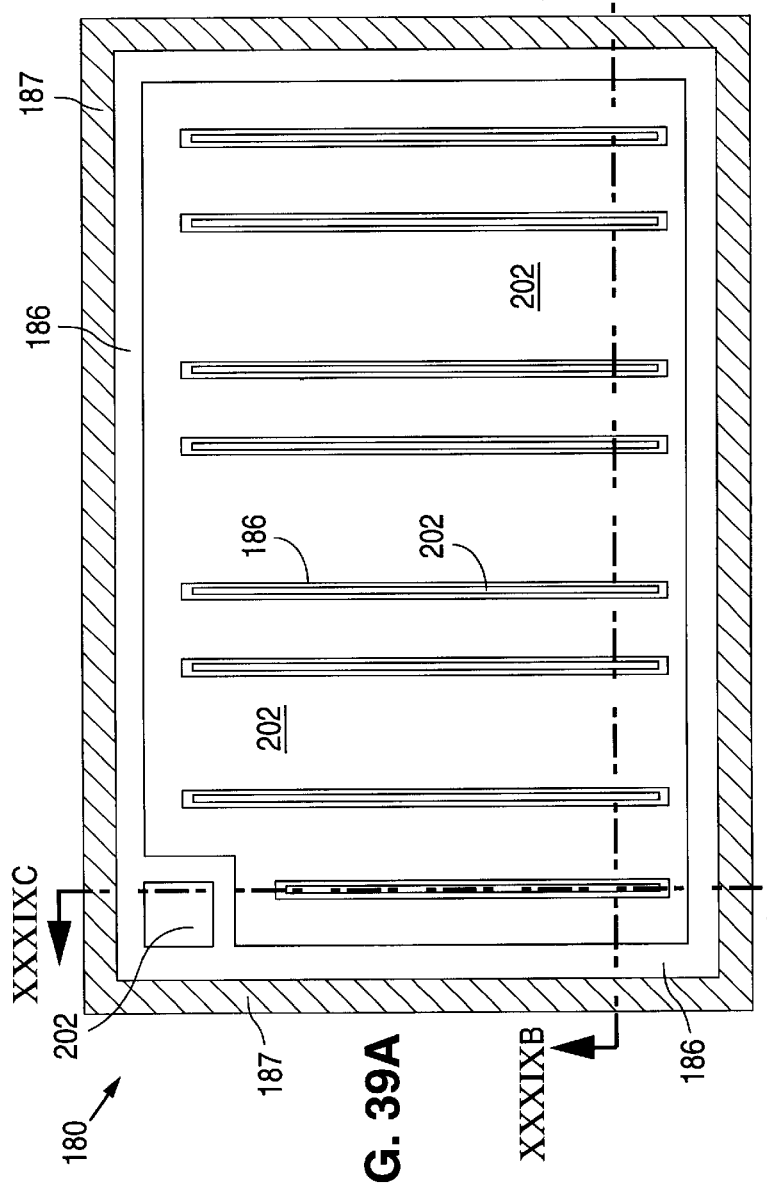
Figure 39B:
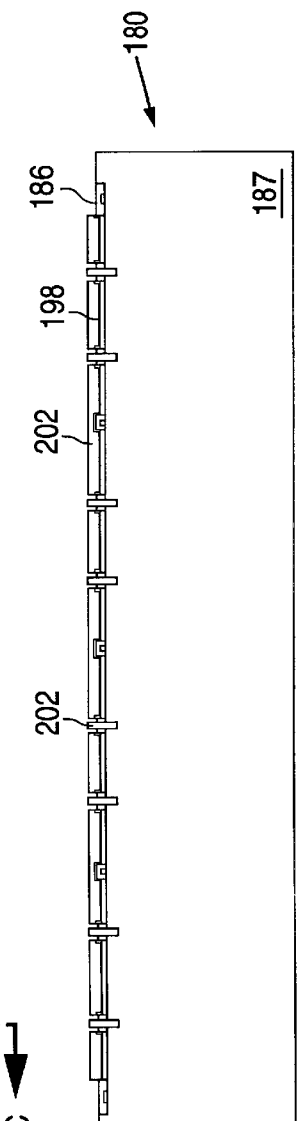

Photoresist layer 200 is removed, leaving the copper layer 202 in place and exposing portions of Ta/Cu layer 198, the silicon substrate 187 and the passivation layer 186. The exposed portions of the Ta/Cu layer 198 are then etched. The copper layer 202 remains in place over the gate contact pad 182 and source contact pad 184, and the portion of copper layer 202 in the trenches also remains in place. (FIGS. 39A–39C)

A passivation layer 204 is deposited over the surface of chip 180 and openings are etched in passivation layer 204 to expose portions of copper layer 202. The portion labeled 202G is electrically connected to gate contact pad 182, portions labeled 202S are electrically connected to source contact pad 184, and portions 202D remain in the trenches and extend into the drain region of substrate 187. (FIGS. 40A–40C)

A Ta/Cu layer 205 (e.g., 0.5–1.0 μm thick) is sputtered over the entire top surface of chip 180. (FIGS. 41A–41C)

A photoresist layer 206 is deposited on Ta/Cu layer 205 and photolithographically patterned to form apertures 208. A Cu layer 210 is plated onto the portions of Ta/Cu layer 205 that are exposed through apertures 208. A section 210G is electrically connected to gate contact pad 182, portions labeled 210S are electrically connected to source contact pad 184, and portions 210D are electrically connected to the drain region of substrate 187 via the portions of copper layer 202 that are in trenches 196. (FIGS. 42A–42C)

Photoresist layer 206 is stripped and Ta/Cu layer 205 is etched, leaving exposed the top surface of passivation layer 204. (FIGS. 43A–43C)

An epoxy layer 212 is deposited on the surface of passivation layer 204, and is reflowed. This can be done by a screen-printing process to leave portions 210G, 210S and 210D of the Ta/Cu layer 205 exposed. (FIGS. 44A–44C)

If desired, chip 180 and the other chips in the wafer can be labeled with a product or company designation by laser marking the backside of substrate 187.

Solder bumps 214 are formed over the exposed portions 210G, 210S and 210 of the copper layer 210. Bumps 214G and 214S are electrically connected to the gate and source metal, respectively. Bumps 214D are electrically connected to the drain region of substrate 187. (FIGS. 45A–45C)

Chip 180 is separated from other chips in the wafer by sawing at the locations designated 216. The result is a power MOSFET package that can be mounted on a PCB or other structure using flip-chip mounting techniques. (FIGS. 46A–46C)

The second method of fabricating a package with vias extending part way through the substrate is described in FIGS. 47A–47C to 58A–58C. The initial form of the chip 220 after the power MOSFET and metal contact pads have been formed is shown in FIGS. 47A–47C. As shown in the top view of FIG. 47A, the upper surface of the chip 220 includes a gate contact pad 222, a source contact pad 224 and a passivation layer 226. A power MOSFET (shown symbolically) is formed in a semiconductor substrate 227. A series of stripes 225 are formed in source contact pad 224, each of stripes 225 containing a central area of substrate 227 bordered by an area of passivation layer 226. Stripes 225 are formed by the same photolithographic techniques used to pattern the remainder of the surface of chip 220. In place of stripes 225, other geometric shapes could be used to form areas of exposed substrate 227.

A photoresist layer 232 (e.g., 5 μm thick) is deposited on the front side of chip 220. Photoresist layer 232 is patterned and etched to produce openings overlying the areas of substrate 227. (FIGS. 48A–48C)

Silicon substrate 227 is etched through the openings in photoresist layer 232 to form trenches 236 in substrate 227. Trenches 236 can be 5 μm deep. Again, depending on the shape of the openings in photoresist layer 232, circular holes or cavities of other shapes could be formed extending into substrate 227. As stated above, the word "via" is used herein as a generic term referring to trenches, holes or other cavities of any shape whatever that extend partially or entirely through a semiconductor substrate. Photoresist layer 232 is removed, exposing the surface of chip 220. (FIGS. 49A–49C)

A layer 238 of Ta/Cu is sputtered onto the entire surface of chip 220, including the inside surfaces of trenches 236. Ta/Cu layer 238 can be 0.5–1.0 μm thick, for example. (FIGS. 50A–50C)

A photoresist layer 240 is deposited and patterned, leaving portions of the Ta/Cu layer 238 exposed. A copper layer 242 is plated onto the exposed portions of Ta/Cu layer 238. Copper layer 242 generally overlies the gate and source metals and fills the trenches 236. (FIGS. 51A–51C)

Photoresist layer 240 is removed, leaving the copper layer 242 in place and exposing portions of Ta/Cu layer 238. The exposed portions of the Ta/Cu layer 238 are then etched, exposing portions of the silicon substrate 227 and the passivation layer 226. The copper layer 242 remains in place over the gate contact pad 222 and source contact pad 224, and the portion of copper layer 242 in the trenches also remains in place. (FIGS. 52A–52C)

A thick passivation layer 244 is patterned over the surface of chip 220 by screen-printing, with portions of copper layer 242 being left exposed. The portion labeled 242G is electrically connected to gate contact pad 222, portions labeled 242S are electrically connected to source contact pad 224, and portions 242D are electrically connected to the drain region of the MOSFET. While openings 241 are shown as circular, other shapes can be used. (FIGS. 53A–53C)

Substrate 227 is thinned by grinding its back side. Alternatively, other thinning techniques such as wet etching and vacuum plasma etching can be used to thin substrate 227. Another possibility is the atmospheric downstream plasma (ADP) plasma etching system available from Tru-Si Technologies, Inc. In this manner, substrate 227 can be thinned to a thickness of only 10 mils, for example. (FIGS. 54A–54C)

A heat sink 245 is bonded to the back side of the thinned substrate 227 using an adhesive layer 246 of, for example, solder or epoxy. Heat sink 245 can be a 10 mil thick sheet of copper, for example. (FIGS. 55A–55C)

If desired, chip 220 and the other chips in the wafer can be labeled with a product or company designation by laser marking the backside of substrate 227.

Solder bumps 248 are formed over the exposed portions 242G, 242S and 242D of the copper layer 242. Bumps 248G and 248S are electrically connected to the gate and source metal, respectively. Bumps 248D are electrically connected to the drain region of substrate 227. (FIGS. 56A–56C)

Substrate 227 is sawed at the locations designated 250 to separate it from the portions of the substrate in other chips on the wafer. The heat sink 245 is left intact. (FIGS. 57A–57C)

An optional passivation layer 247 is formed on heat sink 245, and chip 220 is separated from other chips in the wafer by sawing through the heat sink 245 at the locations designated 252. The result is a power MOSFET package that can be mounted on a PCB or other structure using flip-chip mounting techniques. (FIGS. 58A–58C)

The broad principles of this invention can be used to provide a package for any type of device that is formed in a semiconductor chip and that has electrical terminals located adjacent opposite sides of the chip. The precise structure of the device with the semiconductor material is not critical. As described above vertical power MOSFERTs may be fabricated in a trench-gated form or in a planar form. This invention is also applicable to passive devices formed in a semiconductor chip, such as diodes, capacitors and resistors.

Figure 59A:
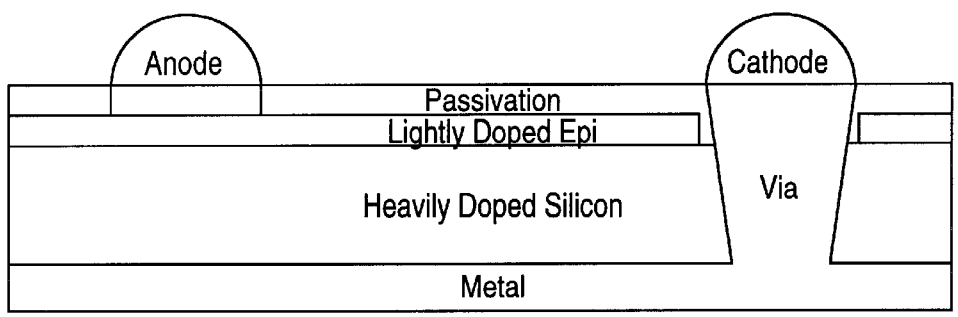
FIGS. 59A and 59B are cross-sectional views of diode packages in accordance with the invention.
Figure 59B:
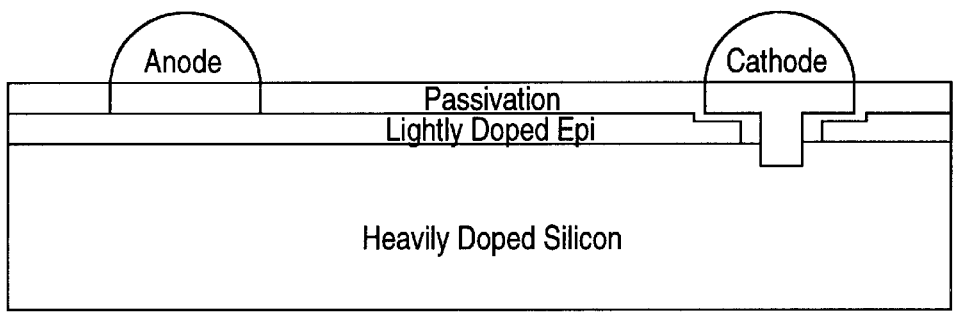

FIGS. 59A and 59B illustrate a diode package in accordance with this invention, the anode being a doped region on the front side of the chip and the cathode being a doped region of opposite conductivity type on the back side of the chip. In FIG. 59A, the via that connects the cathode region to the cathode terminal on front side extends all the way through the chip to metal plate that is attached to the back side. In FIG. 59B, the via extends only part of the way through the chip into the cathode region.

Figure 60A:
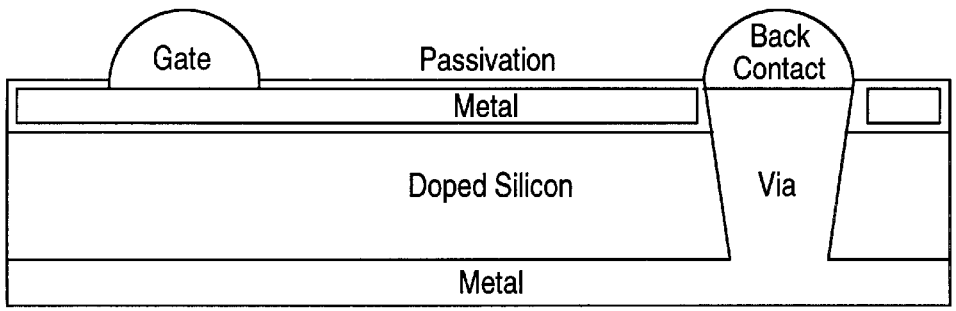
FIGS. 60A and 60B are cross-sectional views of capacitor packages in accordance with the invention.
Figure 60B:
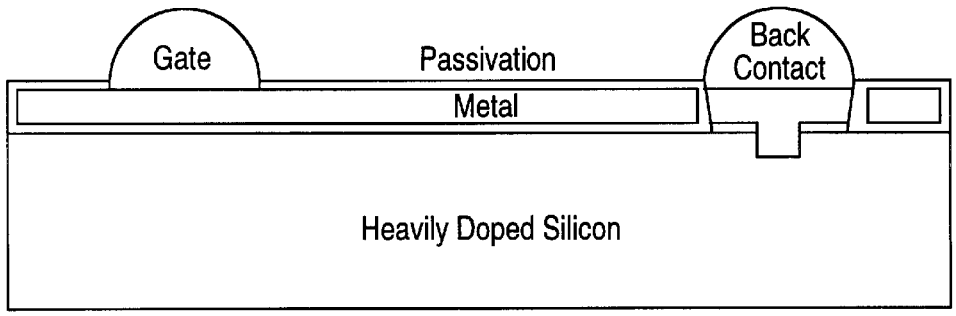

FIGS. 60A and 60B illustrate a capacitor package in accordance with this invention, the gate contact being attached to a metal plate that is separated from a heavily-doped silicon region by a nonconductive passivation layer. A via connects the heavily-doped region with a back contact on the front side of the chip. In FIG. 60A, the via extends all the way through the chip to a metal plate attached to the back side of the chip; in FIG. 60B, the via extends into the heavily-doped region of the chip but does not reach all the way through the chip.

While specific embodiments of this invention have been described it will be apparent to those skilled in the art that numerous alternative embodiments may be fabricated in accordance with the broad principles of this invention. For example, while the embodiments above relate to N-channel MOSFETs, this invention is also applicable to P-channel MOSFETs. While the conductive material in the vias and elsewhere has been described as a metal, other types of conductive materials such as polysilicon can be used in some embodiments. These and other variations are included within the scope of this invention.

We claim:

1. A semiconductor package comprising:
    a semiconductor chip having first and second principal surfaces and comprising a semiconductor device, the device having at least a first terminal located adjacent the first principal surface and a second terminal located adjacent the second principal surface;
    at least a first contact located at the first principal surface of the semiconductor chip, the first contact being electrically connected to the first terminal of the device;
    a second contact located at the first principal surface of the semiconductor chip, the first and second contacts being electrically insulated from each other; and
    at least one via extending at least part of the way through the semiconductor chip, the via being filled with a conductive material, the conductive material being electrically connected to the second contact and the second terminal of the device.

2. The semiconductor package of claim 1 comprising a support substrate attached to the second principal surface of the semiconductor chip with a layer of electrically conductive adhesive.

3. The semiconductor package of claim 2 wherein the support substrate is electrically conductive.

4. The semiconductor package of claim 2 wherein the conductive adhesive comprises epoxy.

5. The semiconductor package of claim 1 wherein the at least one via extends all the way through the semiconductor chip.

6. The semiconductor package of claim 5 wherein the at least one via is in the shape of a circular hole.

7. The semiconductor package of claim 1 wherein the at least one via extends only part of the way through the semiconductor chip.

8. The semiconductor package of claim 7 wherein the at least one via is in the shape of a trench.

9. The semiconductor package of claim 1 wherein the device is a power MOSFET.

10. The semiconductor package of claim 9 wherein the MOSFET is a trench-gated MOSFET.

11. The semiconductor package of claim 9 wherein the MOSFET is a vertical planar DMOSFET.

12. The semiconductor package of claim 1 wherein the device is a bipolar transistor.

13. The semiconductor package of claim 1 wherein the device is a JFET.

14. The semiconductor package of claim 1 wherein the device is a diode.

15. The semiconductor package of claim 1 wherein the device is a capacitor.

16. The semiconductor package of claim 1 wherein the device is a resistor.

17. A power MOSFET package comprising:
    a semiconductor chip having a front side and a back side and comprising a power MOSFET, a source region and a gate located adjacent the front side and a drain region located adjacent the back side;
    at least a source contact, a gate contact and a drain contact located at the front side of the semiconductor chip, the source contact being electrically connected to the source region and the gate contact being electrically connected to the gate, the source, gate and drain contacts being electrically insulated from each other; and
    at least one via extending at least part of the way through the semiconductor chip, the via being filled with a conductive material, the conductive material being electrically connected to the drain contact and the drain region of the power MOSFET.

18. The semiconductor package of claim 17 comprising a support substrate attached to the back side of the semiconductor chip with a layer of electrically conductive adhesive.

19. The semiconductor package of claim 18 wherein the support substrate is electrically conductive.

20. The semiconductor package of claim 17 wherein the at least one via extends all the way through the semiconductor chip.

21. The semiconductor package of claim 20 wherein the at least one via is in the shape of a circular hole.

22. The semiconductor package of claim 17 wherein the at least one via extends only part of the way through the semiconductor chip.

23. The semiconductor package of claim 22 wherein the at least one via is in the shape of a trench.

* * * * *